US00RE45480E

(19) United States
(12) Reissued Patent
Nagashima et al.

(10) Patent Number: US RE45,480 E
(45) Date of Reissued Patent: Apr. 21, 2015

(54) NONVOLATILE SEMICONDUCTOR MEMORY DEVICE AND PRODUCING METHOD THEREOF

(71) Applicant: Kabushiki Kaisha Toshiba, Minato-ku (JP)

(72) Inventors: Hiroyuki Nagashima, Yokohama (JP); Hirofumi Inoue, Kamakura (JP); Hideyuki Tabata, Kawasaki (JP); Masanori Komura, Yokohama (JP); Eiji Ito, Yokohama (JP)

(73) Assignee: Kabushiki Kaisha Toshiba, Minato-ku (JP)

(21) Appl. No.: 14/062,661

(22) Filed: Oct. 24, 2013

Related U.S. Patent Documents

Reissue of:

(64) Patent No.: 8,044,456
Issued: Oct. 25, 2011
Appl. No.: 12/540,092
Filed: Aug. 12, 2009

(30) Foreign Application Priority Data

Aug. 13, 2008 (JP) ..... 2008-208421

(51) Int. Cl.
*H01L 29/792* (2006.01)
*H01L 27/11* (2006.01)

(52) U.S. Cl.
CPC ..... *H01L 27/1116* (2013.01)

(58) Field of Classification Search
USPC ..... 257/2, 326, 390, 208, 211
See application file for complete search history.

(56) References Cited

U.S. PATENT DOCUMENTS 6,566,698 B2 * 5/2003 Nishihara et al. ..... 257/295
8,441,040 B2 5/2013 Minemura et al.

(Continued)

FOREIGN PATENT DOCUMENTS

JP 09-036229 2/1997
JP 2004-6579 1/2004

(Continued)

OTHER PUBLICATIONS

Office Action issued Dec. 25, 2012, in Japanese Patent Application No. 2008-208421, filed Aug. 13, 2008, (with English-language Translation).

(Continued)

*Primary Examiner* — Tan N Tran
(74) *Attorney, Agent, or Firm* — Oblon, McClelland, Maier & Neustadt, L.L.P.

(57) ABSTRACT

A cell array includes a memory cell region in which memory cells are formed and a peripheral region that is provided around the memory cell region. In the memory cell region, first lines are extended in parallel with a first direction, and the first lines are repeatedly formed at first intervals in a second direction orthogonal to the first direction. In the peripheral region, each of the first lines located at (4n−3)-th (n is a positive integer) and (4n−2)-th positions in the second direction from a predetermined position has a contact connecting portion on one end side in the first direction of the first line. In the peripheral region, each of the first lines located at (4n−1)-th and 4n-th positions in the second direction from the predetermined position has the contact connecting portion on the other end side in the first direction of the first line. The contact connecting portion is formed so as to contact a contact plug extended in a laminating direction.

23 Claims, 41 Drawing Sheets

(56) References Cited

U.S. PATENT DOCUMENTS

| | | | | |
|---|---|---|---|---|
| 8,502,322 | B2 | 8/2013 | Nitta | |
| 2006/0110877 | A1 | 5/2006 | Park et al. | |
| 2006/0273457 | A1* | 12/2006 | Sel et al. | 257/734 |
| 2008/0012064 | A1 | 1/2008 | Park et al. | |
| 2010/0232204 | A1* | 9/2010 | Muraoka et al. | 365/148 |
| 2011/0204309 | A1 | 8/2011 | Nitta | |

FOREIGN PATENT DOCUMENTS

| | | |
|---|---|---|
| JP | 2006-512776 | 4/2006 |
| JP | 2007-536580 | 12/2007 |

OTHER PUBLICATIONS

Office Action issued Apr. 9, 2013, in Japanese Patent Application No. 2008-208421, filed Aug. 13, 2008, (with English-language Translation).

U.S. Appl. No. 13/033,026, filed Feb. 23, 2011, Nitta.

U.S. Appl. No. 13/044,973, filed Mar. 10, 2011, Nitta.

U.S. Appl. No. 12/886,090, filed Sep. 20, 2010, Minemura, et al.

* cited by examiner

NONVOLATILE SEMICONDUCTOR MEMORY DEVICE AND PRODUCING METHOD THEREOF

Matter enclosed in heavy brackets [ ] appears in the original patent but forms no part of this reissue specification; matter printed in italics indicates the additions made by reissue; a claim printed with strikethrough indicates that the claim was canceled, disclaimed, or held invalid by a prior post-patent action or proceeding.

CROSS-REFERENCE TO RELATED APPLICATIONS

This application is based upon and claims the benefit of priority from the prior Japanese Patent Application No. 2008-208421, filed on Aug. 13, 2008, the entire contents of which are incorporated herein by reference.

BACKGROUND OF THE INVENTION

1. Field of the Invention

The present invention relates to a nonvolatile semiconductor memory device having a multi-layer structure in which cross-point memory cells are laminated and a producing method thereof.

2. Description of the Related Art

Conventionally, a flash memory is well known as an electrically-rewritable nonvolatile memory. In the flash memory, NAND connection or NOR connection of memory cells having floating gate structures is established to form a memory cell array. A ferroelectric memory is also well known as a nonvolatile, high-speed random access memory.

On the other hand, a resistance change type memory in which a variable resistive element is used in the memory cell is proposed as a technique of further achieving a finer design rule of the memory cell. Examples of the variable resistive element include a phase-change memory element in which a resistance value is changed according to a state change between crystalline state and an amorphous state of a chalcogenide compound, an MRAM element in which a resistance change of a tunnel magnetoresistive effect is used, a memory element of a polymer ferroelectric RAM (PFRAM) in which the resistive element is made of a conductive polymer, and an ReRAM element in which the resistance change is generated by electric pulse application (for example, see Japanese Patent Application Laid-Open No. 2006-344349, paragraph [0021]).

In the resistance change type memory, because the memory cell can be formed by a series circuit of a Schottky diode and a resistance change element instead of a transistor, advantageously a three-dimensional structure is formed by ease lamination to achieve the further integration (for example, see Japanese Patent Application Laid-Open No. 2005-522045).

However, even if the resistance change type memory is used, there is a limitation to L/S (Line/Space) of about 40 nm of the memory cell array in a current lithography technique. Therefore, there is a demand for the finer design rule of the memory cell.

SUMMARY OF THE INVENTION

A nonvolatile semiconductor memory device according to one aspect of the present invention including: a semiconductor substrate; and a cell array formed on the semiconductor substrate, including a plurality of first lines, a plurality of second lines intersecting the plurality of first lines, and a plurality of memory cells connected at intersections of the first and second lines between both lines, wherein the cell array includes: a memory cell region where the memory cells are formed; and a peripheral region that is provided around the memory cell region, in the memory cell region, the first lines are extended in parallel with a first direction, and the first lines are repeatedly formed at first intervals in a second direction orthogonal to the first direction, in the peripheral region, each of the first lines located at (4n−3)-th (n is a positive integer) and (4n−2)-th positions in the second direction from a predetermined position has a contact connecting portion on one end side in the first direction of the first line, in the peripheral region, each of the first lines located at (4n−1)-th and 4n-th positions in the second direction from the predetermined position has the contact connecting portion on the other end side in the first direction of the first line, and the contact connecting portion is formed so as to contact with a contact plug extended in a laminating direction.

A nonvolatile semiconductor memory device according to another aspect of the present invention including: a semiconductor substrate; and a cell array formed on the semiconductor substrate, including a plurality of first lines, a plurality of second lines intersecting the plurality of first lines, and a plurality of memory cells connected at intersections of the first and second lines between both lines, wherein the cell array includes: a memory cell region where the memory cells are formed; and a peripheral region that is provided around the memory cell region, in the memory cell region, the first lines are extended in parallel with a first direction, and the first lines are repeatedly formed at first intervals in a second direction orthogonal to the first direction, in the peripheral region, each plurality of continuous first lines alternately have contact connecting portions one end side and the other end side in the first direction of the first line, and the contact connecting portion is formed so as to contact with a contact plug extended in a laminating direction.

A nonvolatile semiconductor memory device producing method according to still another aspect of the present invention including: forming a laminated structure on a semiconductor substrate; and etching the laminated structure to form a cell array, the cell array including a plurality of first lines, a plurality of second lines intersecting the plurality of first lines, and a plurality of memory cells connected at intersections of the first and second lines between both lines, wherein the method comprises: forming a first mask on the laminated structure, forming a second mask having a predetermined pattern on a layer upper than a layer in which the first mask is formed, slimming the second mask, forming a third mask on a sidewall of the second mask, removing the second mask in a first region, etching the first mask and the laminated structure by means of the third mask in the first region, and etching the first mask and the laminated structure by means of the third mask and the second mask in a second region that is different from the first region.

DETAILED DESCRIPTION OF THE EMBODIMENTS

Exemplary embodiments of the present invention will be described below with reference to the drawings.

First Embodiment

Figure 1:
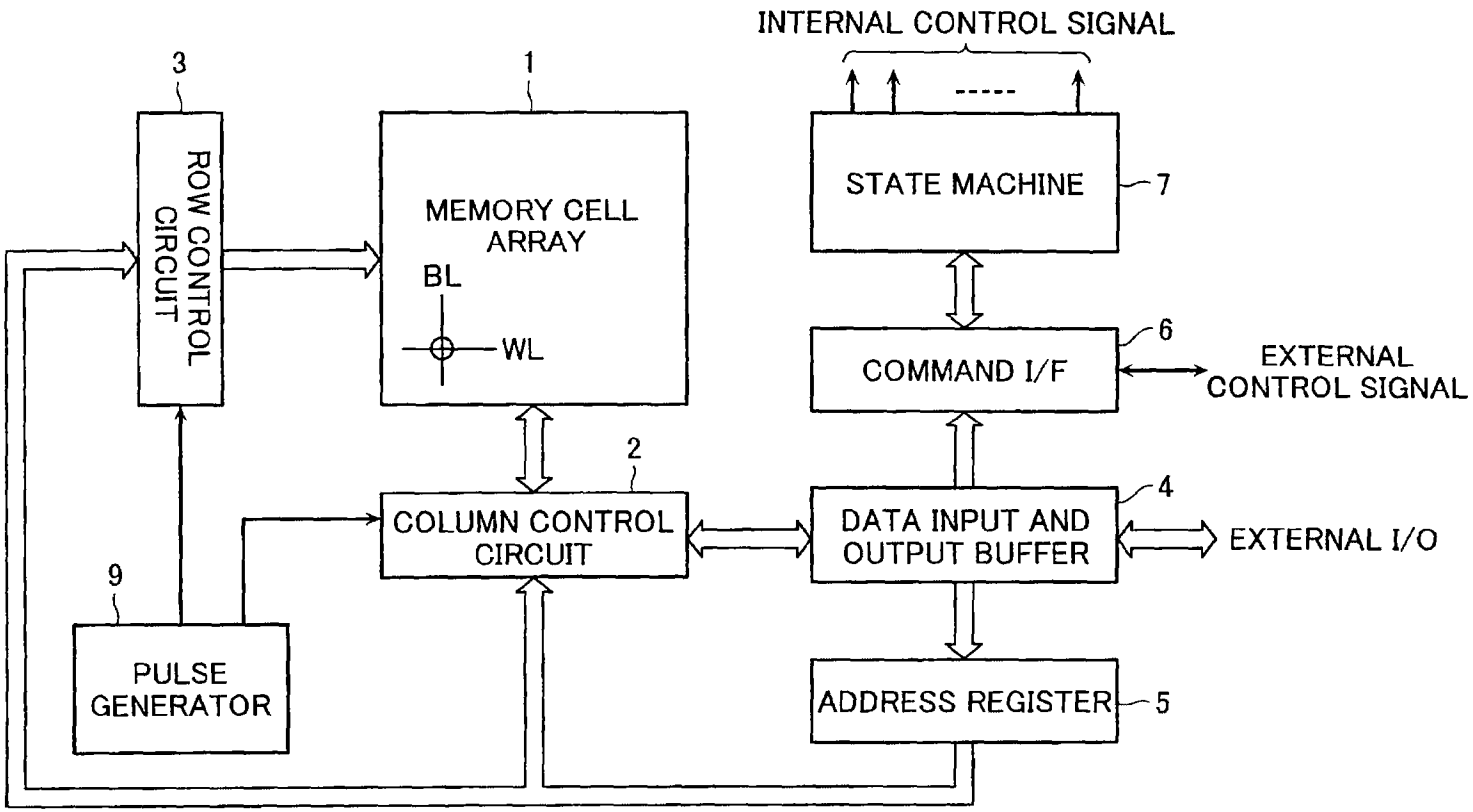
FIG. 1 is a block diagram illustrating a nonvolatile semiconductor memory device according to a first embodiment of the present invention.

Schematic Configuration of Nonvolatile Semiconductor Memory Device of First Embodiment A schematic configuration of a nonvolatile semiconductor memory device according to a first embodiment of the present invention will be described with reference to FIGS. 1 to 4. FIG. 1 is a block diagram illustrating a nonvolatile semiconductor memory device (nonvolatile memory) of the first embodiment.

The nonvolatile semiconductor memory device of the first embodiment includes a memory cell array 1 in which memory cells are arranged in a matrix shape, and a later-mentioned ReRAM (variable resistive element) is used in the memory cell. A column control circuit 2 is provided adjacent to the memory cell array 1 in a direction of a bit line BL. The column control circuit 2 controls the bit line BL of the memory cell array 1, erases data of the memory cell, writes the data in the memory cell, and reads the data from the memory cell. A row control circuit 3 is provided adjacent to the memory cell array 1 in a direction of a word line WL. The row control circuit 3 selects the word line WL of the memory cell array 1, erases the data of the memory cell, writes the data in the memory cell, and applies a voltage necessary to read the data from the memory cell.

A data input and output buffer 4 is connected to an external host (not illustrated) through an I/O line. The data input and output buffer 4 receives write data, an erase command, an address data, and a command data, and the data input and output buffer 4 supplies read data. The data input and output buffer 4 transmits the received write data to the column control circuit 2, and the data input and output buffer 4 receives the data read from the column control circuit 2 and supplies the data to the outside. An address supplied from the outside to the data input and output buffer 4 is transmitted to the column control circuit 2 and the row control circuit 3 through an address register 5. A command supplied from the host to the data input and output buffer 4 is transmitted to a command interface 6. The command interface 6 receives an external control signal from the host, and the command interface 6 determines whether the data fed into the data input and output buffer 4 is the write data, the command, or the address. When the data is the command, the command interface 6 receives the command and transfers the command as a command signal to a state machine 7. The state machine 7 manages the whole of, the nonvolatile memory. The state machine 7 receives the command from the host, and performs read, write, and erase of the command and management of data input and output. The external host receives status information managed by the state machine 7, and the external host can make a determination of operation result. The status information is also utilized in controlling the data write and erase.

The state machine 7 controls a pulse generator 9. The control enables the pulse generator 9 to supply a pulse at arbitrary timing with an arbitrary voltage. The pulse can be transferred to an arbitrary interconnection that is selected by the column control circuit 2 and the row control circuit 3.

Peripheral circuit elements except for the memory cell array 1 can be formed on a silicon substrate immediately below the memory array 1 formed in an interconnection layer, and therefore a chip area of the nonvolatile memory can substantially be equalized to an area of the memory cell array 1.

Figure 2A:
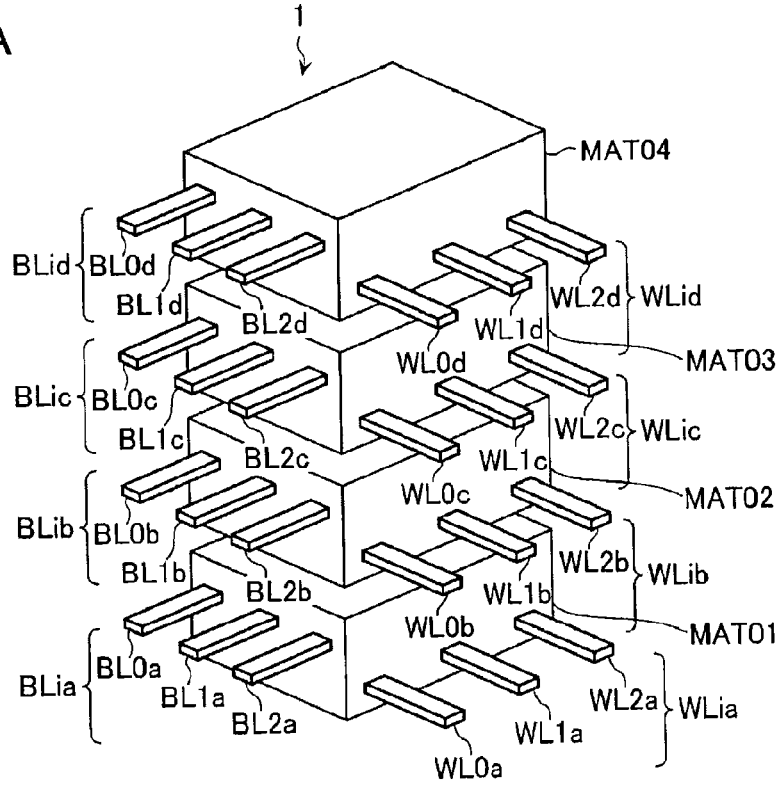
FIG. 2A is a perspective view illustrating a memory cell array 1 (unit cell array MAT00 to MAT04) of the nonvolatile semiconductor memory device of the first embodiment.
Figure 2B:
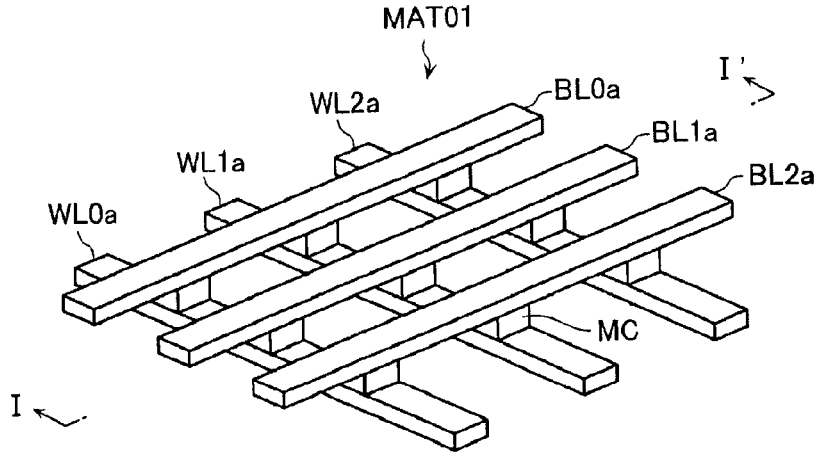
FIG. 2B is a partially enlarged perspective view (perspective view illustrating the unit cell array MAT01) illustrating the memory cell array 1 of FIG. 2A.
Figure 3A:
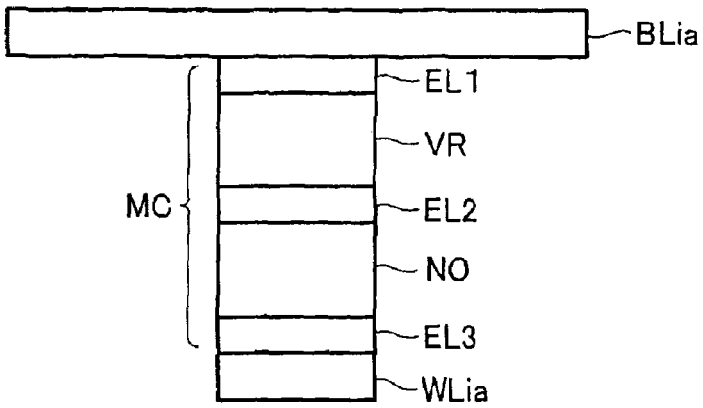
FIG. 3A is a sectional view taken on a line I-I' of FIG. 2B.

FIG. 2A is a perspective view of the memory cell array 1. FIG. 2B is a partially enlarged perspective view of the memory cell array 1. FIG. 3A is a sectional view of one memory cell taken on a line I-I' of FIG. 2B.

Referring to FIG. 2A, the memory cell array 1 is divided into four unit cell arrays MAT01 to MAT04. Each of the unit cell arrays MAT01 to MAT04 has a part of the memory cell array 1. The unit cell arrays MAT01 to MAT04 are disposed while three-dimensionally laminated as illustrated in FIG. 2A (the unit cell arrays MAT01 to MAT04 are disposed from a lower layer to an upper layer). FIG. 2A illustrates the memory cell array 1 by way of example only. The memory cell array 1 may have at least four unit cell arrays. In the memory cell array 1, the unit cell arrays may be disposed in a two-dimensional direction.

As illustrated in FIG. 2A, the unit cell array MAT01 includes plural word lines WL0ia (in FIG. 2A, i–0 to 2) and plural bit lines BLia. Similarly, as illustrated in FIG. 2A, the unit cell array MAT02 includes plural word lines WLib and plural bit lines BLib. The unit cell array MAT03 includes plural word lines WLi and plural bit lines BLic. The unit cell array MAT04 includes plural word lines WLid and plural bit lines BLid. In FIG. 2A, "i" is set in the range of 0 to 2 by way of example. Alternatively "i" may be set at 3 or more.

The plural word lines WLia are arranged in parallel with one another. The plural bit lines BLia are arranged in parallel with one another while intersecting the plural word lines WLia. A memory cell MC is disposed at each intersecting portion so as to be sandwiched between the interconnections. Desirably the word line WLia and the bit line BLia is made of a heat-resistant, low-resistance material such as W, WSi, NiSi, and CoSi. The plural word lines WLib, WLic, and WLid have the same configuration as the word line WLia. The plural bit lines BLib, the bit line BLic, and the bit line BLid have the same configuration as the bit line BLia.

Referring to FIG. 3A, the memory cell MC includes a circuit of a variable resistive element VR and a non-ohmic element NO are connected in series.

In the variable resistive element VR, a resistance value can be changed by voltage application through an electric current, heat, chemical energy, and the like. Electrodes EL1 and EL2 that acts as a barrier metal and a bonding layer are disposed on and beneath the variable resistive element VR. Examples of the electrode material include Pt, Au, Ag, TiAlN, SrRuO, Ru, RuN, Ir, Co, Ti, TiN, TaN, LaNiO, Al, PtIrOx, PtRhOx, and Rh/TaAlN. A metal film may be inserted so as to uniform orientation. A buffer layer, a barrier metal layer, and a bonding layer may separately be inserted.

A composite compound whose resistance value is changed by movement of a containing positive ion becoming a transition element (ReRAM) can be used as the variable resistive element VR.

Figure 3B:
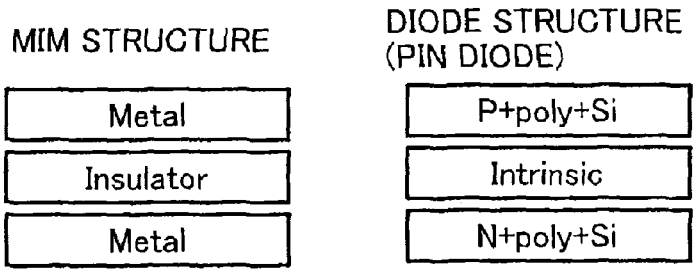
FIG. 3B illustrates a specific example of an ohmic element NO of FIG. 2B.

Referring to FIG. 3B, the non-ohmic element NO has (a) a MIM (Metal-Insulator-Metal) structure, (b) a PIN structure (P+ Poly-silicon-Intrinsic-N+ Poly-silicon), and the like. Electrodes EL2 and EL3 that acts as the barrier metal layer and the bonding layer may be disposed on and beneath the variable resistive element VR. In the case of the MIM structure, a bipolar operation can be performed. In the case of the PIN structure (diode structure), a unipolar operation can be performed due to characteristics thereof.

Figure 4:
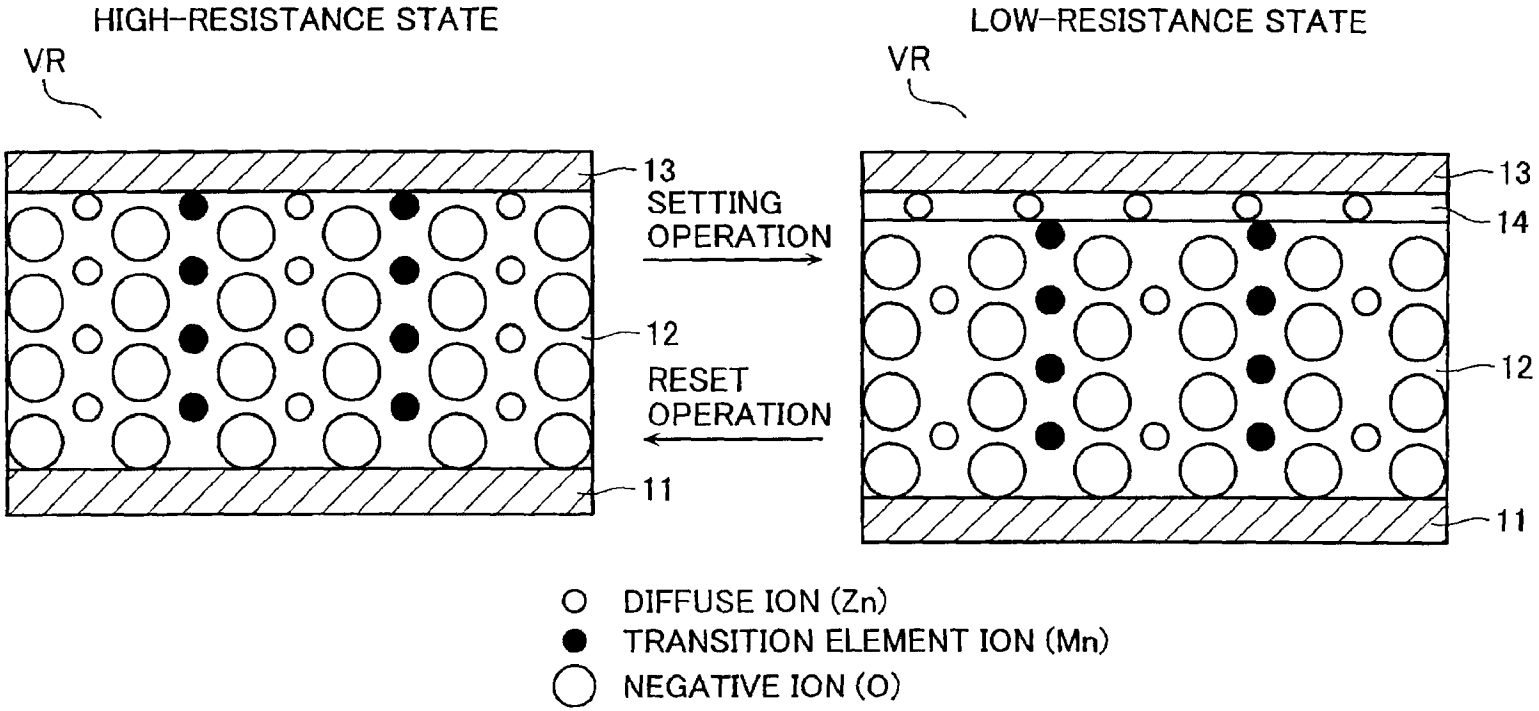
FIG. 4 is a sectional view schematically illustrating an example of a variable resistive element of the first embodiment.

FIG. 4 illustrates an example of the variable resistive element. In the variable resistive element VR of FIG. 4, a recording layer 12 is disposed between electrode layers 11 and 13. The recording layer 12 is made of a composite compound containing at least two kinds of the positive ion elements. The transition element having a d orbital that is incompletely filled with electrons is used as at least one kind of the positive ion element, and the shortest distance between the adjacent positive ion elements is 0.32 nm or less. Specifically, the composite compound is expressed by a chemical formula AxMyXz (A and M are elements different from each other), and the composite compound is formed by materials having crystal structures such as a spinel structure ($AM_2O_4$), an ilmenite structure ($AMO_3$), a delafossite structure ($AMO_2$) a $LiMoN_2$ structure ($AMN_2$), a wolframite structure ($AMO_4$), an olivine structure ($A_2MO_4$), a hollandite structure ($AxMO_2$), a ramsdellite structure ($AxMO_2$), and a perovskite structure ($AMO_3$).

In the example of FIG. 4, A is zinc (Zn), M is manganese (Mn), and X is oxygen (O). A small white circle in the recording layer 12 indicates a diffuse ion (Zn), a large white circle indicates a negative ion (O), and small black circle indicates a transition element ion (Mn). An initial state of the recording layer 12 is in a high-resistance state. When a negative voltage is applied onto the side of the electrode layer 13 while the electrode layer 11 is set at a fixed potential, the diffuse ions in the recording layer 12 are partially moved onto the side of the electrode layer 13, and the diffuse ions in the recording layer 12 is decreased relative to the negative ions. The diffuse ions moved onto the side of the electrode layer 13 receive electrons from the electrode layer 13, and the diffuse ions are deposited as metal, thereby forming the metal layer 14. In the recording layer 12, the negative ions become excessive, which increases a valence number of the transition element ion. Therefore, the recording layer 12 has electron conductivity by carrier injection, and a setting operation is completed. In reproduction, a minute electric current may be passed to an extent in which the resistance change is not generated in the material of the recording layer 12. In order to reset a program state (low-resistance state) to the initial state (high-resistance state), for example, a large current may sufficiently be passed through the recording layer 12 to perform Joule heating, and thereby promoting an oxidation-reduction reaction of the recording layer 12. Alternatively, the reset operation may be performed by applying an electric field in an opposite direction to the setting operation.

Figure 5:
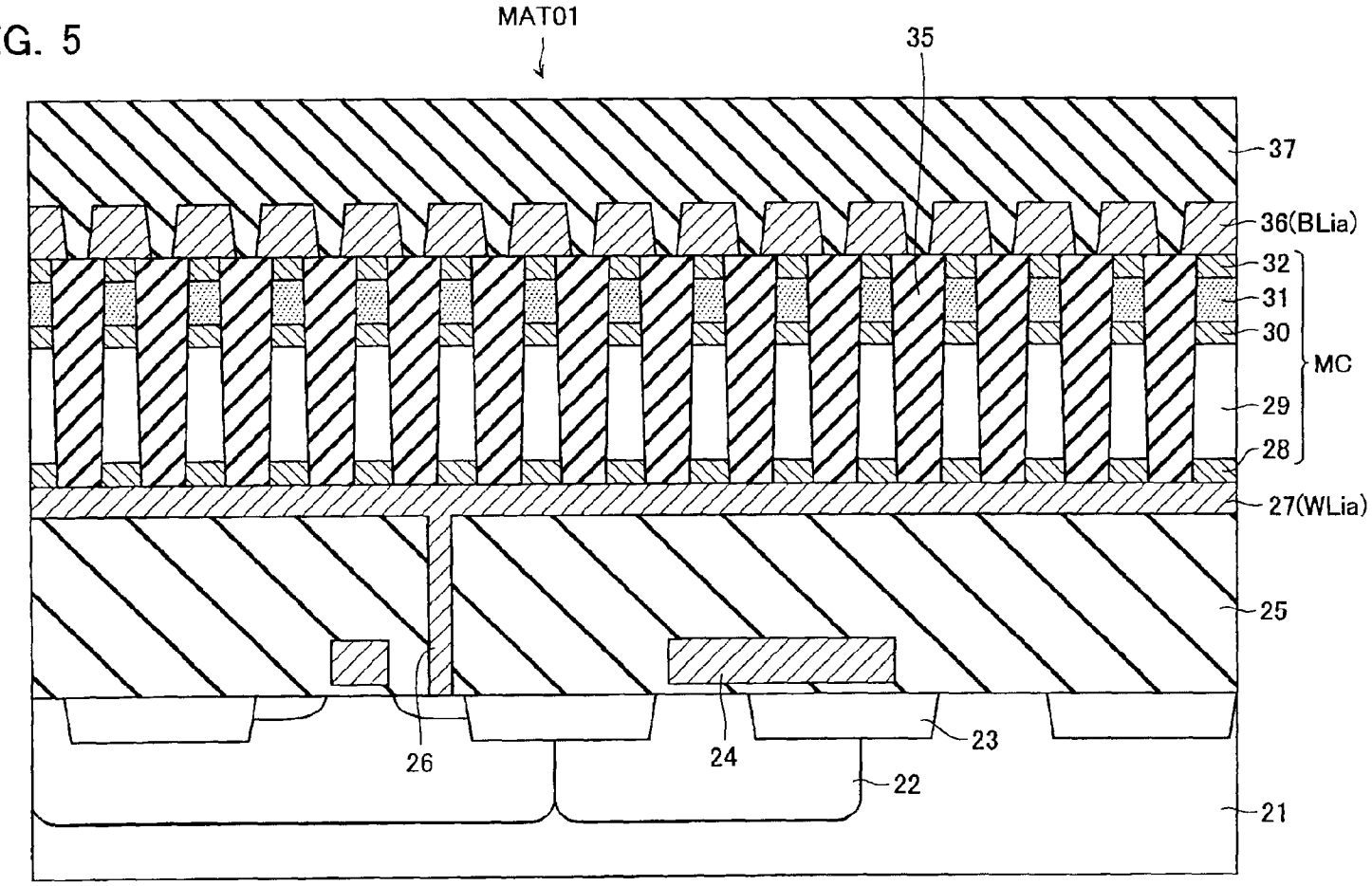
FIG. 5 is a sectional view illustrating a laminated structure of the unit cell array MAT01 of the first embodiment.

Specific Configuration of Nonvolatile Semiconductor Memory Device of First Embodiment A specific configuration of the nonvolatile semiconductor memory device of the first embodiment will be described with reference to FIGS. 5 to 7. FIG. 5 is a partially sectional view illustrating the nonvolatile semiconductor memory device constituting the unit cell array MAT01.

Referring to FIG. 5, an impurity diffused layer 23 and agate electrode 24 of a transistor constituting the peripheral circuit are formed on a silicon substrate 21 in which a well 22 is formed. A first interlayer insulator 25 is deposited on the impurity diffused layer 23 and the gate electrode 24. A via 26 that reaches a surface of the silicon substrate 21 is appropriately made in the first interlayer insulator 25. A first metal 27 constituting the word line WLia of the memory cell array 1 is formed on the first interlayer insulator 25, and the first metal 27 is made of low-resistance metal such as tungsten (W). A barrier metal 28 is formed on the first metal 27. The barrier metal may be formed beneath the first metal 27. The barrier metal may be made of one of or both Ti and TiN. A non-ohmic element 29 such as a diode is formed on the barrier metal 28. In addition to the above-described configuration, an interconnection layer including one or two layers may be formed on the first interlayer insulator layer 25.

A first electrode 30, a variable resistive element 31, and a second electrode 32 are formed on the non-ohmic element 29 in this order. Therefore, the barrier metal 28 to the second electrode 32 are formed as the memory cell MC. The barrier metal may be inserted beneath the first electrode 30 and on the second electrode 32, or the barrier metal and the bonding layer may be inserted beneath the second electrode 32 and on the first electrode 30. A gap between the adjacent memory cells MC is filled with a second interlayer insulator 34 and a third interlayer insulator 35 (however, the second interlayer insulator 34 is not illustrated in FIG. 5). A second metal 36 is formed on each memory cell MC of the memory cell array, and the second metal 36 constitutes the bit line BLia that is extended in a direction orthogonal to the word line WLia. Thus, the nonvolatile memory that is of a variable resistive memory is formed. In order to realize the multi-layer structure, the lamination from the barrier metal 28 to the second electrode 32 and the formation of the second and third interlayer insulators 34 and 35 between the memory cells MC may be repeated only as needed.

Figure 6A:
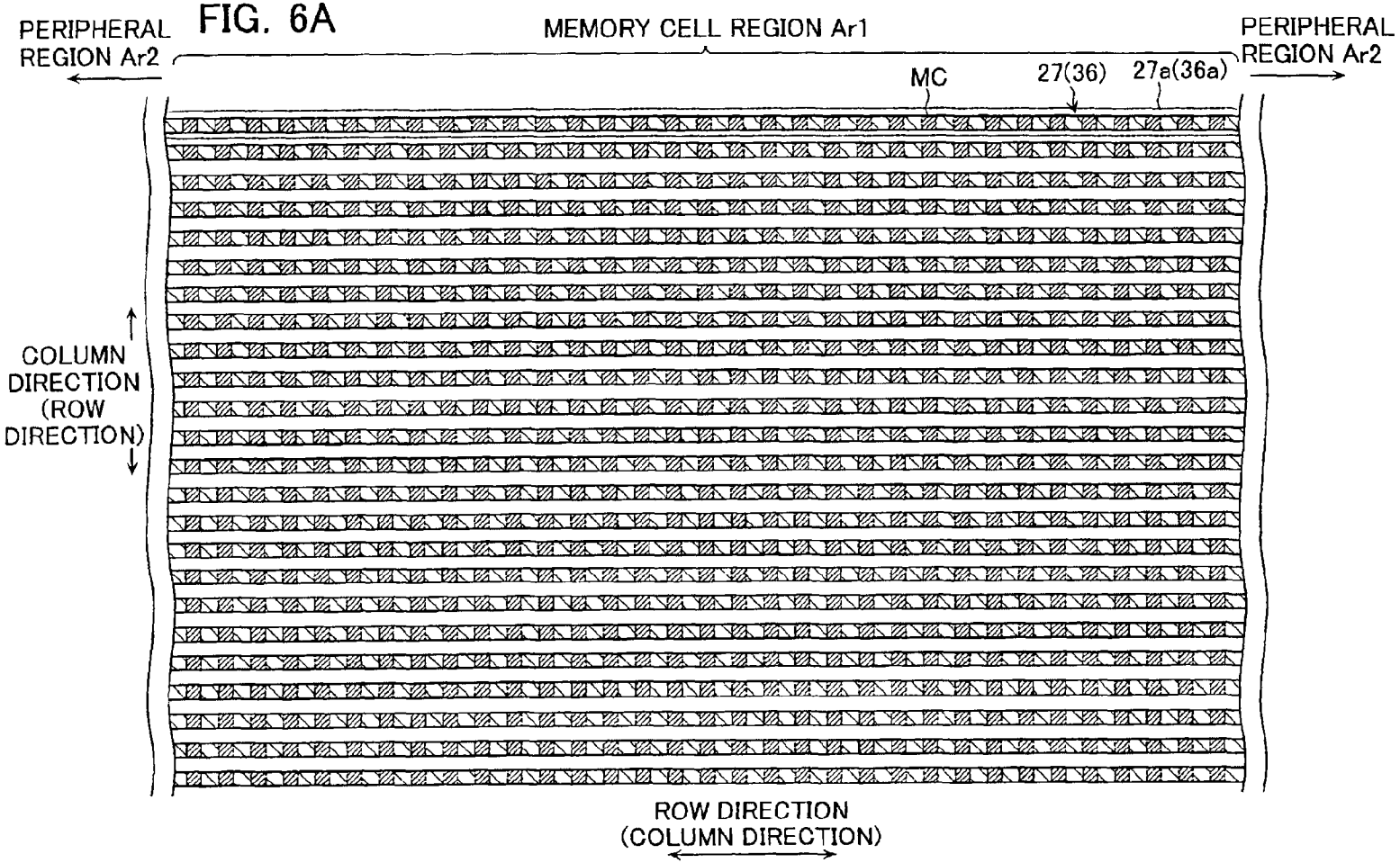
FIG. 6A is a top view illustrating a first metal 27 and a second metal 36.
Figure 6B:
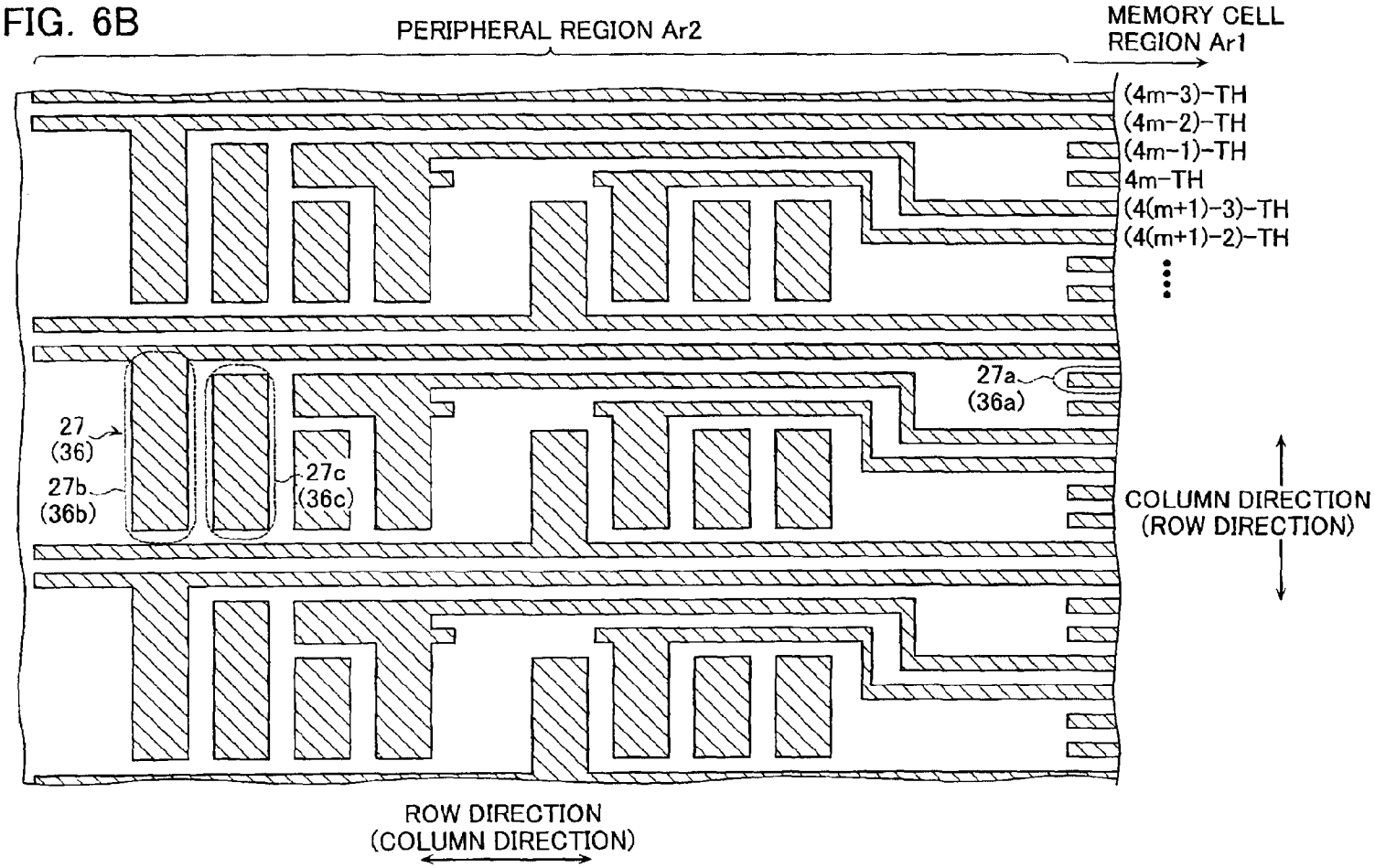
FIG. 6B is a top view illustrating the first metal 27 and the second metal 36.
Figure 6C:
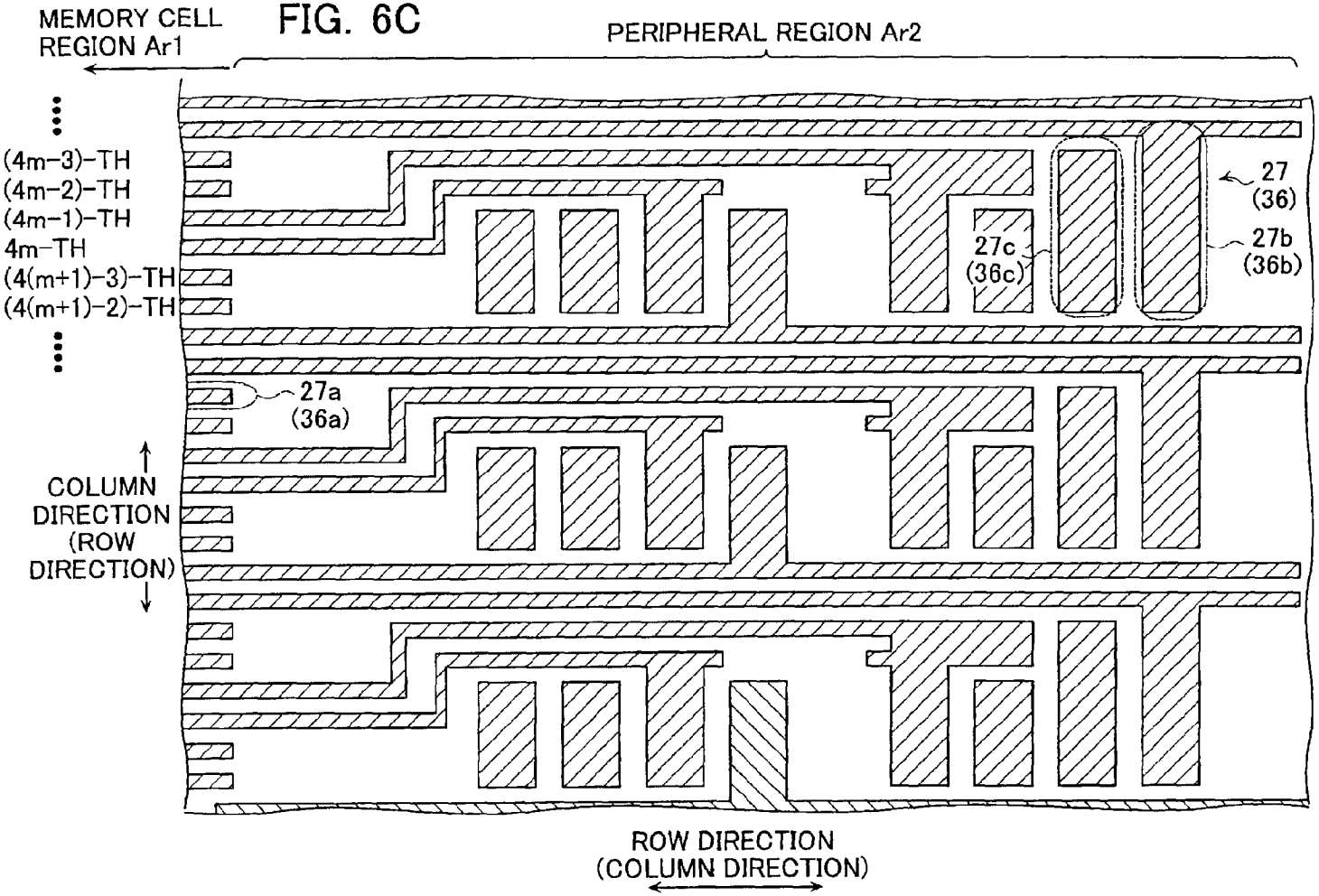
FIG. 6C is a top view illustrating the first metal 27 and the second metal 36.

FIGS. 6A to 6C are top views illustrating the first metal 27 (word line WLia). For the second metal 36 (bit line BLia), a basic pattern is almost the same only except that the direction in which the interconnection is extended is different by 90° from that of the first metal 27. Therefore, the case of the second metal 36 is described by the numeral in a parenthesis just for reference. FIG. 6A illustrates a memory cell region Ar1 where the memory cell MC is provided, and FIGS. 6B and 6C illustrate a peripheral region Ar2 provided around the memory cell region Ar1. A contact plug extended in a laminating direction is provided in the peripheral region Ar2.

Referring to FIG. 6A, in the memory cell region Ar1, the first metal 27 is extended in parallel with a row direction, and the first metal 27 includes linear portions 27a that are arranged at first intervals (for example, 40 nm or less) in a column direction (direction orthogonal to the row direction) In the memory cell region Ar1, the second metal 36 that is extended in the direction orthogonal to the first metal 27 is provided above the first metal 27, and the memory cell MC is formed in the intersecting portion of the first metal 26 and the second metal 36.

Referring to FIG. 6B, in the peripheral region Ar2, each of the first metals 27 located at (4n−3)-th (n is a positive integer) and (4n−2)-th positions in the column direction from the predetermined position has a contact connecting portion 27b on one end side in the row direction thereof.

Referring to FIG. 6C, in the peripheral region Ar2, each of the first metals 27 located at (4n−1)-th and 4n-th positions in the column direction from the predetermined position has a contact connecting portion 27b on the other end side in the row direction thereof. That is, each two of the first metals 27 alternately form the contact connecting portions 27b in the peripheral region Ar2 at both ends thereof.

The contact connecting portion 27b is formed so as to contact the contact plug extended in the laminating direction. The contact connecting portion 27b is integral with the linear portion 27a. The contact connecting portion 27b has a width in the column direction, which is larger than that of the linear portion 27a.

As illustrated in FIGS. 6B and 6C, in the peripheral region Ar2, the first metal 27 includes an island portion 27c that is adjacent to the contact connecting portion 27b in the row direction. The island portion 27c is provided while separated from the linear portion 27a and the contact connecting portion 27b. The island portion 27c is formed so as to contact the contact plug.

In the first embodiment, the first metal 27, the row direction, and the column direction correspond to the first line, the first direction, and the second direction, respectively.

On the other hand, as illustrated in FIG. 6A, in the memory cell region Ar1, the second metal 36 is extended in parallel with the column direction, and the second metal 36 includes linear portions 36a that are arranged at first intervals (for example, 40 nm or less) in the row direction.

As illustrated in FIG. 6B, in the peripheral region Ar2, each of the second metals 36 located at (4n−3)-th (n is a positive integer) and (4n−2)-th positions in the row direction from the predetermined position has a contact connecting portion 36b on one end side in the column direction thereof.

As illustrated in FIG. 6C, in the peripheral region Ar2, each of the second metals 36 located at (4n−1)-th and 4n-th positions in the row direction from the predetermined position has the contact connecting portion 36b on the other end side in the column direction thereof. That is, each two of the second metals 36 alternately form the contact connecting portions 36b in the peripheral region Ar2 at both ends thereof.

The contact connecting portion 36b is formed so as to contact the contact plug extended in the laminating direction. The contact connecting portion 36b is integral with the linear portion 36a. The contact connecting portion 36b has a width in the row direction, which is larger than that of the linear portion 36a.

As illustrated in FIGS. 6B and 6C, in the peripheral region Ar2, the second metal 36 includes an island portion 36c that is adjacent to the contact connecting portion 36b in the column direction. The island portion 36c is provided while separated from the linear portion 36a and the contact connecting portion 36b. The island portion 36c is formed so as to contact the contact plug.

In the first embodiment, the second metal 36, the row direction, and the column direction correspond to the first line, the second direction, and the first direction, respectively.

Figure 7:
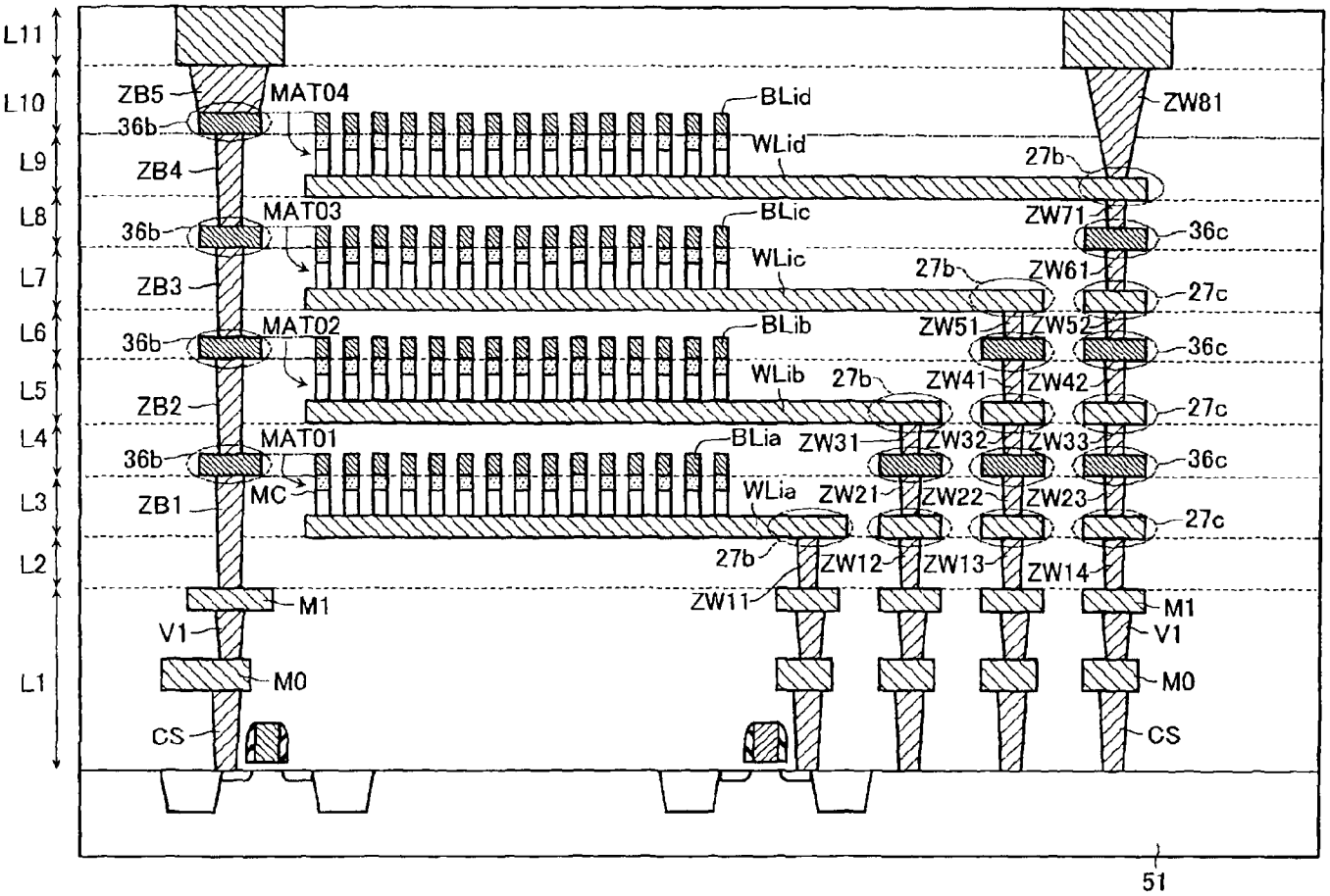
FIG. 7 is a view schematically explaining a contact plug of the nonvolatile semiconductor memory device of the first embodiment.

FIG. 7 is a view schematically illustrating the contact plug of the first embodiment. Referring to FIG. 7, an upper-layer portion is formed on a silicon substrate 51 while roughly including 11 layers (first layer L1 to eleventh layer L11).

The unit cell arrays MAT01 to MAT04 are formed in the third layer L3 to the ninth layer L9. The word line WLia includes the linear portion 27a, the contact connecting portion 27b, and the island portion 27c. The bit line BLia includes the linear portion 36a, the contact connecting portion 36b, and the island portion 36c.

The word line WLia, the bit line BLia, the word line WLib, the bit line BLib, the word line WLic, the bit line BLic, the word line WLid, and the bit line BLid are formed in a lower portion of each of the third layer L3 to the tenth layer L10, respectively.

As illustrated in FIG. 7, the nonvolatile semiconductor memory device of the first embodiment includes contact plugs ZW11 to ZW14, ZW21 to ZW23, ZW31 to ZW33, ZW41, ZW42, ZW51, ZW52, ZW61, ZW71, and ZW81 that electrically connect the word lines WLia to WLid to one another in the laminating direction. The nonvolatile semiconductor memory device of the first embodiment includes contact plugs ZB1 to ZB5 that electrically connect the bit lines BL1a to BL1d to one another in the laminating direction.

Contact plugs CS and V1 and metal interconnections M0 and M1 are formed in the first layer L1 so as to be extended from the upper surface of the first layer L1 to the silicon substrate 51, and the contact plugs CS and V1 and the metal interconnections M0 and M1 constitute a lower-layer interconnection unit. The word lines WL1a to WL1d and the bit lines BL1a to BL1d are connected through the lower-layer interconnection unit to peripheral circuits such as a row decoder which are formed in the silicon substrate 51.

At this point, for example, it is assumed that the description of "X1 to X2→Y1 to Y2" is given when a contact plug X1 to a contact plug X2 are formed in a Y1-th layer to a Y2-th layer. According to the description, a relationship between the contact plug of the first embodiment and the formed layer thereof can be expressed as follows:

<Relationship between Contact Plug and Formed Layer thereof>

ZW11 to ZW14→L2
ZW21 to ZW23→L3
ZW31 to ZW33→L4
ZW41 to ZW42→L5
ZW51 to ZW5→L6
ZW61→L7
ZW71→L8
ZW81→L9 to L10
ZB1→L2 to L3
ZB2→L4 to L5
ZB3→L6 to L7
ZB4→L8 to L9
ZB5→L10

For example, it is assumed that the description of "Z(27b)-X-M1" is given when the contact connecting portion 27b of the word line Z is connected to a metal interconnection M1 through a contact plug X. The island portion 27c of the word line Z is described as "Z(27c)". According to the description, a connection relationship by the contact plug of the first embodiment can be expressed as follows:

<Connection Relationship by Contact Plug>

WLia(27b)-ZW11-M1
WLib(27b)-ZW31-BLia(36c)-ZW21-WLia(27c)-ZW12-M1
WLic(27b)-ZW51-BLib(36c)-ZW41-WLib(27c)-ZW32-BLia(36c)-ZW22-WLia(27c)-ZW13-M1
WLid(27b)-ZW71-BLic(36c)-ZW61-WLic(27c)-ZW52-BLib(36c)-ZW42-WLib(27c)-ZW33-BLia(36c)-ZW23-WLia(27c)-ZW14-M1
ZB5-BLid(36b)-ZB4-BLic(36b)-ZB3-BLib(36b)-ZB2-BLia(36b)-ZB1-M1

Process for Producing Nonvolatile Semiconductor Memory Device of First Embodiment A process for producing the nonvolatile semiconductor memory device of the first embodiment will be described below. The following producing process describes a process of forming the unit cell array MAT01. The unit cell arrays MAT02 to MAT04 are produced through the same forming process as the unit cell array MAT01.

An FEOL (Front End Of Line) process is performed to form the transistors constituting the necessary peripheral circuits on the silicon substrate 21, and the first interlayer insulator 25 (see FIG. 5) is deposited on the transistors.

Then the upper-layer portion from the first metal 27 is formed.

FIGS. 8 to 13 are perspective views illustrating a process for producing the upper-layer portion in the process order. The process for producing the upper-layer portion will be described with reference to FIGS. 8 to 13.

Figure 8:
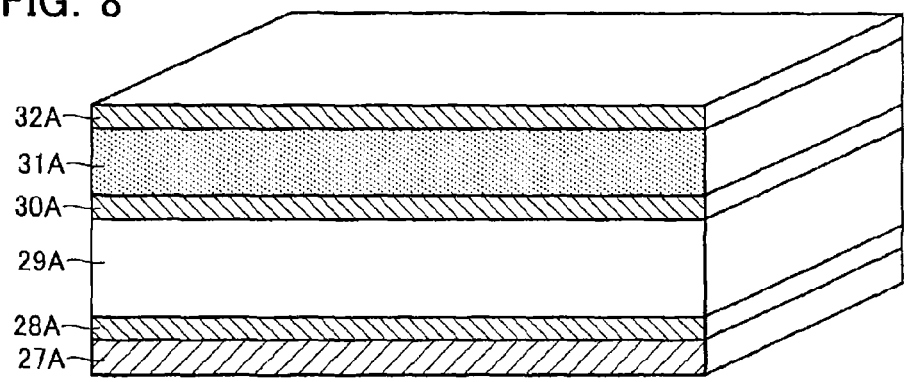
FIG. 8 is a perspective view illustrating a process for producing the nonvolatile semiconductor memory device of the first embodiment.

As described above, when the first interlayer insulator 25 is formed, a layer 27A constituting the first metal 27 of the memory cell array 1 is deposited on the first interlayer insulator 25, a layer 28A constituting the barrier metal 28 is formed, a layer 29A constituting the non-ohmic element 29 is deposited, a layer 30A constituting the first electrode 30 is deposited, a layer 31A constituting the variable resistive element 31 is deposited, and a layer 32A constituting the second electrode 32 is deposited. Therefore, the laminated structure of the upper-layer portion of FIG. 8 is formed.

Figure 9:
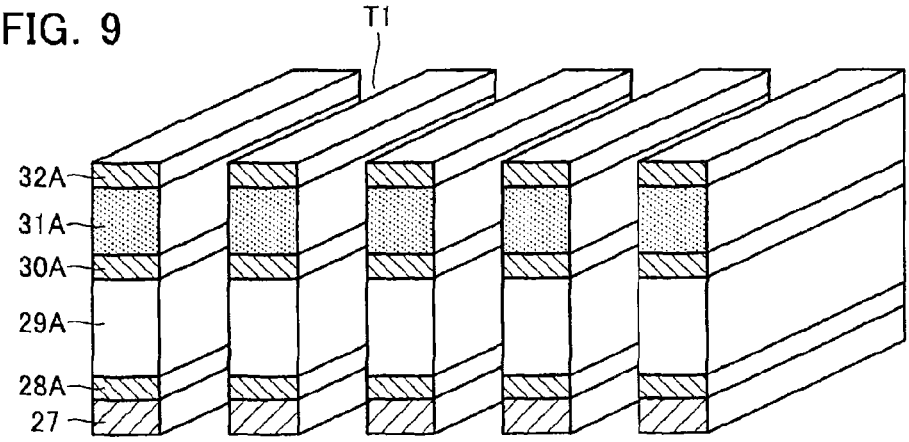
FIG. 9 is a perspective view illustrating a process for producing the nonvolatile semiconductor memory device of the first embodiment.

Then, a hard mask (not illustrated) of a TEOS film is formed in the upper surface of the laminated structure, and first anisotropic etching is performed with the hard mask to form a trench T1 along the word line WL as illustrated in FIG. 9, thereby separating the laminated body.

Figure 10:
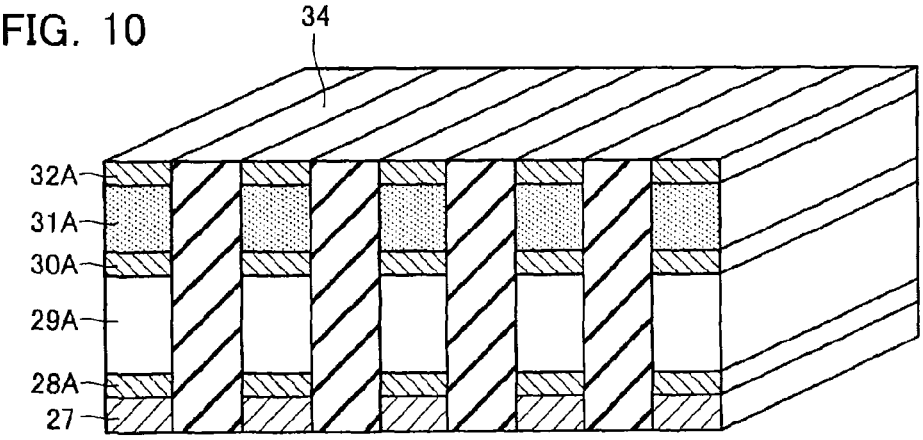
FIG. 10 is a perspective view illustrating a process for producing the nonvolatile semiconductor memory device of the first embodiment.

Then the second interlayer insulator 34 is embedded in the trench T1. A material having a good insulating property, a low capacitance, and a good embedding property is suitable to the second interlayer insulator 34. Then a planarization process is performed by CMP to perform removal of the excess second interlayer insulator 34 and exposure of the upper electrode 32. FIG. 10 is a sectional view after the planarization process is performed. A protective film may be formed by oxidizing and nitriding a sidewall of the trench T1 before the second interlayer insulator 34 is formed. The formation of the protective film can prevent the oxidation.

Figure 11:
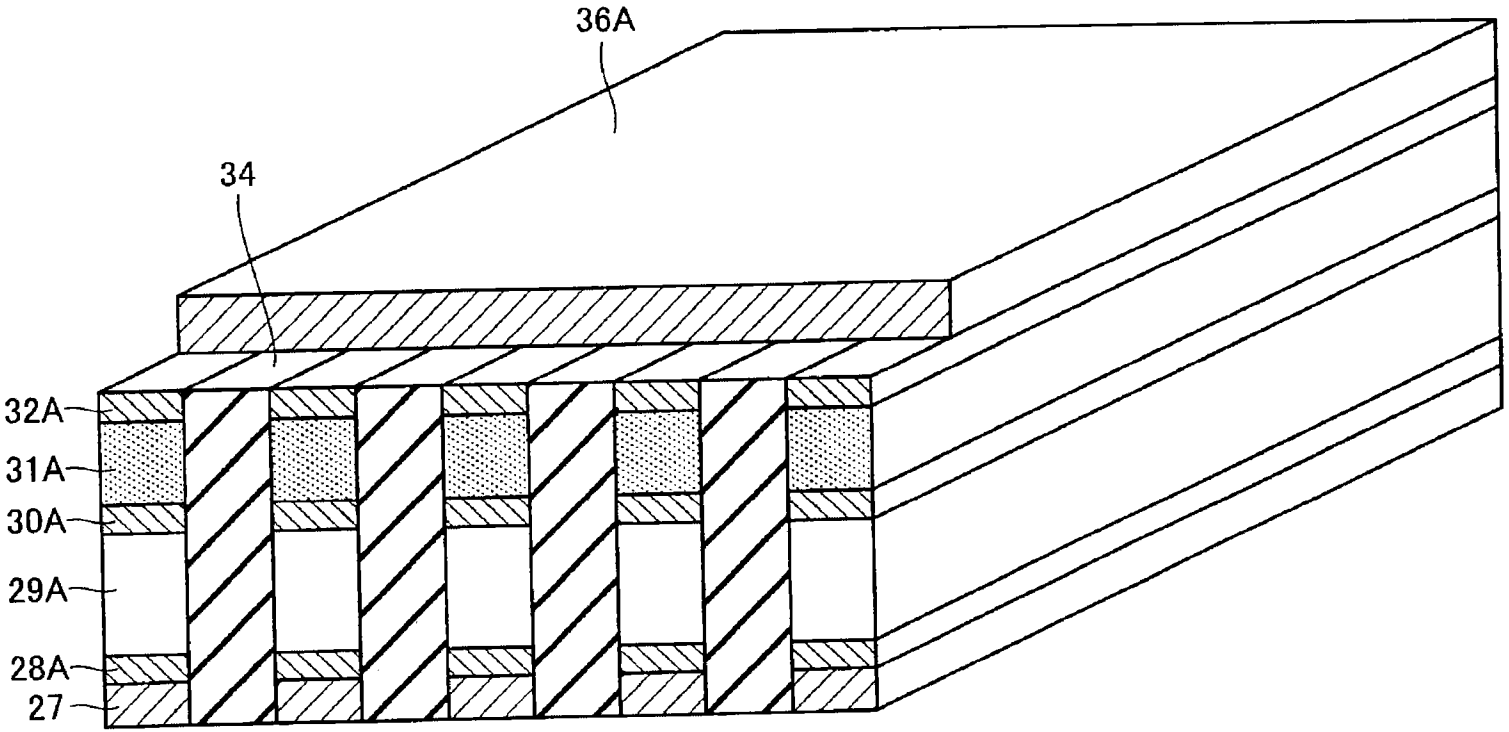
FIG. 11 is a perspective view illustrating a process for producing the nonvolatile semiconductor memory device of the first embodiment.

A layer 36A made of tungsten that constitutes the second metal 36 is laminated on the planarized portion after CMP. FIG. 11 illustrates the state after the layer 36A is laminated.

Figure 12:
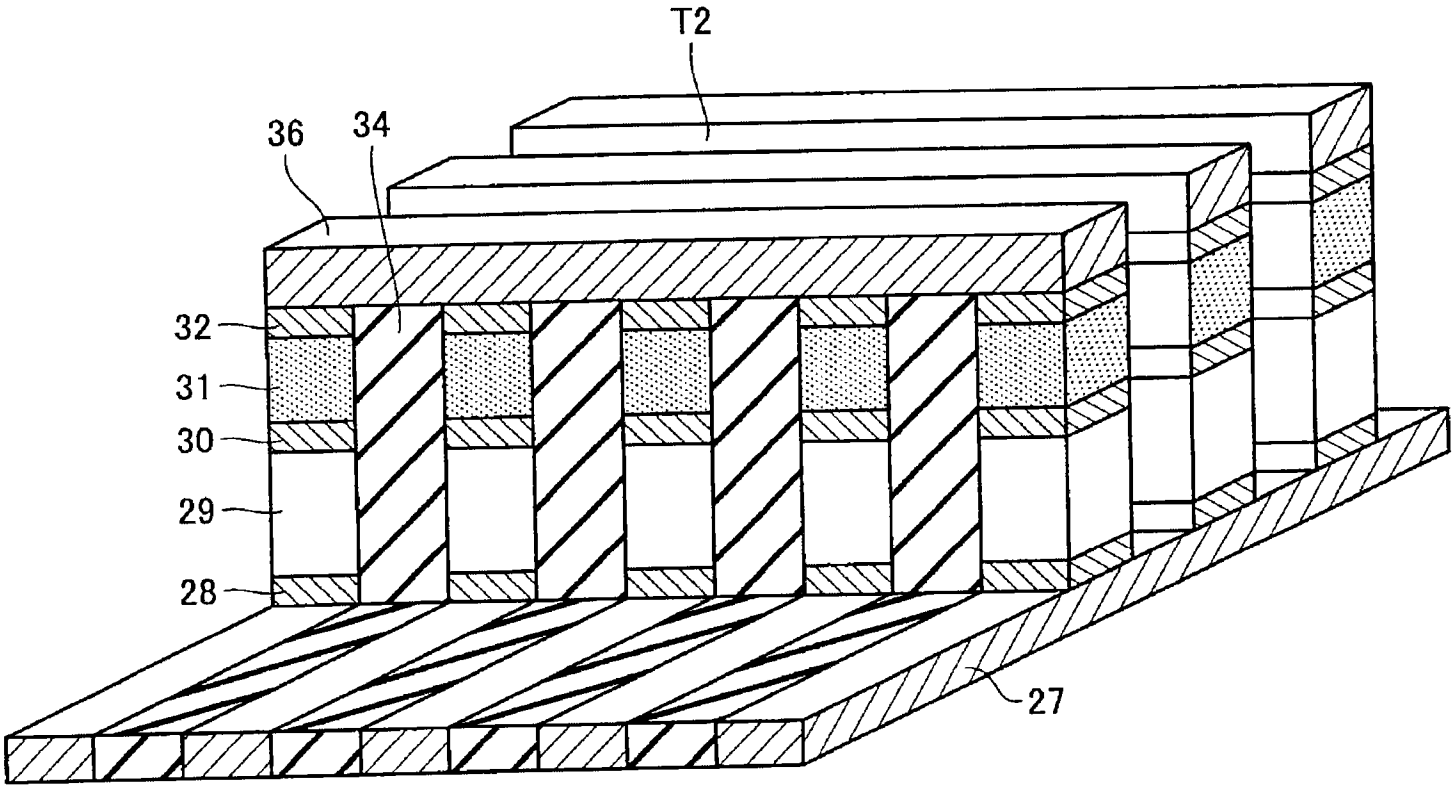
FIG. 12 is a perspective view illustrating a process for producing the nonvolatile semiconductor memory device of the first embodiment.
Figure 13:
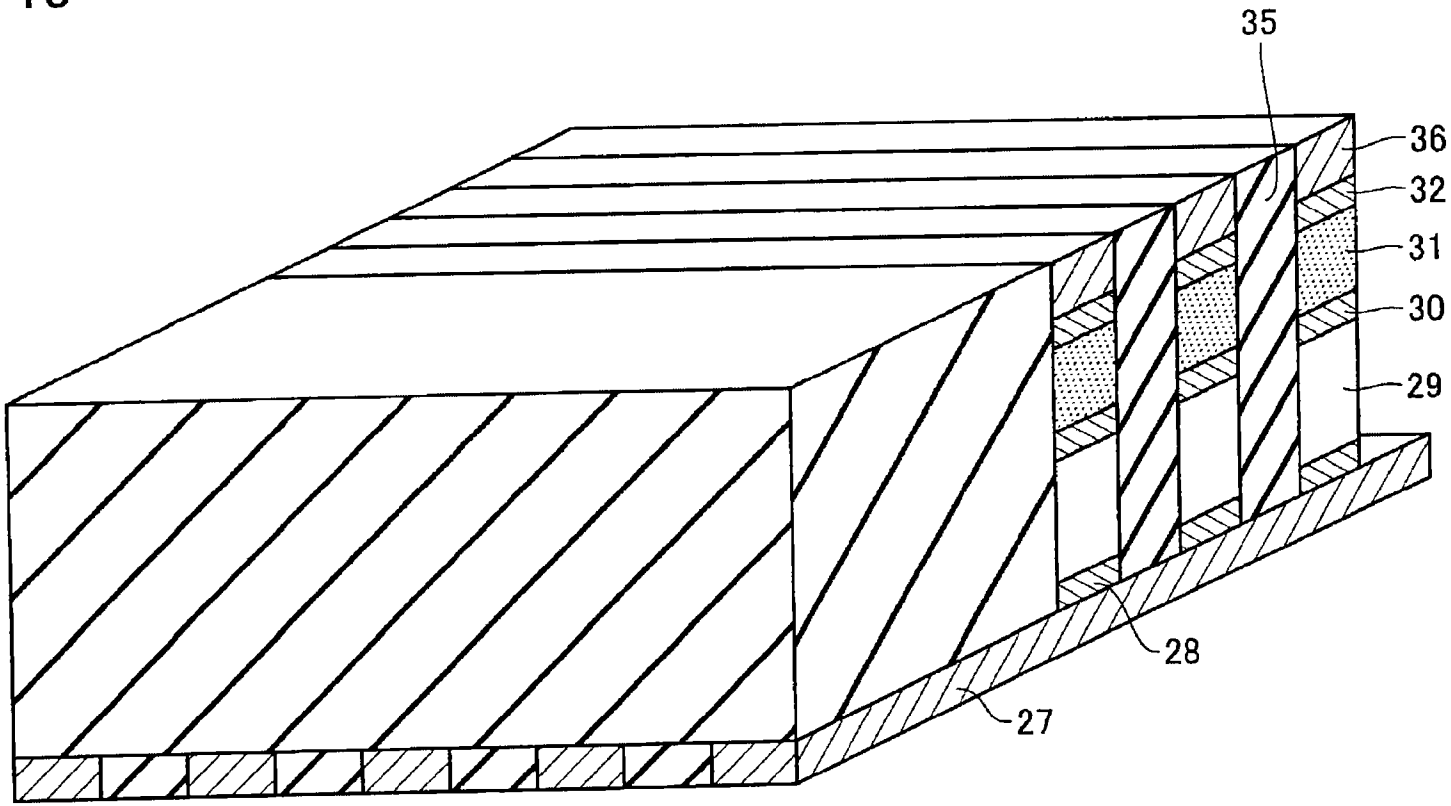
FIG. 13 is a perspective view illustrating a process for producing the nonvolatile semiconductor memory device of the first embodiment.

Then, the hard of the TEOS film is formed on the layer 36A, and second etching is performed with L/S in the direction orthogonal to the first etching. Therefore, as illustrated in FIG. 12, a trench T2 is formed along the word line WLia orthogonal to the bit line BLia, and the memory cell MC that is separated into a columnar shape is simultaneously formed in a self-aligned manner at a cross point of the bit line BLia and the word line WLia. Then, as illustrated in FIG. 13, a cross-point type memory array layer is formed by the embedment and planarization of the third interlayer insulator 35.

After the films are laminated, the patterning processes are performed twice in the directions orthogonal to each other, whereby the cross-point cell portion is formed in the self-aligned manner with no misalignment. In order to achieve the finer design rule of the memory cell, L/S is a key factor for the finer design rule.

A process for forming the finer laminated structure illustrated in FIGS. 11 and 12 will be described in detail with reference to FIGS. 14A to 30. In FIGS. 14A to 30, FIGS. 14A, 17A, 19A, 21A, 22A, 23A, 25A, and 27A are plan views, and other drawings are sectional view illustrating portions specified by regions A-A' to S-S' in the plan views.

Figure 14A:
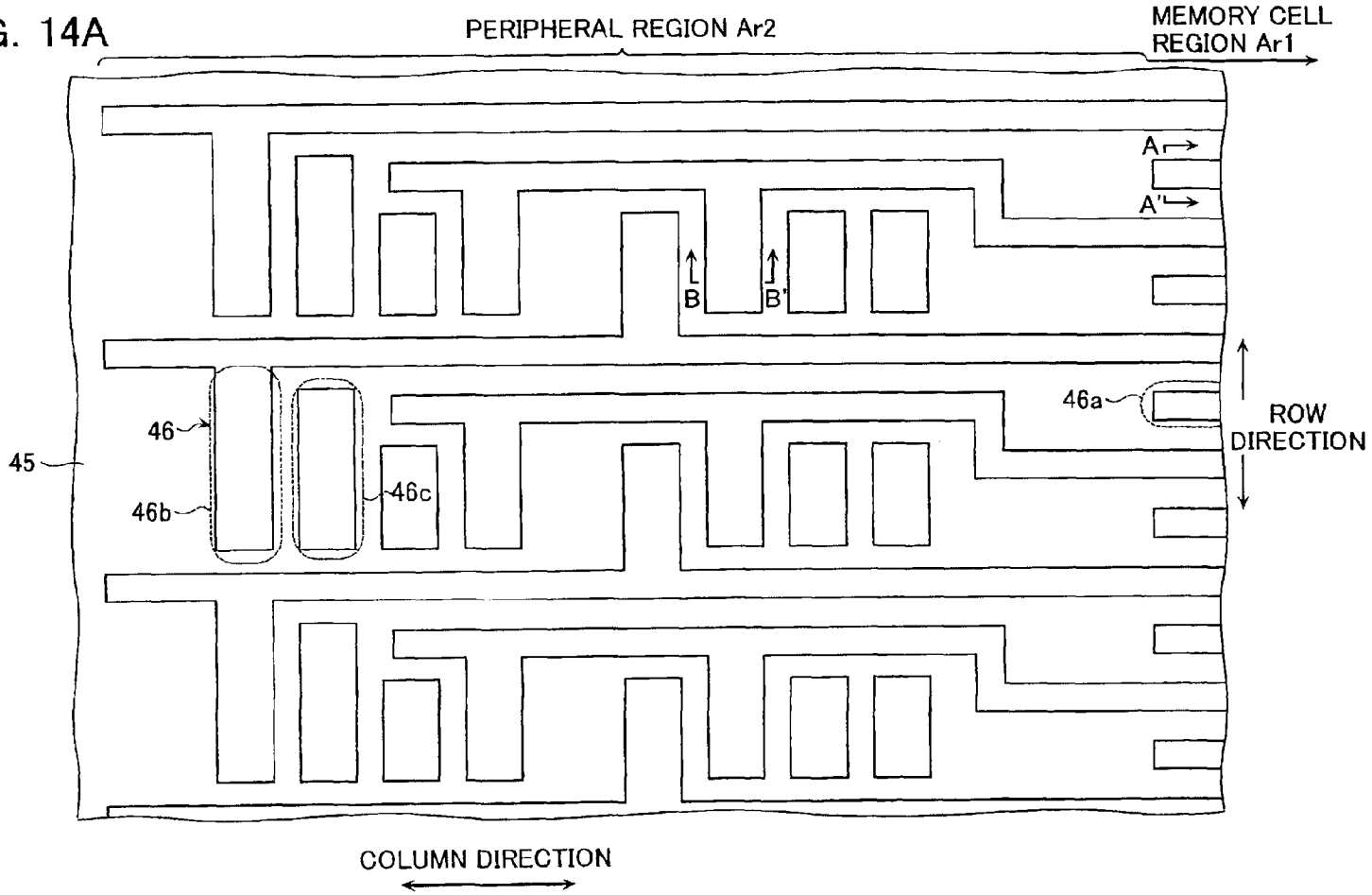
FIG. 14A is a top view illustrating a process for producing the nonvolatile semiconductor memory device of the first embodiment.
Figure 14B:
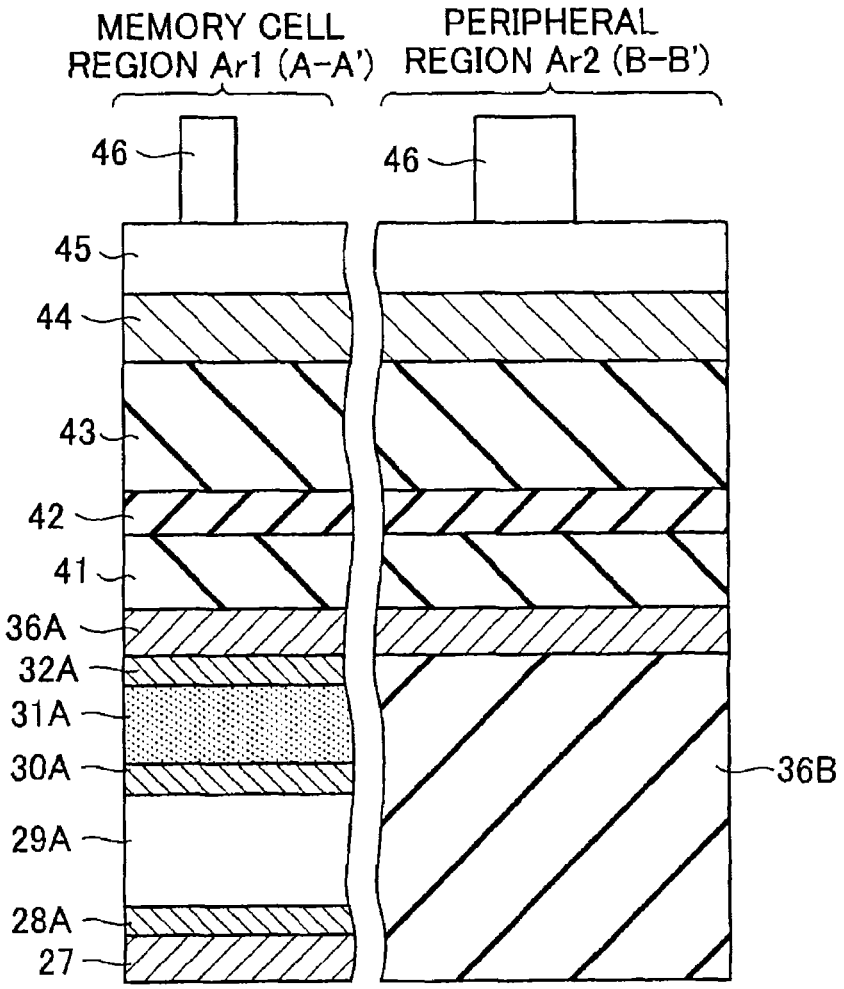
FIG. 14B is a sectional view illustrating a process for producing the nonvolatile semiconductor memory device of the first embodiment.

Referring to FIGS. 14A and 14B, a hard mask layer ($SiO_2$) 41, a silicon nitride mask layer (SiN) 42, a sacrifice layer ($SiO_2$) 43, an amorphous silicon mask layer (a-Si) 44, an antireflection coating layer (ARC layer) 45, and a resist 46 are laminated in this order on the layer 36A constituting the second metal 36. The first metal 27, the layer 28A, the layer 29A, the layer 30A, the layer 31A, and the layer 32A are formed below the layer 36A in the memory cell region Ar1. An interlayer insulator layer 36B is formed below the layer 36A in the peripheral region Ar2.

In the memory cell region Ar1, the resist 46 is extended in parallel with the column direction, and the resist 46 includes linear portions 46a that are formed at second intervals (second interval>first interval) in the row direction.

As illustrated in FIGS. 14A and 14B, in the peripheral region Ar2, the resist 46 located at a (2n−1)-th (n is a positive integer) position in the row direction from the predetermined position has a projection 46b on one end side in the column direction of the linear portion 46a.

The projection 46b is projected with a predetermined length in the column direction so as to be extended in the row direction. The projection 46b is integral with the linear portion 46a.

As illustrated in FIGS. 14A and 14B, in the peripheral region Ar2, the resist 46 located at a 2n-th position in the row direction from the predetermined position has the two projections 46b on the other end side in the column direction of the linear portion 46a.

As illustrated in FIGS. 14A and 14B, in the peripheral region Ar2, the resist 46 has an island portion 46c. The island portion 46c is provided while separated from the linear portion 46a and the projection 46b.

In summary, the process illustrated in FIGS. 14A and 14B is a process for forming the hard mask layer 41 (first mask) and the silicon nitride mask layer 42 (first mask) on the laminated structure whose uppermost layer is the layer 36A.

Figure 15:
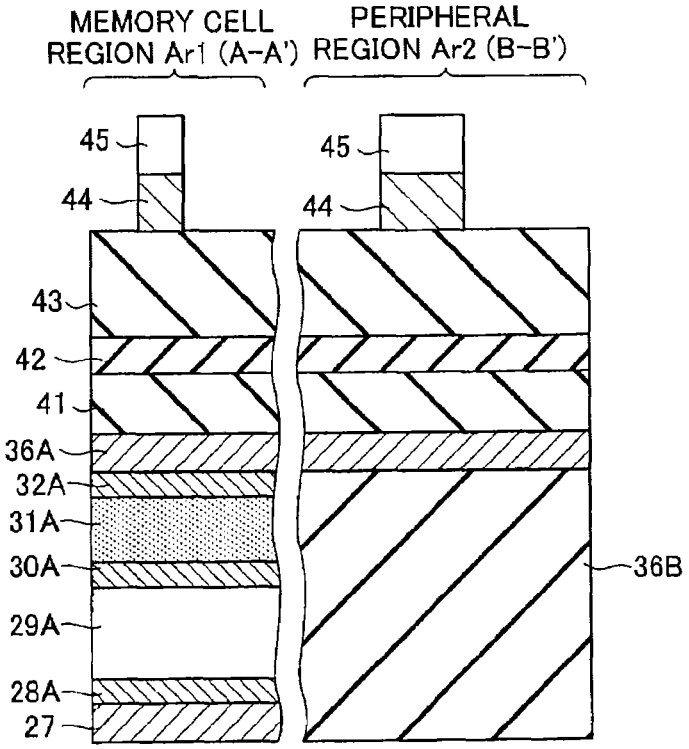
FIG. 15 is a sectional view illustrating a process for producing the nonvolatile semiconductor memory device of the first embodiment.

As illustrated in FIG. 15, the antireflection coating layer (ARC layer) 45 and the amorphous silicon mask layer 44 are etched with the resist 46 as the mask. The resist 46 is removed after the etching.

Figure 16:
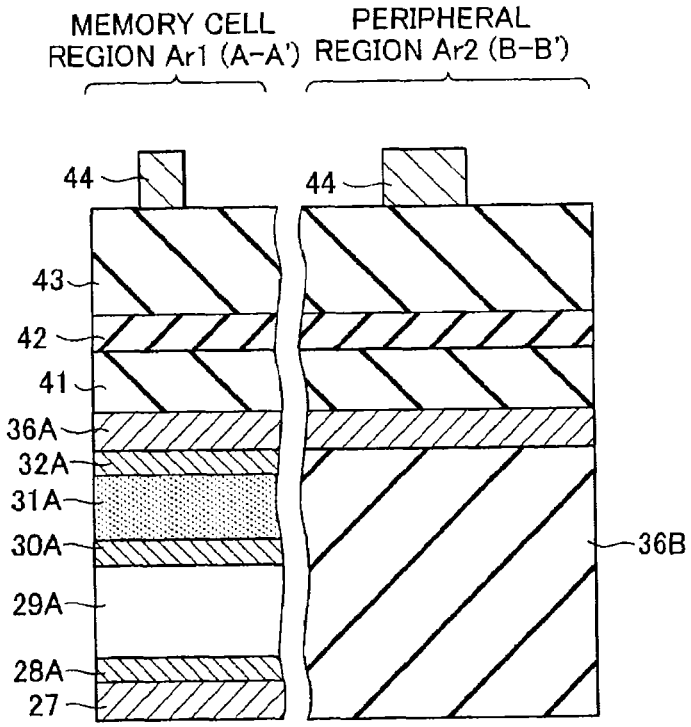
FIG. 16 is a sectional view illustrating a process for producing the nonvolatile semiconductor memory device of the first embodiment.

As illustrated in FIG. 16, the antireflection coating layer 45 is removed.

Figure 17A:
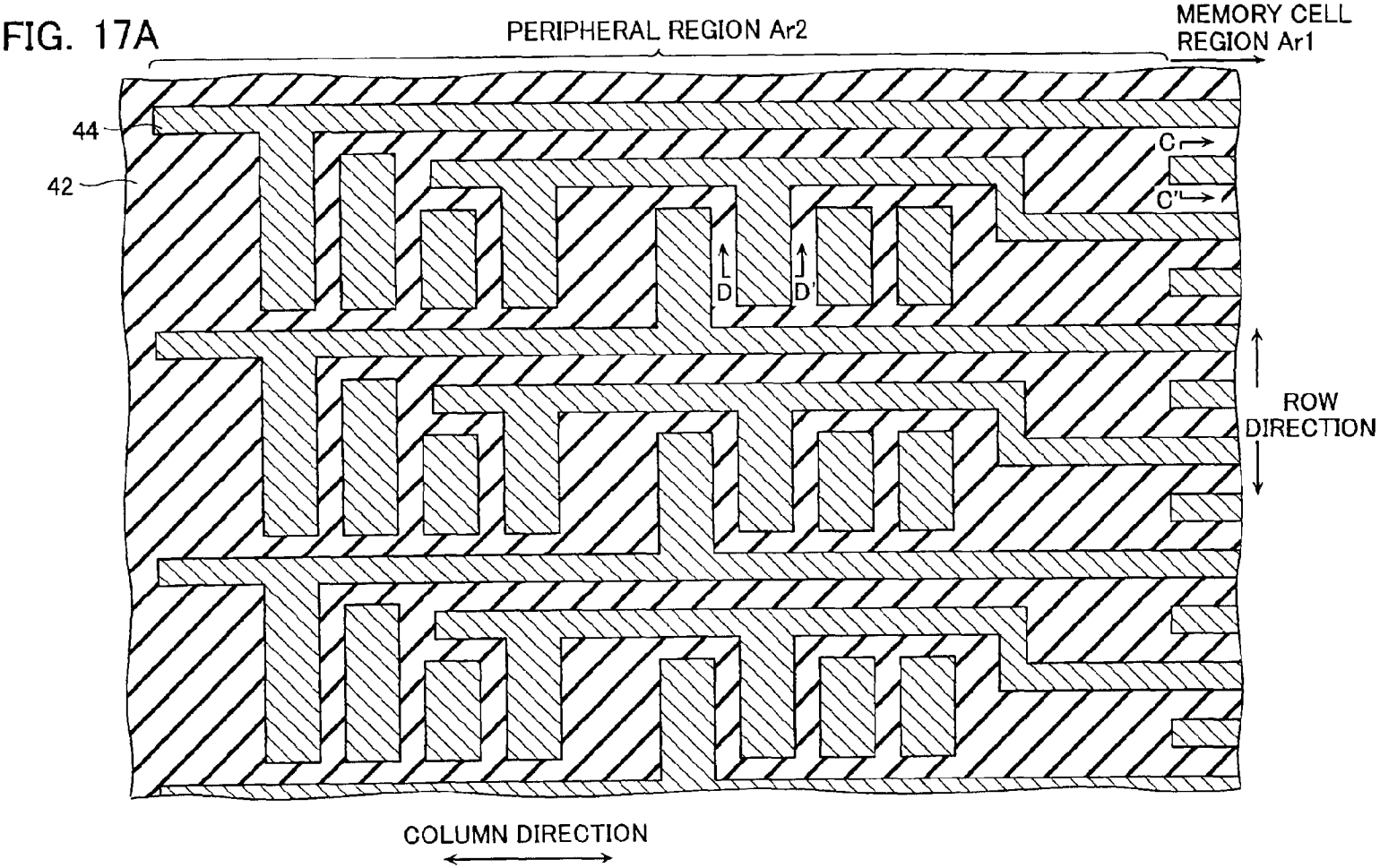
FIG. 17A is a top view illustrating a process for producing the nonvolatile semiconductor memory device of the first embodiment.
Figure 17B:
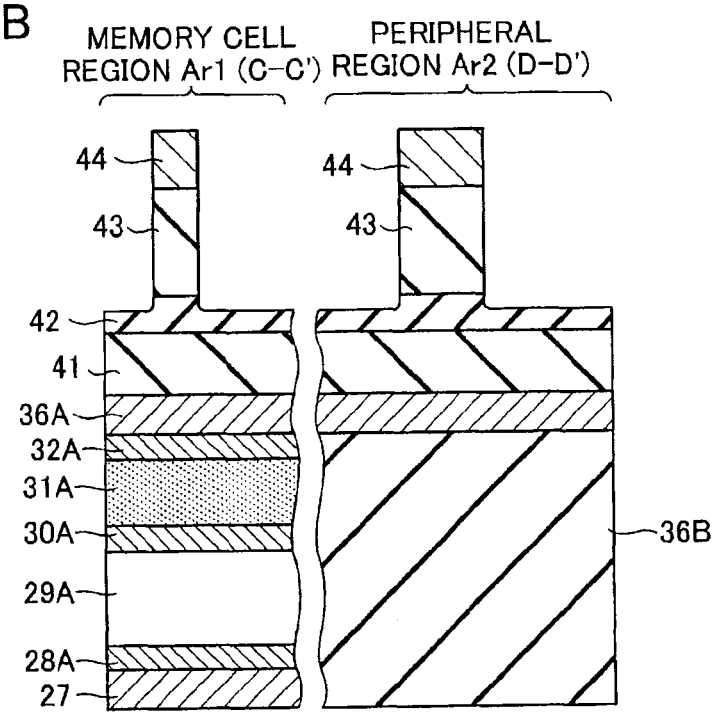
FIG. 17B is a sectional view illustrating a process for producing the nonvolatile semiconductor memory device of the first embodiment.

As illustrated in FIGS. 17A and 17B, the sacrifice layer 43 is etched with the amorphous silicon mask layer 44 as the mask. Therefore, the sacrifice layer 43 is formed into the shape similar to that of the resist 46. That is, as with the resist 46, the sacrifice layer 43 is formed so as to include the linear portion 43a, the projection 43b, and the island portion 43c.

Figure 18:
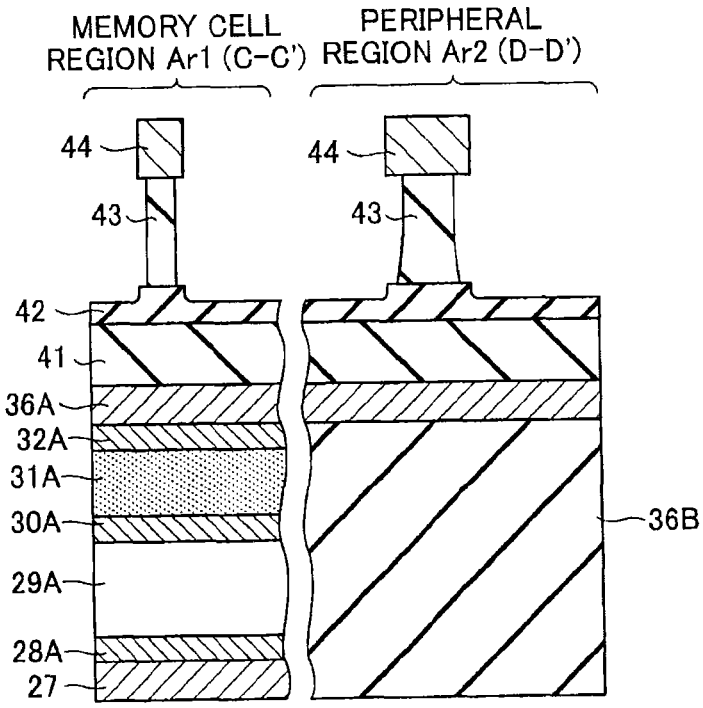
FIG. 18 is a sectional view illustrating a process for producing the nonvolatile semiconductor memory device of the first embodiment.

As illustrated in FIG. 18, a slimming process is performed to the sacrifice layer 43. Through the slimming process, the width of the sacrifice layer 43 is decreased.

Figure 19A:
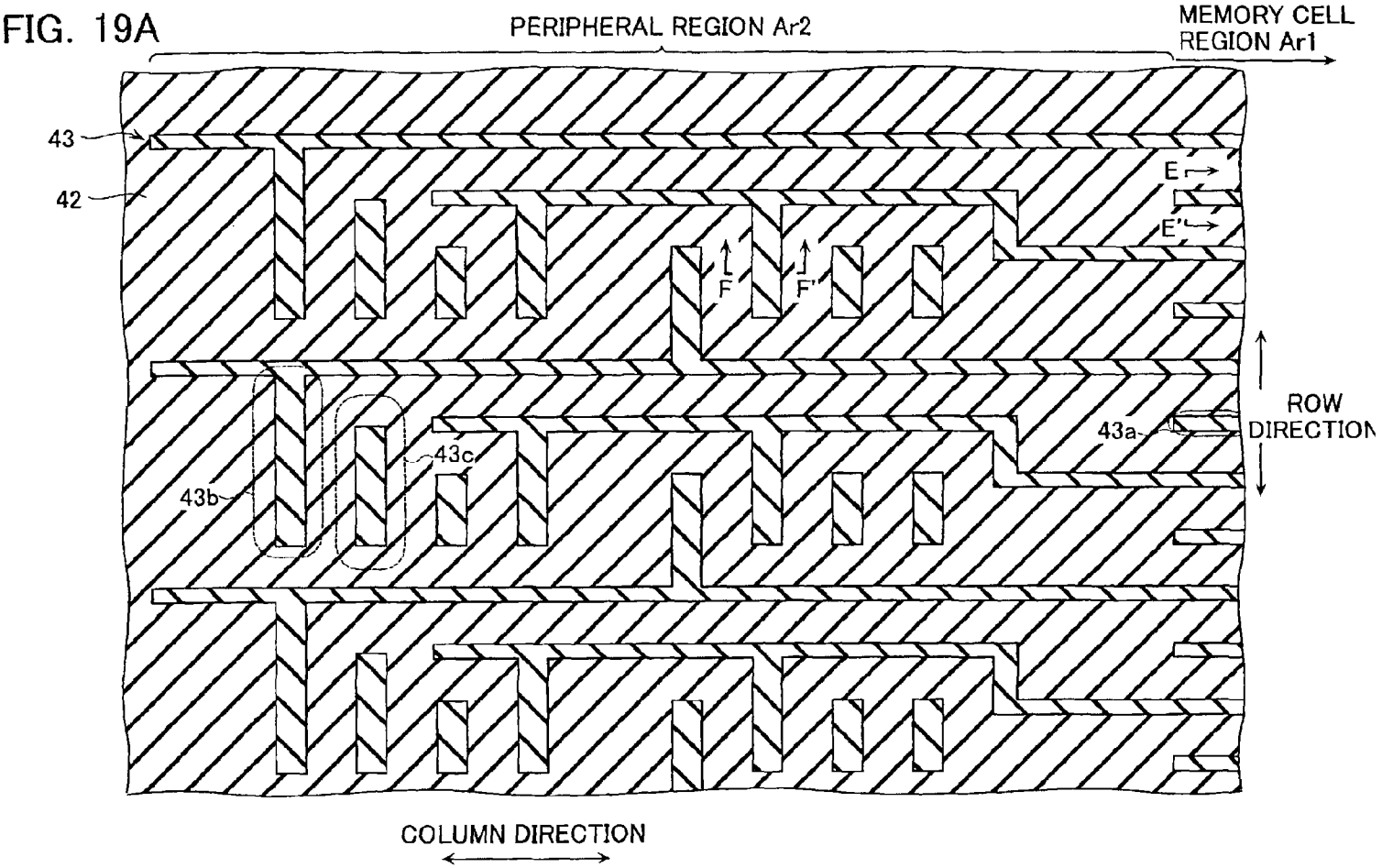
FIG. 19A is a top view illustrating a process for producing the nonvolatile semiconductor memory device of the first embodiment.
Figure 19B:
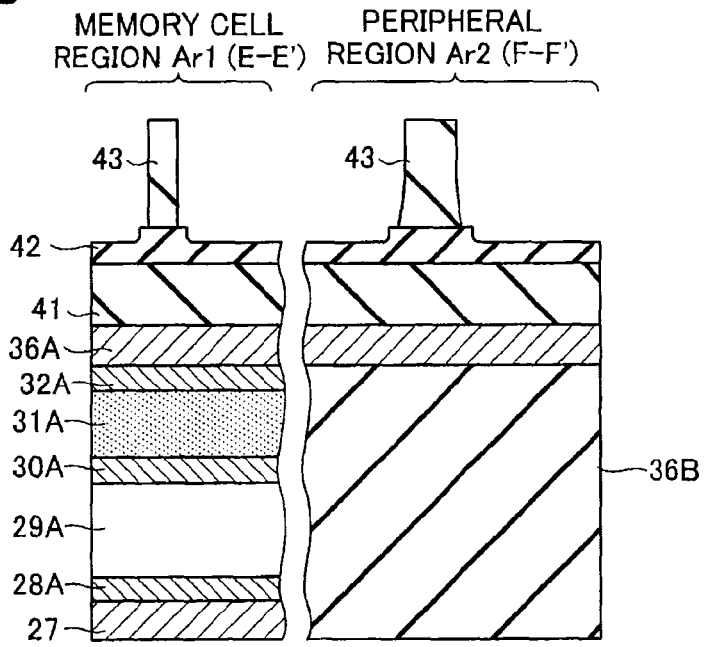
FIG. 19B is a sectional view illustrating a process for producing the nonvolatile semiconductor memory device of the first embodiment.

As illustrated in FIGS. 19A and 19B, the amorphous silicon mask layer 44 is removed.

In summary, the process illustrated in FIGS. 15 to 19B is a process for forming the sacrifice layer 43 (second mask) having the predetermined pattern on the silicon nitride mask layer 42 (first mask).

Figure 20:
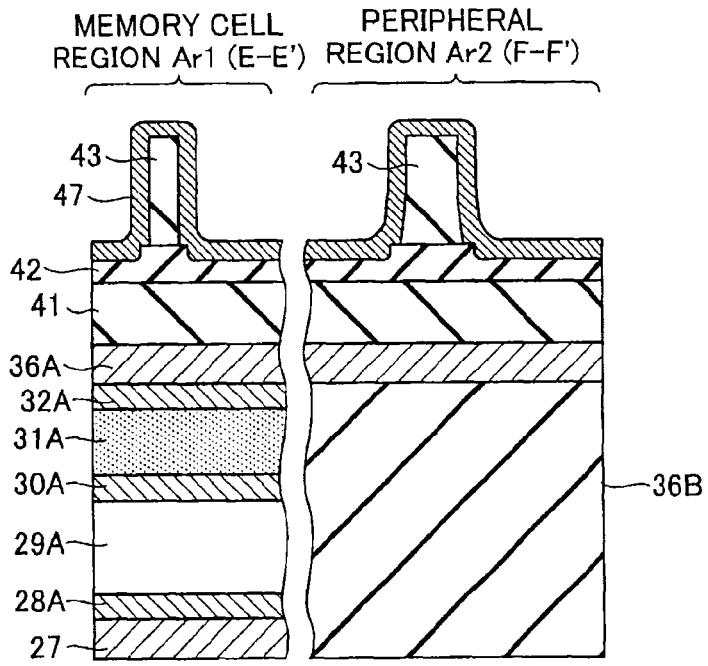
FIG. 20 is a sectional view illustrating a process for producing the nonvolatile semiconductor memory device of the first embodiment.

As illustrated in FIG. 20, a spacer layer (a-Si) 47 is formed such that the upper surface and side face of the sacrifice layer 43 and the upper surface of the silicon nitride mask layer 42 are covered therewith.

Figure 21A:
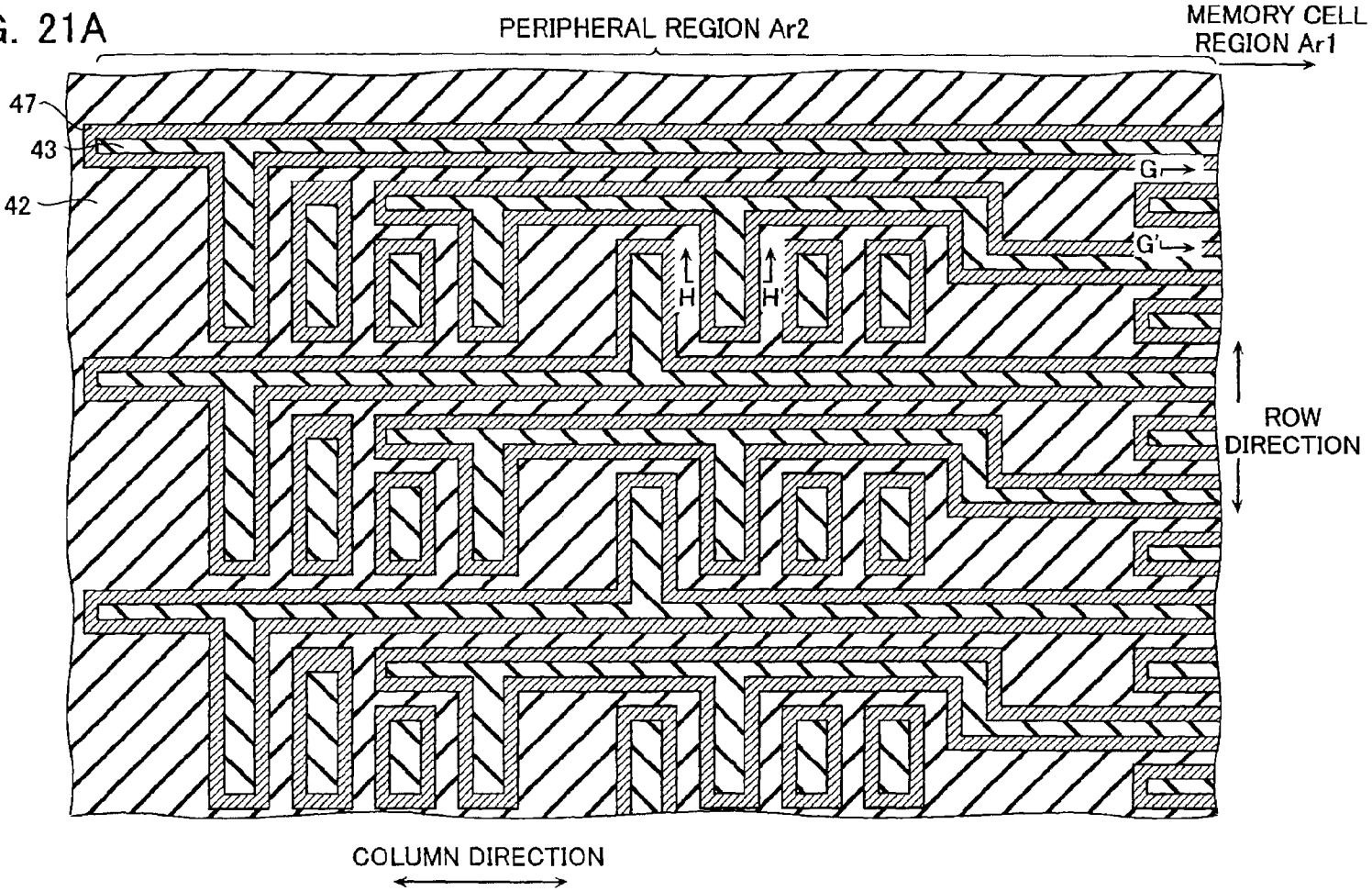
FIG. 21A is a top view illustrating a process for producing the nonvolatile semiconductor memory device of the first embodiment.
Figure 21B:
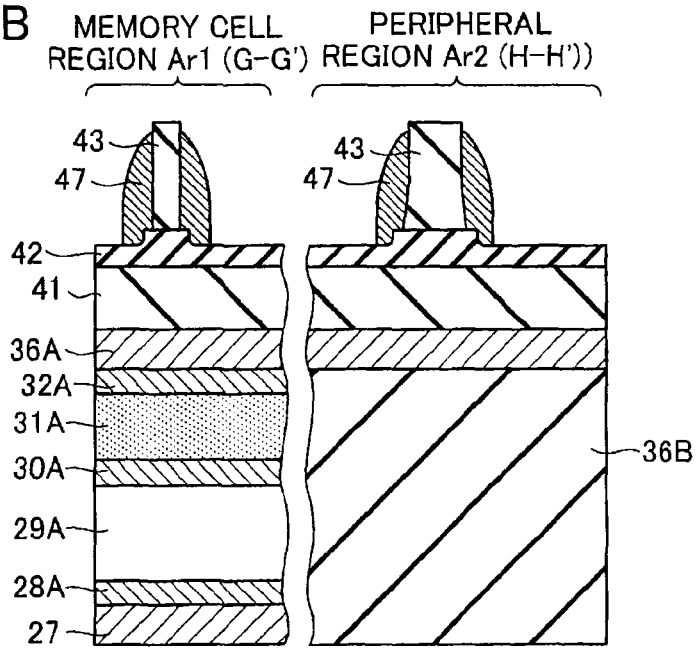
FIG. 21B is a sectional view illustrating a process for producing the nonvolatile semiconductor memory device of the first embodiment.

As illustrated in FIGS. 21A and 21B, the spacer layer 47 on the upper surface of the sacrifice layer 43 and the spacer layer 47 on the upper surface of the silicon nitride mask layer 42 are removed. That is, the spacer layer 47 is left only on the sidewall of the sacrifice layer 43.

In summary, the process illustrated in FIGS. 20 to 21B is a process for forming the spacer layer 47 (third mask) on the sidewall of the sacrifice layer 43 (second mask).

Figure 22B:
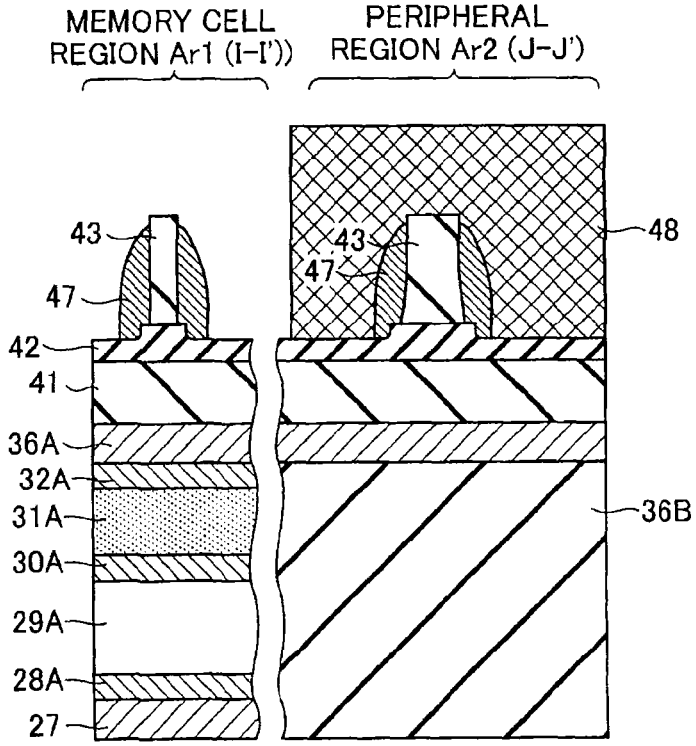
FIG. 22B is a sectional view illustrating a process for producing the nonvolatile semiconductor memory device of the first embodiment.
Figure 22A:
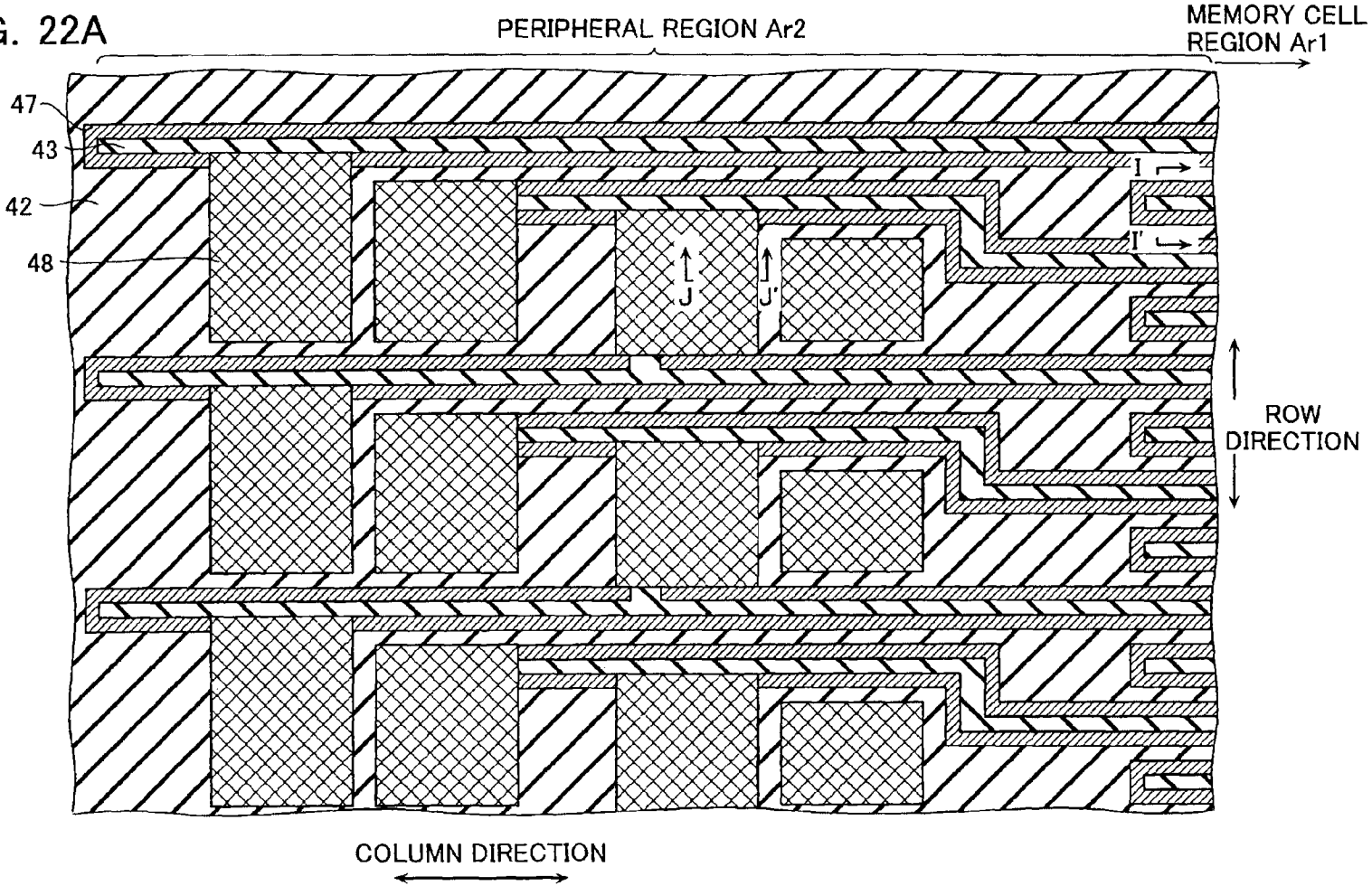
FIG. 22A is a top view illustrating a process for producing the nonvolatile semiconductor memory device of the first embodiment.

As illustrated in FIGS. 22A and 22B, a resist 48 is formed such that the projection 43b and island portion 43c of the sacrifice layer 43 are covered therewith. In other words, the resist 48 is formed such that the linear portion 43a of the sacrifice layer 43 is removed.

Figure 23A:
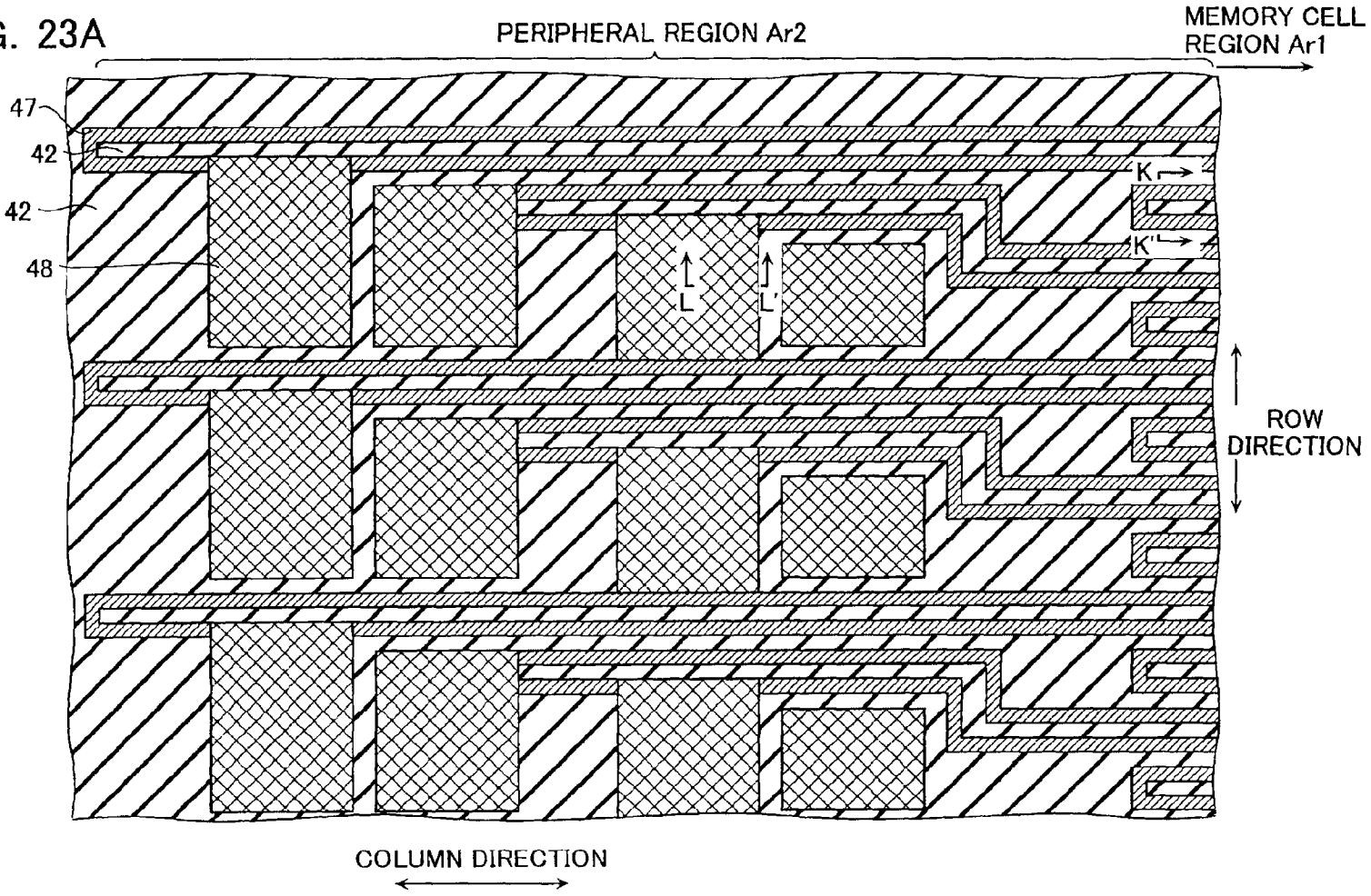
FIG. 23A is a top view illustrating a process for producing the nonvolatile semiconductor memory device of the first embodiment.
Figure 23B:
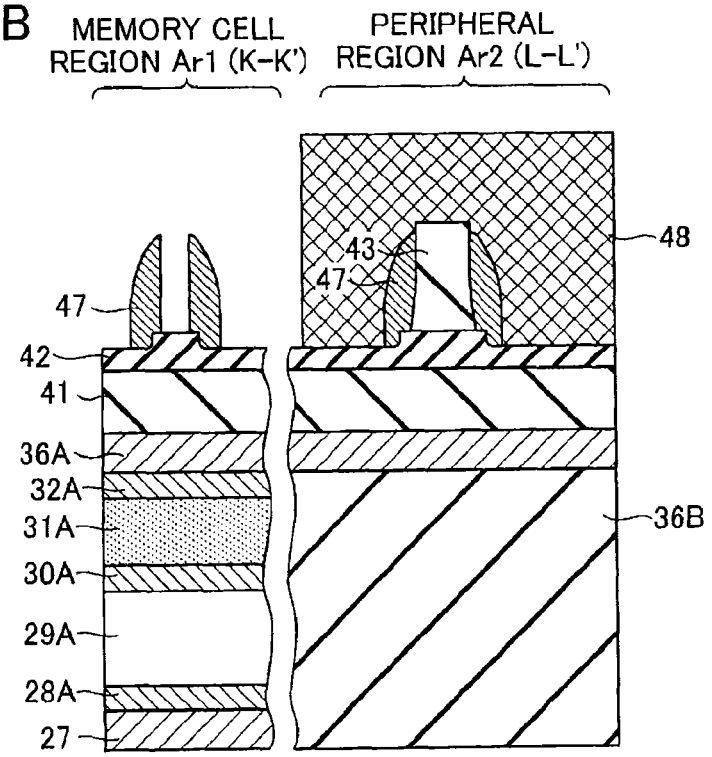
FIG. 23B is a sectional view illustrating a process for producing the nonvolatile semiconductor memory device of the first embodiment.

As illustrated in FIGS. 23A and 23B, the linear portion 43a of the sacrifice layer 43 is etched and removed with the resist 48 as the mask.

Figure 24:
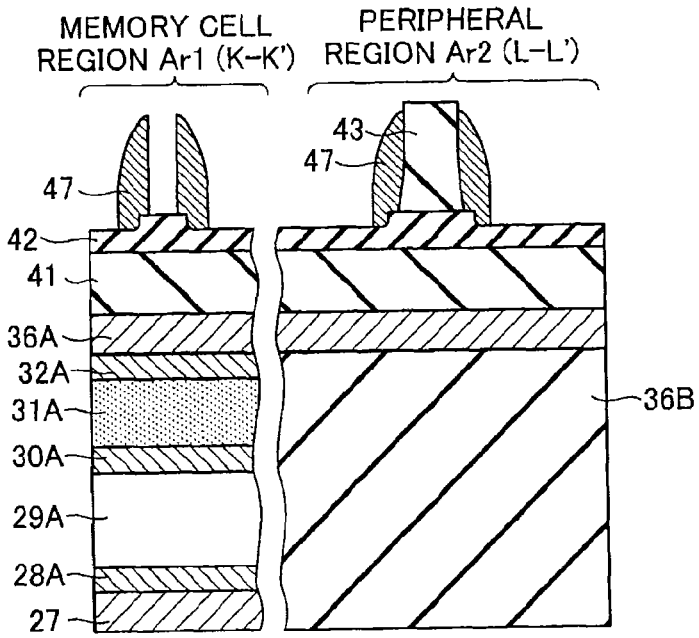
FIG. 24 is a sectional view illustrating a process for producing the nonvolatile semiconductor memory device of the first embodiment.

As illustrated in FIG. 24, the resist 48 is removed.

In summary, the process illustrated in FIGS. 22 to 24 is a process for removing the sacrifice layer 43 (second mask) in the first region.

Figure 25A:
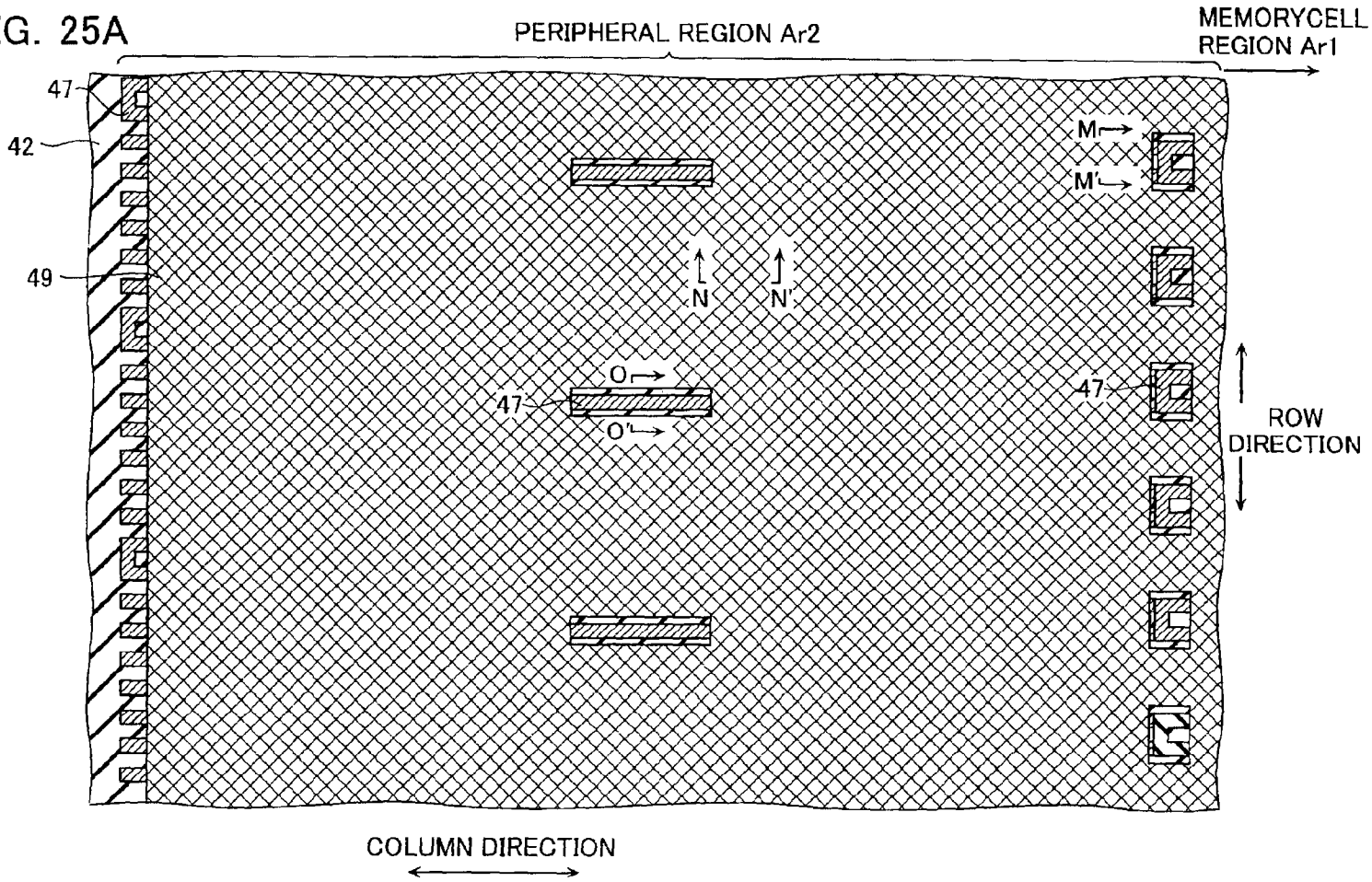
FIG. 25A is a top view illustrating a process for producing the nonvolatile semiconductor memory device of the first embodiment.
Figure 25B:
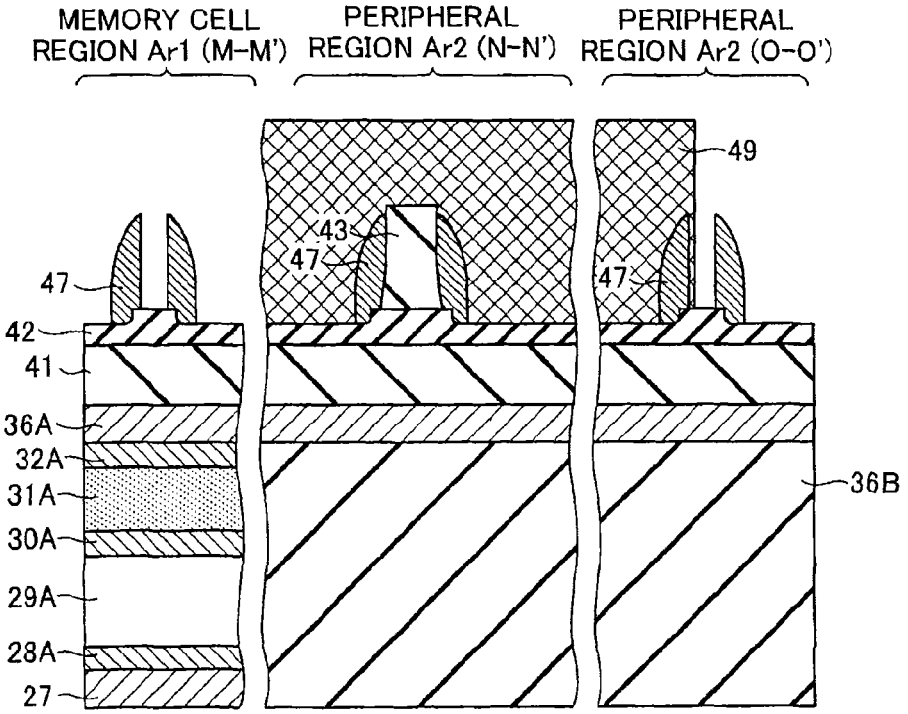
FIG. 25B is a sectional view illustrating a process for producing the nonvolatile semiconductor memory device of the first embodiment.

As illustrated in FIGS. 25A and 25B, in the peripheral region Ar2, a resist 49 is formed near an end portion in the first direction such that the loop spacer layer 47 is partially exposed.

Figure 26:
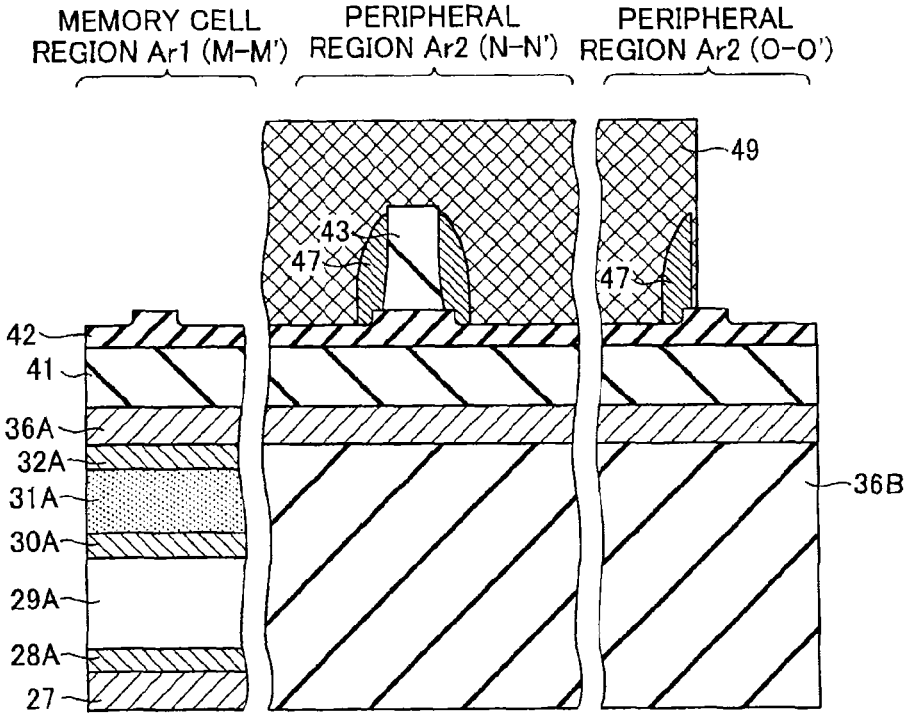
FIG. 26 is a sectional view illustrating a process for producing the nonvolatile semiconductor memory device of the first embodiment.

As illustrated in FIG. 26, the spacer layer 47 is etched with the resist 49 as the mask such that the loop spacer layer 47 is partially cut.

Figure 27A:
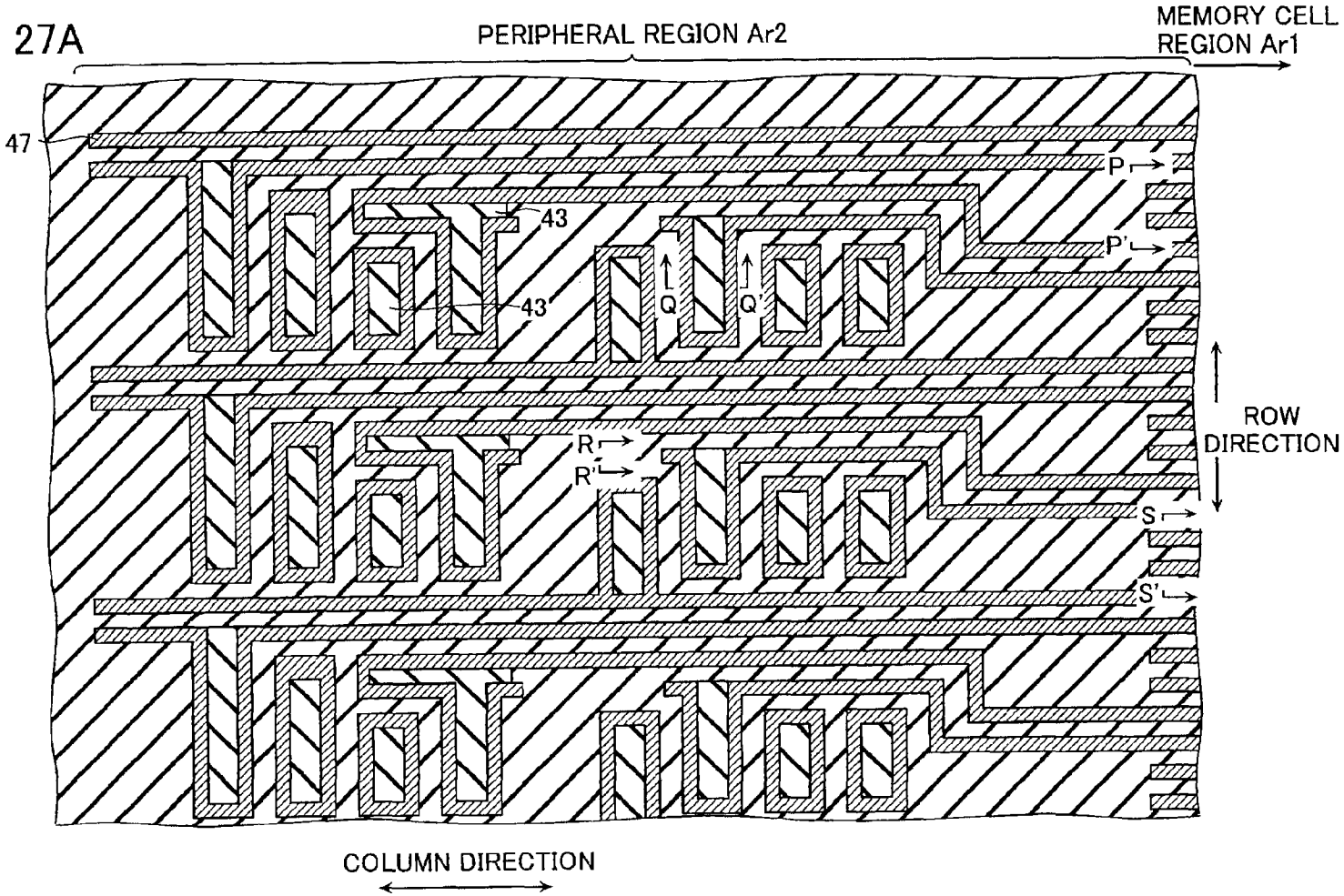
FIG. 27A is a top view illustrating a process for producing the nonvolatile semiconductor memory device of the first embodiment.
Figure 27B:
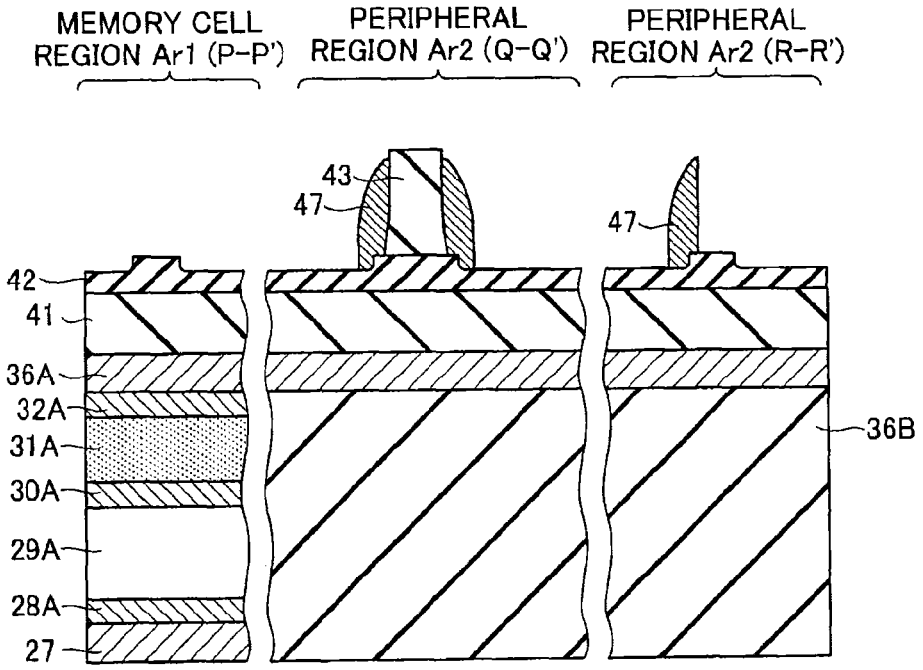
FIG. 27B is a sectional view illustrating a process for producing the nonvolatile semiconductor memory device of the first embodiment.

As illustrated in FIGS. 27A and 27B, the resist 49 is removed.

Figure 28:
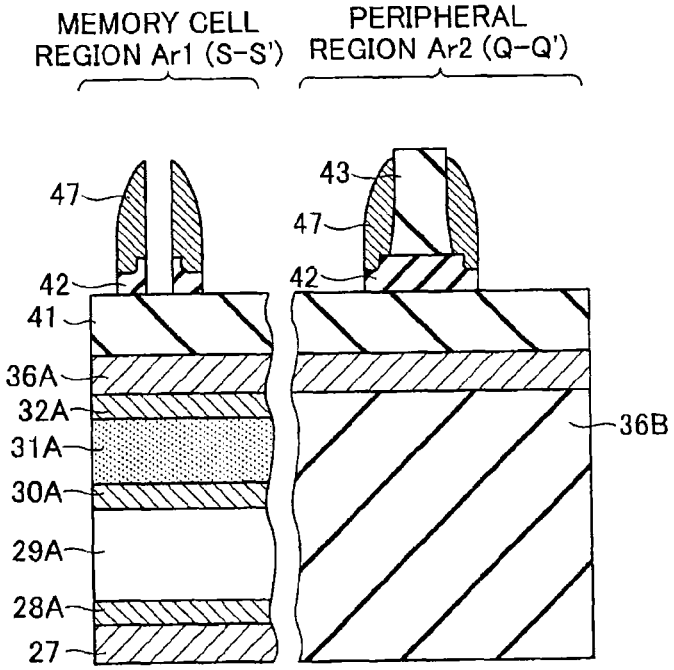
FIG. 28 is a sectional view illustrating a process for producing the nonvolatile semiconductor memory device of the first embodiment.

As illustrated in FIG. 28, the silicon nitride mask layer 42 is etched with the spacer layer 47 and the sacrifice layer 43 as the mask.

Figure 29:
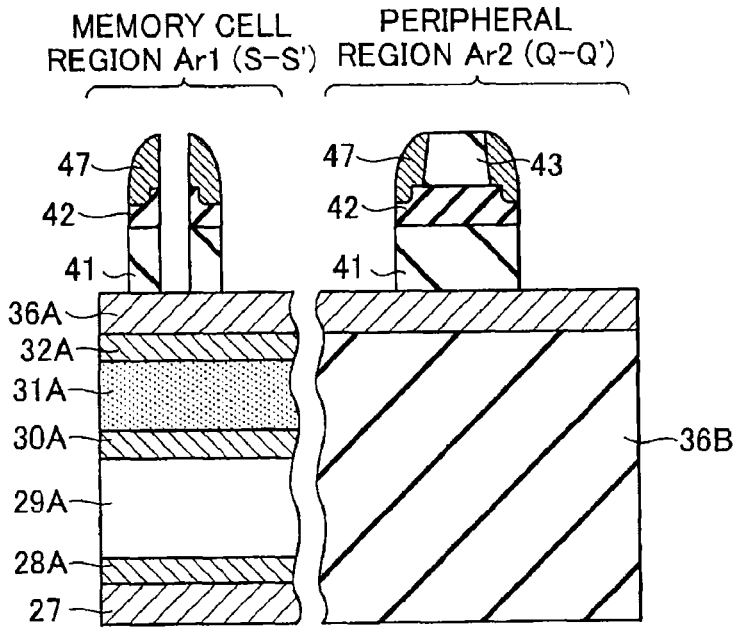
FIG. 29 is a sectional view illustrating a process for producing the nonvolatile semiconductor memory device of the first embodiment.

As illustrated in FIG. 29, the hard mask layer 41 is etched with the spacer layer 47, the sacrifice layer 43, and the silicon nitride mask layer 42 as the mask.

Figure 30:
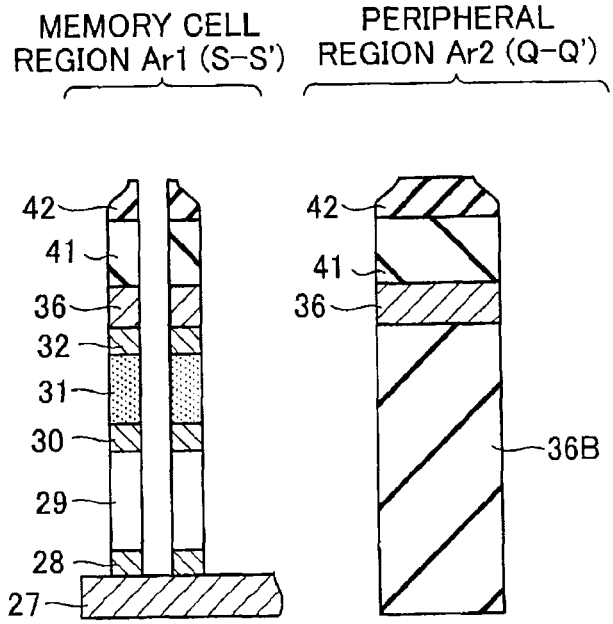
FIG. 30 is a sectional view illustrating a process for producing the nonvolatile semiconductor memory device of the first embodiment.

As illustrated in FIG. 30, the memory layer MC is etched with the silicon nitride mask layer 42 and the hard mask layer 41 as the mask. After the process of FIG. 30, the silicon nitride mask layer 42 and the hard mask layer 41 are removed. The detailed description of the process of FIGS. 11 and 12 is ended. The process of the laminated structure from the first metal 27 to the second electrode 32 of FIGS. 8 to 10 is substantially similar to the process of FIGS. 14A to 30 only except that the process direction is changed by 90°.

In summary, the process illustrated in FIGS. 28 to 30 is a process for etching the hard mask layer 41 (first mask), the amorphous silicon layer 42, and the laminated structure with the spacer layer 47 (third mask) in the first region. The process illustrated in FIGS. 28 to 30 is also a process for etching the silicon nitride mask layer 42 (first mask), the hard mask layer 41 (first mask), and the laminated structure with the spacer layer 47 (third mask) and the sacrifice layer 43 (second mask) in the predetermined second region different from the first region.

Effect of Nonvolatile Semiconductor Memory Device of First Embodiment

An effect of the nonvolatile semiconductor memory device of the first embodiment will be described below. The nonvolatile semiconductor memory device of the first embodiment is formed in the above-described way, so that the first metal 27 and the second metal 36 can be formed without complicating the shapes of the first metal 27 and second metal 36 so as to establish the contact with the contact plug.

The nonvolatile semiconductor memory device of the first embodiment is formed by the etching while the sacrifice layer 43 and the spacer layer 47 formed on the sidewall of the sacrifice layer 43 are used as the mask. Accordingly, the first metal 27 and the second metal 36 can be processed thinner than a lithography limit value with the finer pitch (for example, the width of 40 nm or less). That is, the occupied area can be reduced in the nonvolatile semiconductor memory device of the first embodiment.

Second Embodiment

Figure 31:
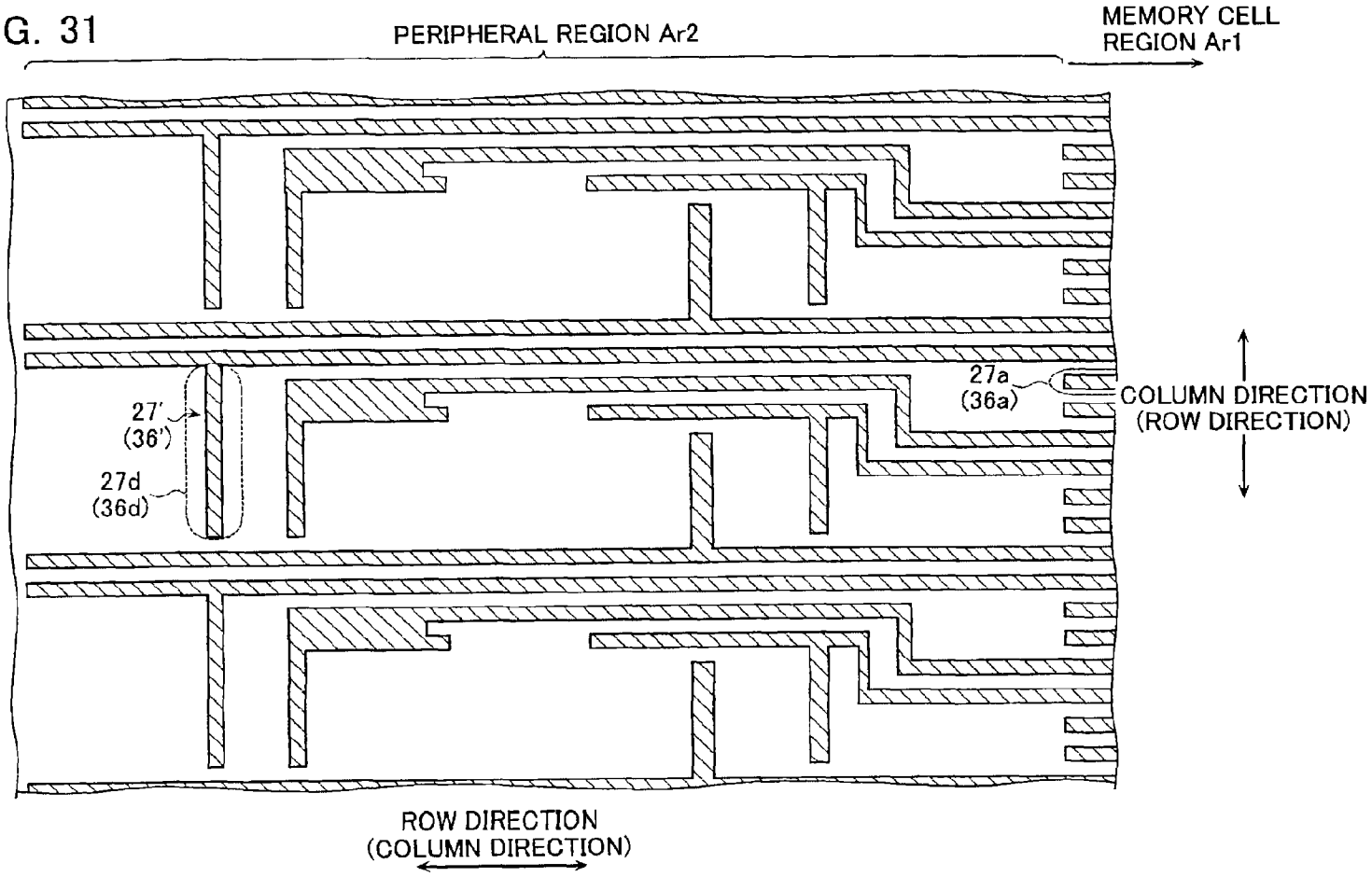
FIG. 31 is a top view illustrating a first metal 27' and a second metal 36' of a nonvolatile semiconductor memory device according to a second embodiment of the present invention.
Figure 32:
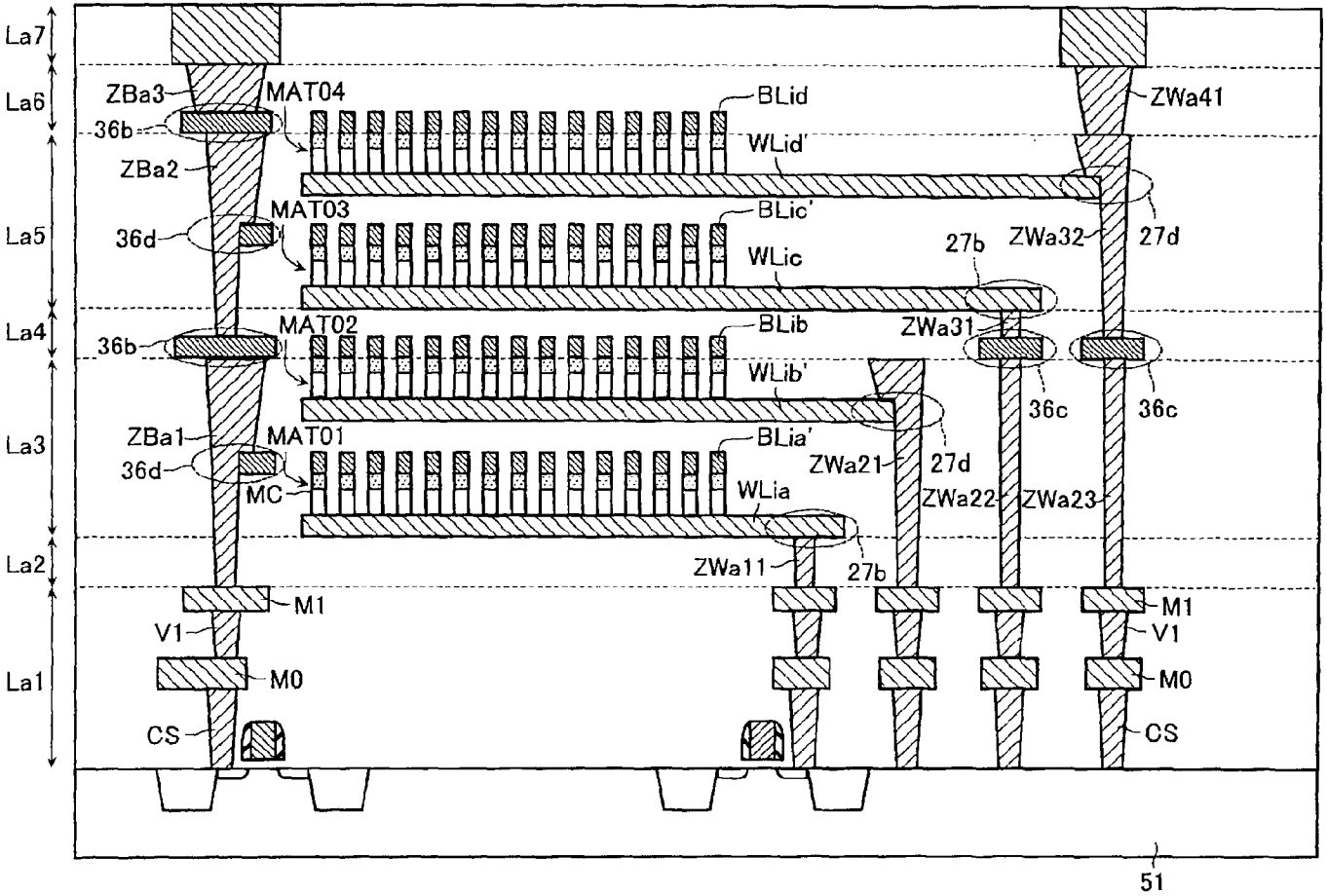
FIG. 32 is a view schematically explaining a contact plug of the nonvolatile semiconductor memory device of the second embodiment.

Specific Configuration of Nonvolatile Semiconductor Memory Device of Second Embodiment A specific configuration of a nonvolatile semiconductor memory device according to a second embodiment of the present invention will be described with reference to FIGS. 31 and 32. FIG. 31 is a top view illustrating a first metal 27' and a second metal 36' of the nonvolatile semiconductor memory device of the second embodiment. FIG. 32 is a view schematically explaining a contact plug of the nonvolatile semiconductor memory device of the second embodiment. In the second embodiment, the same component as the first embodiment is designated by the same numeral, and the description is omitted.

The nonvolatile semiconductor memory device of the second embodiment includes the first metal 27 similar to that of the first embodiment and a first metal 27' having a shape different from that of the first embodiment. The nonvolatile semiconductor memory device of the second embodiment includes the second metal 36 similar to that of the first embodiment and a second metal 36' having a shape different from that of the first embodiment.

The first metal 27' will be described with reference to FIG. 31.

Referring to FIG. 31, in the peripheral region Ar2, the first metal 27' includes a contact connecting portion 27d whose width in the row direction is lower than that of the first embodiment. For example, the width in the row direction of the contact connecting portion 27d is formed so as to be substantially equal to the width in the column direction of the linear portion 27a. The contact connecting portion 27d is formed such that the contact plug contacts the side face of the contact connecting portion 27d.

Similarly, in the peripheral region Ar2, the second metal 36' includes a contact connecting portion 36d whose width in the column direction is lower than that of the first embodiment. For example, the width in the column direction of the contact connecting portion 36d is formed so as to be substantially equal to the width in the row direction of the linear portion 36a. The contact connecting portion 36d is formed such that the contact plug contacts the side face of the contact connecting portion 36d.

A configuration of the contact plug of the second embodiment will be described with reference to FIG. 32. Referring to FIG. 32, the nonvolatile semiconductor memory device of the second embodiment includes a contact plug different from that of the first embodiment. Referring to FIG. 32, the upper layer portion is formed on the silicon substrate 51 while roughly including seven layers (first layer La1 to seventh layer La7). The first layer La1 has the configuration similar to that of the first layer L1 of the first embodiment.

As illustrated in FIG. 32, as with the first embodiment, the word lines WLia and WLic are formed by the first metal 27. On the other hand, word lines WLib' and WLid' are formed by the first metal 27' different from that of the first embodiment. Bit lines BLia' and BLic' are formed by the second metal 36' different from that of the first embodiment. On the other hand, as with the first embodiment, the bit lines BLib and BLid are formed by the second metal 36.

As illustrated in FIG. 32, the nonvolatile semiconductor memory device of the second embodiment includes contact plugs ZWa11, ZWa21 to ZWa23, ZWa31, ZWa32, and ZWa41 that electrically connect the word lines WLia to WLid' to one another in the laminating direction. The nonvolatile semiconductor memory device of the second embodiment includes contact plugs ZBa1 to ZBa3 that electrically connect the bit lines BLia' to BLid to one another in the laminating direction.

The word line WLia, the bit line BLia', and the word line WLib' are formed from the lower layer to the upper layer in the third layer La3. The bit line BLib is formed in the fourth layer La4. The word line WLic, the bit line BLic', and the word line WLid' are formed from the lower layer to the upper layer in the fifth layer La5. The bit line BLid is formed in the sixth layer La6.

According to the expression method similar to that of the first embodiment, a relationship between the contact plug of the second embodiment and the formed layer thereof can be expressed as follows:

<Relationship between Contact Plug and Formed Layer thereof>

ZWa11→La2
ZWa21 to ZWa23→La2 to La3
ZWa31→La4
ZWa32→La4 to La5
ZWa41→La6
ZBa1→La2 to La3
ZBa2→La4 to La5
ZBa3→La6

According to the expression method similar to that of the first embodiment, a connection relationship by the contact plug of the second embodiment can be expressed as follows:

<Connection Relationship by Contact Plug>

WLia(27b)-ZWa11-M1
WLib'(27d)-ZWa21-M1
WLic(27b)-ZWa31-BLib(36c)-ZWa22-M1
ZWa41-ZWa32-WLid'(27d)-ZWa32-BLib(36c)-ZWa23-M1
ZBa3-BLid(36b)-ZBa2-BLic'(36d)-ZBa2-BLib(36b)-ZBa1-BLia'(36d)-ZBa1-M1

In the connection relationship by the contact plug, the contact plugs ZWa21 and ZWa32 (ZBa1 and ZBa2) have the structures in which the contact plugs are extended in the laminating direction while contacting the side portion of the contact connecting portion 27d (36d).

Effect of Nonvolatile Semiconductor Memory Device of Second Embodiment

An effect of the nonvolatile semiconductor memory device of the second embodiment will be described below. As described above, the nonvolatile semiconductor memory device of the second embodiment has the configuration that is substantially similar to that of the first embodiment. Accordingly, the nonvolatile semiconductor memory device of the second embodiment has the effect similar to that of the first embodiment.

Further, unlike the first embodiment, in the nonvolatile semiconductor memory device of the second embodiment, the contact connecting portion 27d (36d) is formed such that the contact plug contacts the side portion thereof. The contact plugs ZWa21 and ZWa32 (ZBa1 and ZBa2) have the structures in which the contact plugs ZWa21 and ZWa32 are extended in the laminating direction while contacting the side portion of the contact connecting portion 27d (36d). Therefore, the nonvolatile semiconductor memory device of the second embodiment is formed by the seven layers that are fewer than the 11 layers of the first embodiment. Accordingly, the nonvolatile semiconductor memory device of the second embodiment can be produced through the process that is simpler than that of the first embodiment.

Third Embodiment

Figure 33:
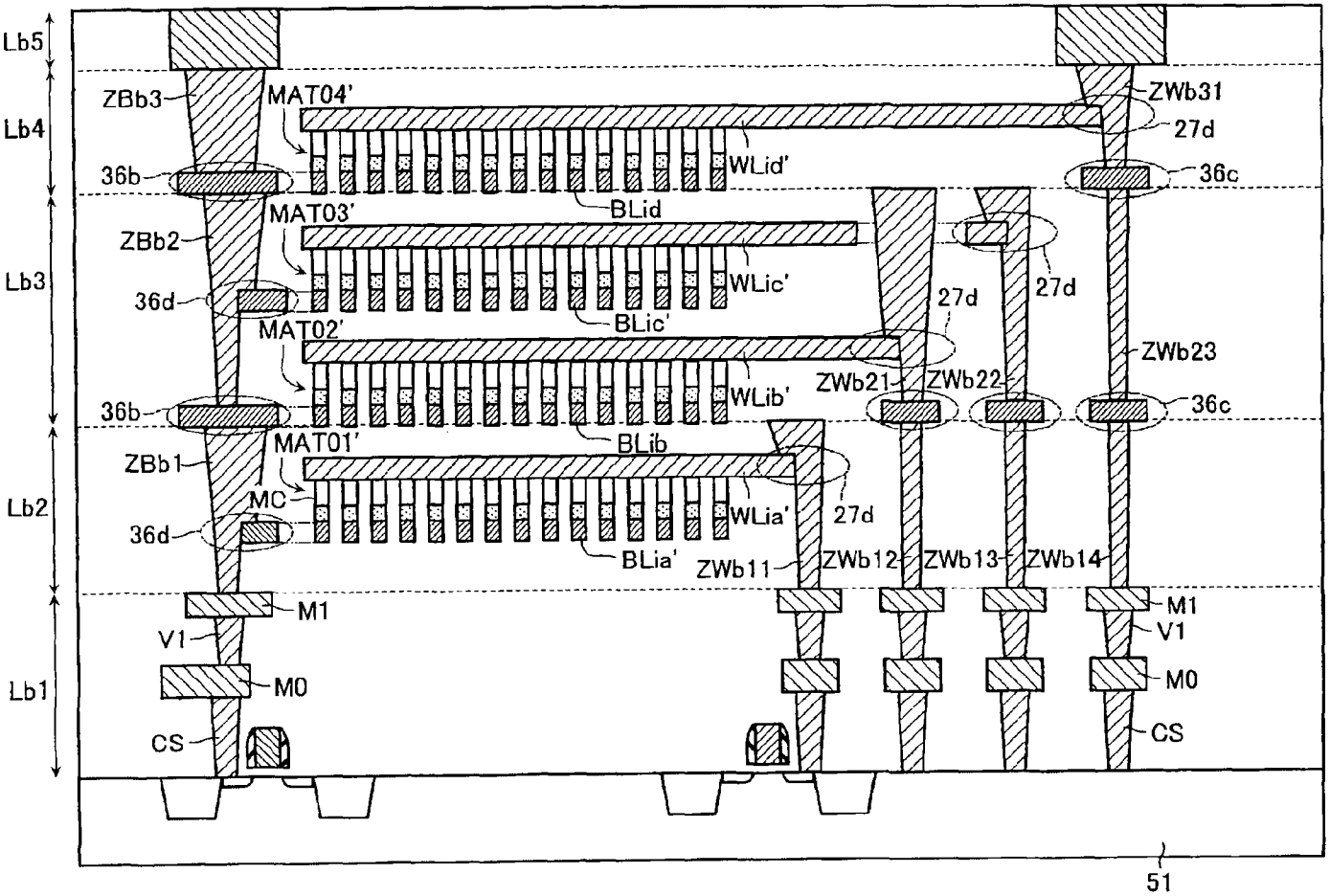
FIG. 33 is a view schematically explaining a contact plug of the nonvolatile semiconductor memory device of a third embodiment of the present invention

Specific Configuration of Nonvolatile Semiconductor Memory Device of Third Embodiment A specific configuration of a nonvolatile semiconductor memory device according to a third embodiment of the present invention will be described with reference to FIG. 33. FIG. 33 is a view schematically explaining a contact plug of the nonvolatile semiconductor memory device of the third embodiment. In the third embodiment, the same component as the first and second embodiments is designated by the same numeral, and the description is omitted.

The nonvolatile semiconductor memory device of the third embodiment is formed with the number of laminated layers different from those of the first and second embodiments. The nonvolatile semiconductor memory device of the third embodiment includes unit cell arrays MAT01' to MAT04' different from those of the first and second embodiments.

Referring to FIG. 33, the upper layer portion is formed on the silicon substrate 51 while roughly including five layers (first layer Lb1 to seventh layer Lb5). The first layer Lb1 has the configuration similar to that of the first layer L1 of the first embodiment.

The unit cell array MAT01' includes a word line WLia' and the bit line BLia'. The word line WLia' and the bit line BLia' are formed in the second layer Lb2. The word line WLia' is located above the bit line BLia'. The word line WLia' is formed by the first metal 27'.

Similarly the unit cell array MAT02' includes a word line WLib' and the bit line BLib. The word line wLib' and the bit line BLib are formed in the third layer Lb3. The word line WLib' is located above the bit line BLib.

The unit cell array MAT03' includes a word line WLic' and the bit line BLic'. The word line WLic' and the bit line BLic' are formed in the third layer Lb3. The word line WLic' is located above the bit line BLic'. The word line WLic' is formed by the first metal 27'.

The unit cell array MAT04' includes a word line WLid' and the bit line BLid. The word line WLid' and the bit line BLid are formed in the fourth layer Lb4. The word line WLid' is located above the bit line BLid.

The nonvolatile semiconductor memory device of the third embodiment includes contact plugs ZWb11 to ZWb14, ZWb21 to ZWb23, and ZWb31 that electrically connect the word lines WLia' to WLid' to one another in the laminating direction. The nonvolatile semiconductor memory device of the third embodiment includes contact plugs ZBb1 to ZBb3 that electrically connect the bit lines BLia' to BLid to one another in the laminating direction.

According to the expression method similar to that of the first embodiment, a relationship between the contact plug of the third embodiment and the formed layer thereof can be expressed as follows:

<Relationship between Contact Plug and Formed Layer thereof>

ZWb11 to ZWb14→Lb2
ZWb21 to ZWb23→Lb3
ZWb31=Lb4
ZBb1→Lb2
ZBb2→Lb3
ZBb3→Lb4

According to the expression method similar to that of the first embodiment, a connection relationship by the contact plug of the third embodiment can be expressed as follows:

<Connection Relationship by Contact Plug>

WLia'(27d)-ZWb11-M1

WLib'(27d)-ZWb21-BLib(36c)-ZWb12-M1

WLic'(27d)-ZWb22-BLib(36c)-ZWb13-M1

WLid'(27d)-ZWb31-BLid(36c)-ZWb23-BLib(36c)-ZWb14-M1

ZBb3-BLid(36b)-ZBb2-BLic'(36d)-ZBb2-BLib(36b)-ZBb1-BLia'(36d)-ZBb1-M1

In the connection relationship by the contact plug, the contact plugs ZWb11, ZWb21, ZWb22, and ZWb31 (ZBb1 and ZBb2) have the structures in which the contact plugs are extended in the laminating direction while contacting the side portion of the contact connecting portion 27d (36d).

Effect of Nonvolatile Semiconductor Memory Device of Third Embodiment

An effect of the nonvolatile semiconductor memory device of the third embodiment will be described below. As described above, the nonvolatile semiconductor memory device of the third embodiment has the configuration that is substantially similar to that of the first embodiment. Accordingly, the nonvolatile semiconductor memory device of the third embodiment has the effect similar to that of the first embodiment.

Further, the nonvolatile semiconductor memory device of the third embodiment is formed by the five layers that are fewer than the seven layers of the second embodiment. Accordingly, the nonvolatile semiconductor memory device of the third embodiment can be produced through the process that is simpler than that of the second embodiment.

Fourth Embodiment

Figure 34:
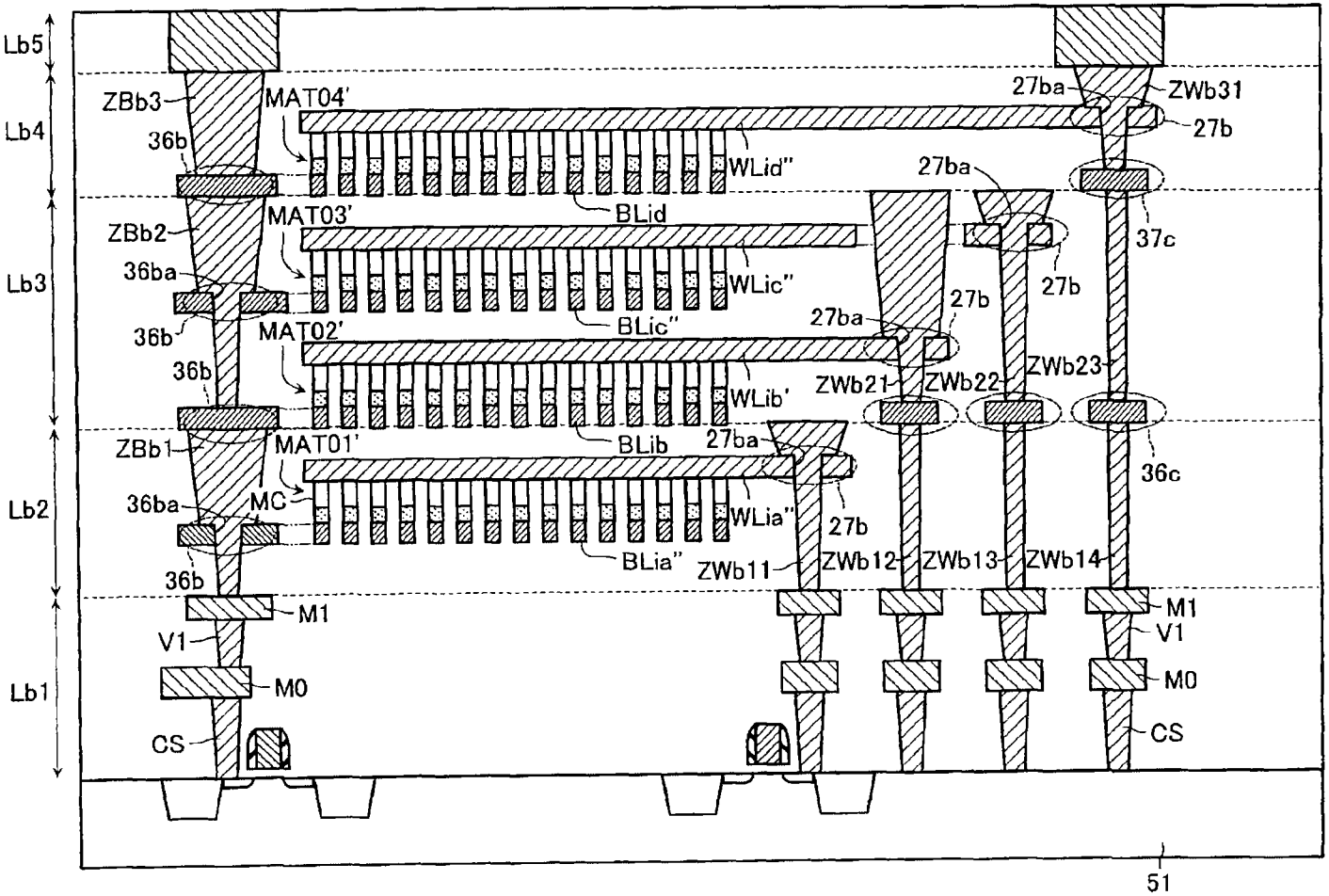
FIG. 34 is a view schematically explaining a contact plug of the nonvolatile semiconductor memory device of a fourth embodiment of the present invention.

Specific Configuration of Nonvolatile Semiconductor Memory Device of Fourth Embodiment A specific configuration of a nonvolatile semiconductor memory device according to a fourth embodiment of the present invention will be described with reference to FIG. 34. FIG. 34 is a view schematically explaining a contact plug of the nonvolatile semiconductor memory device of the fourth embodiment. In the fourth embodiment, the same component as the first to third embodiments is designated by the same numeral, and the description is omitted.

As with the third embodiment, the nonvolatile semiconductor memory device of the fourth embodiment includes the unit cell arrays MAT01' to MAT04'.

Referring to FIG. 34, the unit cell array MAT01' includes a word line WLia" and a bit line BLia", which are different from those of the first to third embodiments. The unit cell array MAT02' includes the bit line BLib and a word line WLib" that is different from those of the first to third embodiments. The unit cell array MAT03' includes a word line WLic" and a bit line BLic", which are different from those of the first to third embodiments. The unit cell array MAT04' includes the bit line BLid and a word line WLid" that is different from those of the first to third embodiments.

The word lines WLia" to WLid" have a shape in which a through-hole 27ba is made in the contact connecting portion 27b. The bit lines BLia" and BLic" have a shape in which a through-hole 36ba is made in the contact connecting portion 36b.

Unlike the third embodiment, the contact plug ZWb11 is formed such that the through-hole 27ba of the word line WLia" is pierced therethrough. The contact plug ZWb21 is formed such that the through-hole 27ba of the word line WLib" is pierced therethrough. The contact plug ZWb22 is formed such that the through-hole 27ba of the word line WLic" is pierced therethrough. The contact plug ZWb31 is formed such that the through-hole 27ba of the word line WLid" is pierced therethrough.

Unlike the third embodiment, the contact plug ZBb1 is formed such that the through-hole 36ba of the bit line BLia" is pierced therethrough. The contact plug ZBb2 is formed such that the through-hole 36ba of the bit line BLic" is pierced therethrough.

Effect of Nonvolatile Semiconductor Memory Device of Forth Embodiment

An effect of the nonvolatile semiconductor memory device of the fourth embodiment will be described below. As described above, the nonvolatile semiconductor memory device of the fourth embodiment has the configuration that is substantially similar to that of the third embodiment. Accordingly, the nonvolatile semiconductor memory device of the fourth embodiment has the effect similar to that of the third embodiment.

Fifth Embodiment

Figure 35:
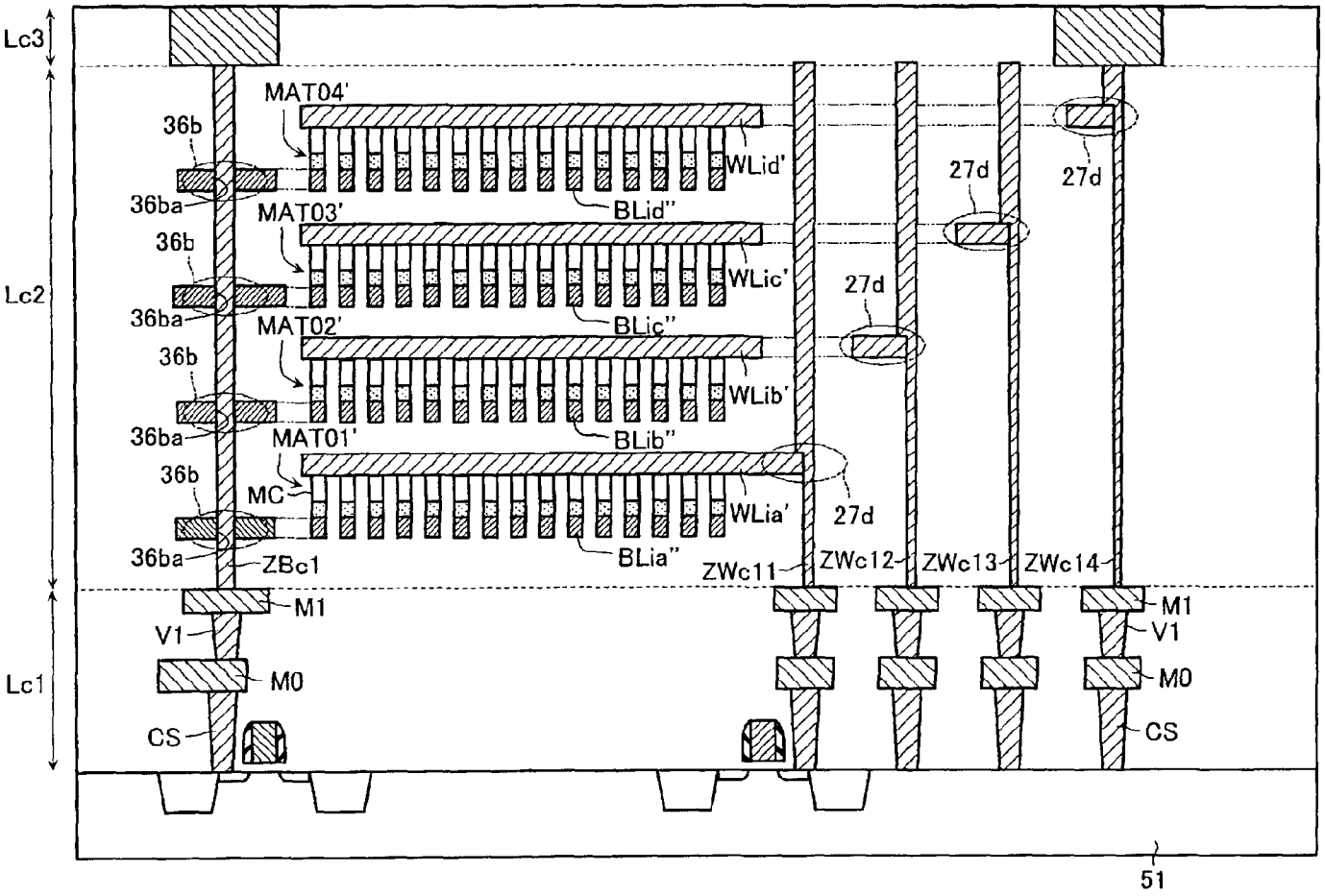
FIG. 35 is a view schematically explaining a contact plug of the nonvolatile semiconductor memory device of a fifth embodiment of the present invention.

Specific Configuration of Nonvolatile Semiconductor Memory Device of Fifth Embodiment A specific configuration of a nonvolatile semiconductor memory device according to a fifth embodiment of the present invention will be described with reference to FIG. 35. FIG. 35 is a view schematically explaining a contact plug of the nonvolatile semiconductor memory device of the fifth embodiment. In the fifth embodiment, the same component as the first to fourth embodiments is designated by the same numeral, and the description is omitted.

Referring to FIG. 35, the upper layer portion is formed on the silicon substrate 51 while roughly including three layers (first layer Lc1 to third layer Lc3). The first layer Lc1 has the configuration similar to that of the first layer L1 of the first embodiment.

As with the third embodiment, the nonvolatile semiconductor memory device of the fifth embodiment includes the unit cell arrays MAT01' to MAT04'.

As illustrated in FIG. 35, the unit cell array MAT01' includes the word line WLia' and the bit line BLia". The unit cell array MAT02' includes the word line WLib' and the bit line BLib". The unit cell array MAT03' includes the word line WLic' and the bit line BLic". The unit cell array MAT04' includes the word line WLid' and the bit line BLid". The bit lines BLib" and BLid" have a shape in which the through-hole 36ba is made in the contact connecting portion 36b. A diameter of the through-hole 36ba is formed so as to be decreased from the bit lines BLid" to BLia" (from the upper layer to the lower layer).

The bit line BLia", the word line WLia', the bit line BLib", the word line WLib', the bit line BLic", the word line WLic', the bit line BLid", and the word line WLid' are formed in the second layer Lc2 from the lower layer to the upper layer.

The nonvolatile semiconductor memory device of the fifth embodiment includes contact plugs ZWc11 to ZWc14 that electrically connect the word lines WLia' to WLid' to one another in the laminating direction. The nonvolatile semiconductor memory device of the fifth embodiment includes a contact plug ZBc1 that electrically connects the bit lines BLia" to BLid" to one another in the laminating direction.

According to the expression method similar to that of the first embodiment, a relationship between the contact plug of the fifth embodiment and the formed layer thereof can be expressed as follows:

<Relationship between Contact Plug and Formed Layer thereof>

ZWc11 to ZWc14→Lc2

ZBc1→Lc2

According to the expression method similar to that of the first embodiment, a connection relationship by the contact plug of the fifth embodiment can be expressed as follows:

<Connection Relationship by Contact Plug>

WLia'(27d)-ZWc11-M1

WLib'(27d)-ZWc12-M1

WLic'(27d)-ZWc13-M1

WLid'(27d)-ZWc14-M1

ZBc1-BLid"(36ba)-ZBc1-BLic"(36ba)-ZBc1-BLib" (36ba)-ZBc1-BLia' (36ba)-ZBc1-M1

In the connection relationship by the contact plug, the contact plugs ZWc11, ZWc12, ZWc13, and ZWc14 have the structures in which the contact plugs are extended in the laminating direction while contacting the side portion of the contact connecting portion 27d. The contact plug ZBc1 is formed such that the through-hole 36ba of the bit lines BLia" to BLid" is pierced therethrough. That is, the diameter of the contact plug ZBc1 is formed so as to be decreased in a stepwise manner from the bit lines BLid" to BLia" (from the upper layer to the lower layer).

Effect of Nonvolatile Semiconductor Memory Device of Fifth Embodiment

An effect of the nonvolatile semiconductor memory device of the fifth embodiment will be described below. As described above, the nonvolatile semiconductor memory device of the fifth embodiment has the configuration that is substantially similar to that of the fourth embodiment. Accordingly, the nonvolatile semiconductor memory device of the fifth embodiment has the effect similar to that of the fourth embodiment.

Further, the nonvolatile semiconductor memory device of the fifth embodiment is formed by the three layers that are fewer than the five layers of the fourth embodiment. Accordingly, the nonvolatile semiconductor memory device of the fifth embodiment can be produced through the process that is simpler than that of the fourth embodiment.

Sixth Embodiment

Schematic Configuration of Nonvolatile Semiconductor Memory Device of Sixth Embodiment A nonvolatile semiconductor memory device according to a sixth embodiment of the present invention will be described with reference to FIGS. 36 and 37. In the sixth embodiment, the same component as the first to fifth embodiments is designated by the same numeral, and the description is omitted.

Figure 36:
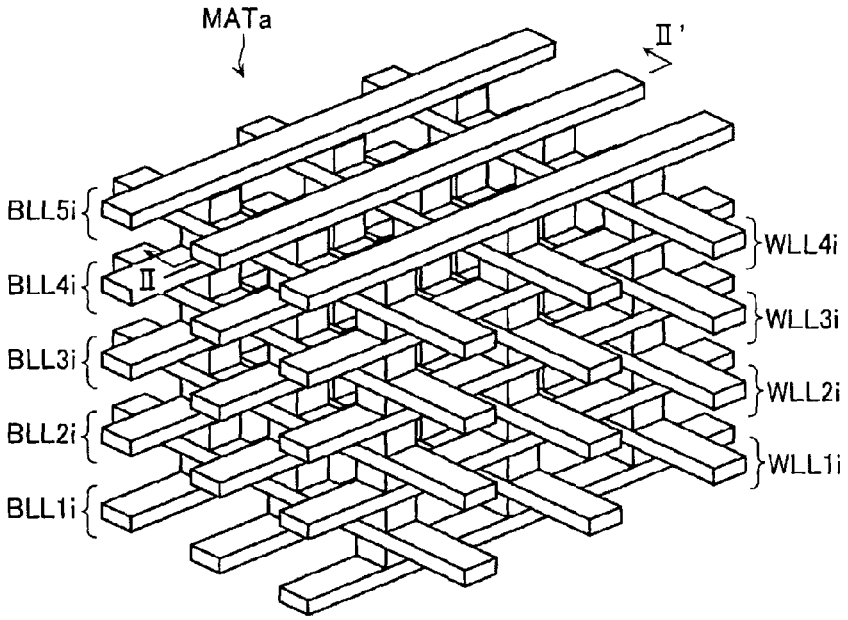
FIG. 36 is a perspective view illustrating a unit cell array MATa1 according to a sixth embodiment of the present invention.

The nonvolatile semiconductor memory device of the sixth embodiment has a configuration of FIG. 36. FIG. 36 is a perspective view illustrating a unit cell array MATa of the sixth embodiment. Referring to FIG. 36, the nonvolatile semiconductor memory device of the sixth embodiment includes a unit cell array MATa that is different from those of the first to fifth embodiments.

As illustrated in FIG. 36, the unit cell array MATa includes plural bit lines BLL1i, plural word lines WLL1i, plural bit lines BLL2i, plural word lines WLL2i, plural bit lines BLL3i, plural word lines WLL3i, plural bit lines BLL4i, plural word lines WLL4i, plural bit lines BLL5i from the lower layer to the upper layer.

Figure 37:
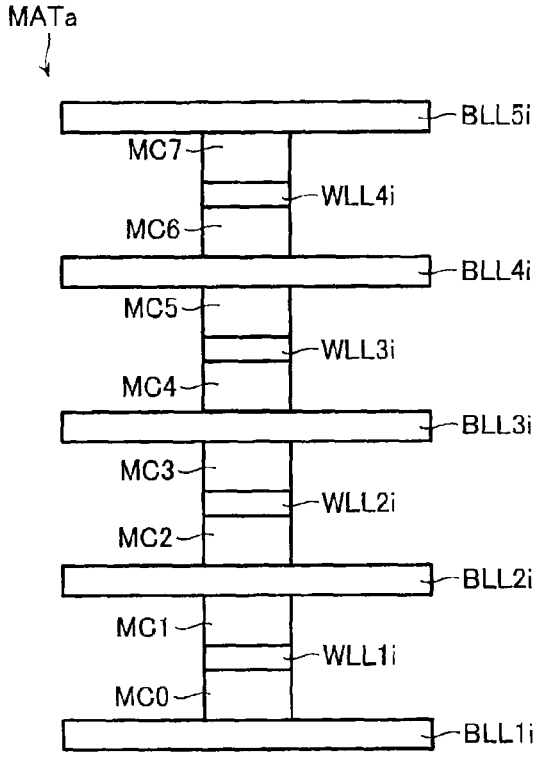
FIG. 37 is a sectional view taken on a line II-II' of FIG. 36.

FIG. 37 is a sectional view taken on a line II-II'of FIG. 36. The word line WLL1i is shared by the memory cells MC0 and MC1 that are located on and beneath the word line WLL1i, the bit line BLL1i is shared by the memory cells MC1 and MC2 that are located on and beneath the bit line BLL1i, and the word line WLL2i is shared by the memory cells MC2 and MC3 that are located on and beneath the word line WLL2i. The word lines WLL3i and WLL4i and the bit lines BLL2i to BLL4i are also shared by the memory cells that are located on and beneath the word lines and the bit lines.

The word lines WLL1i and WLL3i are formed by the first metal 27. The word lines WLL2i and WLL4i are formed by the first metal 27'. The bit lines BLL1i to BLL4i are formed by the second metal 36'. The bit line BLL5i is formed by the second metal 36.

Figure 38:
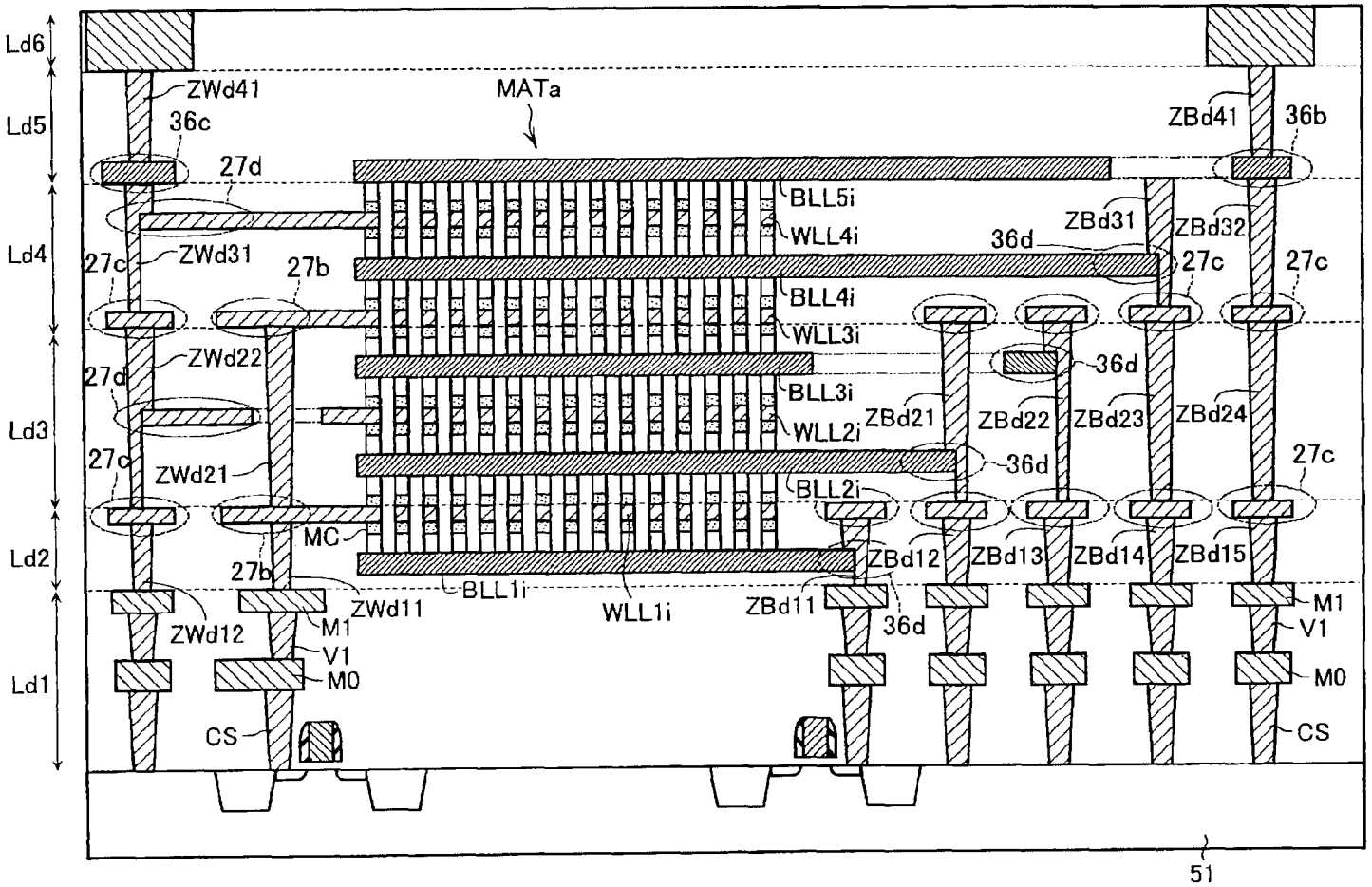
FIG. 38 is a view schematically explaining a contact plug of the nonvolatile semiconductor memory device of the sixth embodiment.

Specific Configuration of Nonvolatile Semiconductor Memory Device of Sixth Embodiment A specific configuration of the nonvolatile semiconductor memory device of the sixth embodiment will be described with reference to FIG. 38. FIG. 38 is a view schematically explaining a contact plug of the nonvolatile semiconductor memory device of the sixth embodiment.

Referring to FIG. 38, the upper layer portion is formed on the silicon substrate 51 while roughly including six layers (first layer Ld1 to sixth layer Ld6). The first layer Ld1 has the configuration similar to that of the first layer L1 of the first embodiment.

The unit cell array MATa is formed in the second layer Ld2 to fourth layer Ld4.

As illustrated in FIG. 38, the nonvolatile semiconductor memory device of the sixth embodiment includes contact plugs ZWd11, ZWd12, ZWd21, ZWd22, ZWd31, and ZWd41 that electrically connect the word lines WLL1i to WLL4i to one another in the laminating direction. The nonvolatile semiconductor memory device of the sixth embodiment includes contact plugs ZBd11 to ZBd15, ZBd21 to ZBd24, ZBd31, ZBd32, and ZBd41 that electrically connect the bit lines BLL1i to BLL5i to one another in the laminating direction.

According to the expression method similar to that of the first embodiment, a relationship between the contact plug of the sixth embodiment and the formed layer thereof can be expressed as follows:

<Relationship between Contact Plug and Formed Layer thereof>

ZWd11 and ZWd12→Ld2

ZWd21 and ZWd22→Ld3

ZWd31→Ld4

ZWd41→Ld5

ZBd11 to ZBd15→Ld2

ZBd21 to ZBd24→Ld3

ZBd31 to ZBd32→Ld4

ZBd41→Ld5

According to the expression method similar to that of the first embodiment, a connection relationship by the contact plug of the sixth embodiment can be expressed as follows:

<Connection Relationship by Contact Plug>

WLL3i(27b)-ZWd21-WLL1i(27b)-ZWd11-M1

ZWd41-BLL5i(36c)-ZWd31-WLL4i(27d)-ZWd31-WLL3i(27c)-ZWd22-WLL2i(27d)-ZWd22-WLL1i(27c)-ZWd12-M1

WLL1i(27c)-ZBd11-BLL1i(36d)-ZBd11-M1

WLL3i(27c)-ZBd21-BLL2i(36d)-ZBd21-WLL1i(27c)-ZBd12-M1

WLL3i(27c)-ZBd22-BLL3i(36d)-ZBd22-WLL1i(27c)-ZBd13-M1

BLL4i(36d)-ZBd31-WLL3i(27c)-ZBd23-WLL1i(27c)-ZBd14-M1

ZBd41-BLL5i(36b)-ZBd32-WLL3i(27c)-ZBd24-WLL1i(27c)-ZBd15-M1

In the connection relationship by the contact plug, the contact plugs ZWd22 and ZWd31 have the structures in which the contact plugs are extended in the laminating direction while contacting the side portion of the contact connecting portion 27d. The contact plugs ZBd11, ZBd21, ZBd22, and ZBd31 have the structures in which the contact plugs are extended in the laminating direction while contacting the side portion of the contact connecting portion 36d.

Effect of Nonvolatile Semiconductor Memory Device of Sixth Embodiment

An effect of the nonvolatile semiconductor memory device of the sixth embodiment will be described below. As described above, the nonvolatile semiconductor memory device of the sixth embodiment includes the word lines WLL1i to WLL4i and the bit lines BLL1i to BLL5i, which have the configuration substantially similar to that of the first and second embodiments. Accordingly, the nonvolatile semiconductor memory device of the sixth embodiment has the effect similar to that of the first embodiment.

Seventh Embodiment

Figure 39:
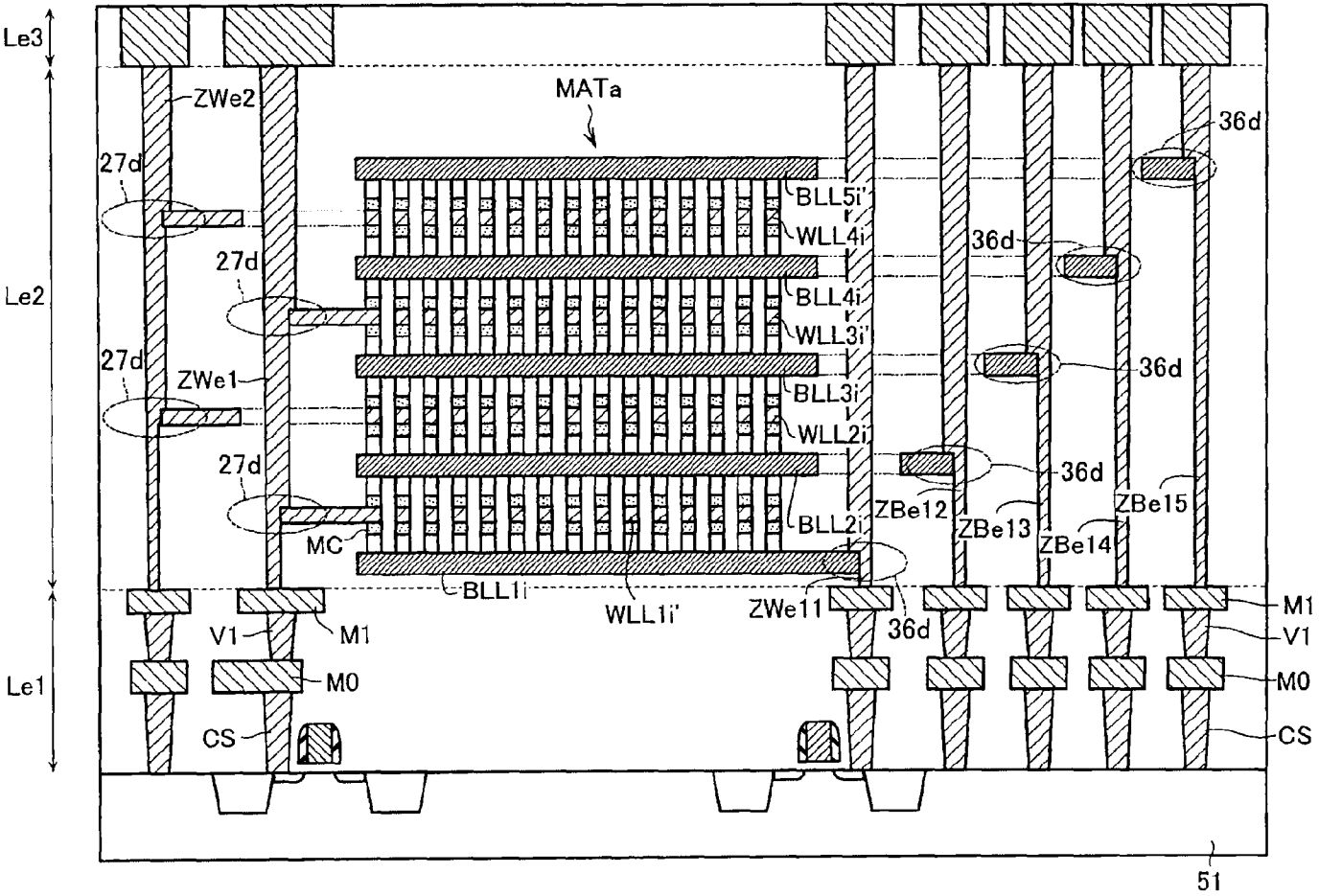
FIG. 39 is a view schematically explaining a contact plug of the nonvolatile semiconductor memory device of a seventh embodiment of the present invention.

Specific Configuration of Nonvolatile Semiconductor Memory Device of Seventh Embodiment A specific configuration of a nonvolatile semiconductor memory device according to a seventh embodiment of the present invention will be described with reference to FIG. 39. FIG. 39 is a view schematically explaining a contact plug of the nonvolatile semiconductor memory device of the seventh embodiment. In the seventh embodiment, the same component as the first to sixth embodiments is designated by the same numeral, and the description is omitted.

As with the sixth embodiment, the nonvolatile semiconductor memory device of the seventh embodiment includes the unit cell array MATa. The nonvolatile semiconductor memory device of the seventh embodiment includes word lines WLL1i' and WLL3i' and a bit line BLL5i', which are different from those of the sixth embodiment.

The word lines WLL1i' and WLL3i' are formed by the first metal 27'. The word lines WLL1i' and WLL3i' have the same shape. The word lines WLL2i and WLL4i have the same shape. The bit line BLL5i' is formed by the second metal 36'.

Referring to FIG. 39, the upper layer portion is formed on the silicon substrate 51 while roughly including three layers (first layer Le1 to third layer Le3). The first layer Le1 has the configuration similar to that of the first layer L1 of the first embodiment.

The unit cell array MATa is formed in the second layer Le2.

As illustrated in FIG. 39, the nonvolatile semiconductor memory device of the seventh embodiment includes contact plugs ZWe1 and ZWe2 that electrically connect the word lines WLL1i' to WLL4i to one another in the laminating direction. The nonvolatile semiconductor memory device of the seventh embodiment includes contact plugs ZBe1 to ZBe5 that electrically connect the bit lines BLL1i to BLL5i' to one another in the laminating direction.

According to the expression method similar to that of the first embodiment, a relationship between the contact plug of the seventh embodiment and the formed layer thereof can be expressed as follows:

<Relationship between Contact Plug and Formed Layer thereof>

ZWe1 and ZWe2→Le2

ZBe1 to ZBe5→Le2

According to the expression method similar to that of the first embodiment, a connection relationship by the contact plug of the seventh embodiment can be expressed as follows:

<Connection Relationship by Contact Plug>

WLL3 i'(27d)-ZWe1-WLL1i'(27d)-ZWe1-M1

WLL4i(27d)-ZWe2-WLL4i(27d)-ZWe2-M1

BLL1i(36d)-ZBe1-M1

BLL2i(36d)-ZBe2-M1

BLL3i(36d)-ZBe3-M1

BLL4i(36d)-ZBe4-M1

BLL5i'(36d)-ZBe5-M1

In the connection relationship by the contact plug, the contact plugs ZWe1 and ZWe2 have the structures in which the contact plugs are extended in the laminating direction while contacting the side portion of the contact connecting portion 27d. The contact plugs ZBe1 to ZBe5 have the structures in which the contact plugs are extended in the laminating direction while contacting the side portion of the contact connecting portion 36d.

In other words, the word lines WLL1i' and WLL3i' are configured as follows. In the seventh embodiment, the word line WLL1i' constitutes the cell array (first cell array) that is provided at a predetermined lamination position. The word line WLL3i' constitutes the cell array (second cell array) that is provided on the first cell array. The word line WLL1i' included in the first cell array has the same shape as the word line WLL3i' included in the second cell array. In the seventh embodiment, the word line WLL2i constitutes the cell array (first cell array) that is provided at a predetermined lamination position. The word line WLL4i constitutes the cell array (second cell array) that is provided on the first cell array. The word line WLL2i included in the first cell array has the same shape as the word line WLL4i included in the second cell array.

Effect of Nonvolatile Semiconductor Memory Device of Seventh Embodiment

An effect of the nonvolatile semiconductor memory device of the seventh embodiment will be described below. As described above, the nonvolatile semiconductor memory device of the seventh embodiment includes the unit cell array MATa having the configuration substantially similar to that of the sixth embodiment. Accordingly, the nonvolatile semiconductor memory device of the seventh embodiment has the effect similar to that of the sixth embodiment.

Further, the nonvolatile semiconductor memory device of the seventh embodiment is formed by the three layers that are fewer than the six layers of the sixth embodiment. Accordingly, the nonvolatile semiconductor memory device of the seventh embodiment can be produced through the process that is simpler than that of the sixth embodiment.

Eighth Embodiment

Figure 40:
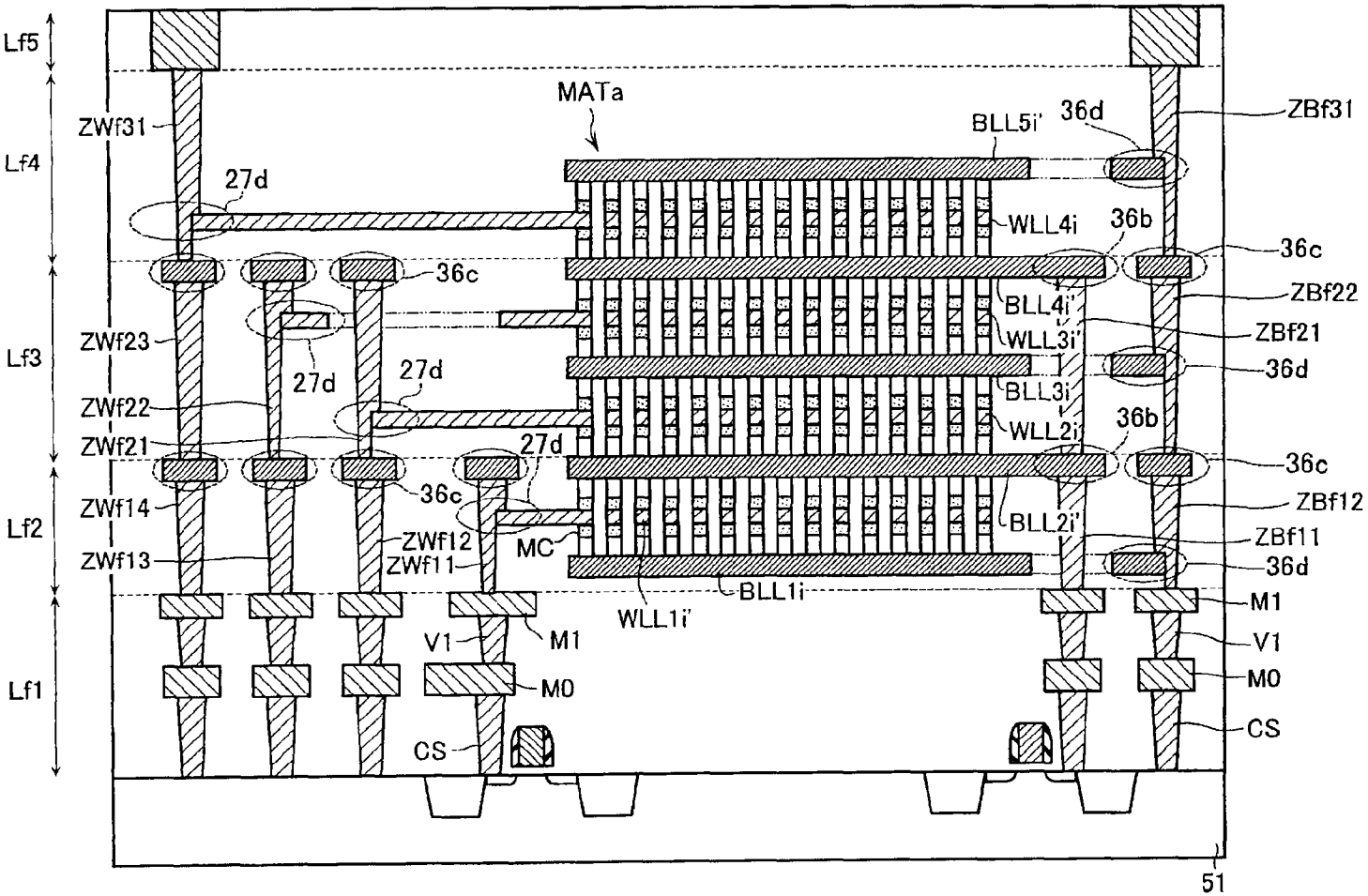
FIG. 40 is a view schematically explaining a contact plug of the nonvolatile semiconductor memory device of an eighth embodiment of the present invention.

Specific Configuration of Nonvolatile Semiconductor Memory Device of Eighth Embodiment A specific configuration of a nonvolatile semiconductor memory device according to an eighth embodiment of the present invention will be described with reference to FIG. 40. FIG. 40 is a view schematically explaining a contact plug of the nonvolatile semiconductor memory device of the eighth embodiment. In the eighth embodiment, the same component as the first and second embodiments is designated by the same numeral, and the description is omitted.

The nonvolatile semiconductor memory device of the eighth embodiment includes the unit cell array MATa that is similar to that of the sixth embodiment. The nonvolatile semiconductor memory device of the eighth embodiment includes bit lines BLL2i' and BLL4i', which are different from that of the seventh embodiment.

The bit lines BLL2i' and BLL4i are formed by the second metal 36.

Referring to FIG. 40, the upper layer portion is formed on the silicon substrate 51 while roughly including five layers (first layer Lf1 to sixth layer Lf5). The first layer Lf1 has the configuration similar to that of the first layer L1 of the first embodiment.

The unit cell array MATa is formed in the second to fourth layers Lf2 to Lf4.

As illustrated in FIG. 40, the nonvolatile semiconductor memory device of the eighth embodiment includes contact plugs ZWf11 to ZWf31 that electrically connect the word lines WLL1i' to WLL4i to one another in the laminating direction. The nonvolatile semiconductor memory device of the eighth embodiment includes contact plugs ZBf11 to ZBf31 that electrically connect the bit lines BLL1i to BLL5i' to one another in the laminating direction.

According to the expression method similar to that of the first embodiment, a relationship between the contact plug of the eighth embodiment and the formed layer thereof can be expressed as follows:

<Relationship between Contact Plug and Formed Layer Thereof>

ZWf11 to ZWf14→Lf2
ZBf11 and ZBf12→Lf2
ZWf21 to ZWf23→Lf3
ZBf21 and ZBf22→Lf3
ZWf31→Lf4
ZBf31→Lf4

According to the expression method similar to that of the first embodiment, a connection relationship by the contact plug of the eighth embodiment can be expressed as follows:

<Connection Relationship by Contact Plug>

BLL2i'(36c)-ZWf11-WLL1i'(27d)-ZWf11-M1
BLL4i'(36c)-ZWf21-WLL2i(27d)-ZWf21-BLL2i'(36c)-ZWf12-M1
BLL4i'(36c)-ZWf22-WLL3i'(27d)-ZWf22-BLL2i'(36c)-ZWf13-M1
ZWf31-WLL4i(27d)-ZWf31-BLL4i'(36c)-ZWf23-BLL2i'(36c)-ZWf14-M1
BLL4i'(36b)-ZBf21-BLL2i'(36b)-ZBf1-M1
ZBf31-BLL5i'(36d)-ZBf31-BLL4i'(36c)-ZBf22-BLL3i(36d)-ZBf22-BLL2i'(36c)-ZBf12-BLL1i(36d)-ZBf12-M1

In the connection relationship by the contact plug, the contact plugs ZWf11, ZWf21, and ZWf31 have the structures in which the contact plugs are extended in the laminating direction while contacting the side portion of the contact connecting portion 27d. The contact plugs ZBf11, ZBf22, and ZBf31 have the structures in which the contact plugs are extended in the laminating direction while contacting the side portion of the contact connecting portion 36d.

Effect of Nonvolatile Semiconductor Memory Device of Eighth Embodiment

An effect of the nonvolatile semiconductor memory device of the eighth embodiment will be described below. As described above, the nonvolatile semiconductor memory device of the eighth embodiment includes the unit cell array MATa having the configuration substantially similar to that of the sixth embodiment. Accordingly, the nonvolatile semiconductor memory device of the eighth embodiment has the effect similar to that of the sixth embodiment.

Further, the nonvolatile semiconductor memory device of the eighth embodiment is formed by the five layers that are fewer than the six layers of the sixth embodiment. Accordingly, the nonvolatile semiconductor memory device of the eighth embodiment can be produced through the process that is simpler than that of the sixth embodiment.

Other Embodiments

The nonvolatile semiconductor memory devices of the first to eighth embodiments are described above. However, the present invention is not limited to the first to eighth embodiments, but various modifications, additions, and substitutions can be made without departing from the scope of the present invention.

For example, the present invention is not particularly limited to the memory cell structure, but the present invention can be applied to various cross-point type multi-layer memories such as the phase-transition memory element, the MRAM element, PFRAM, and RRAM.

For example, in the first to eighth embodiments, the positions of the word line and bit line may be changed with each other.

For example, instead of interconnection/cell/interconnection/cell illustrated in the sixth and eighth embodiments, an interlayer insulator may be interposed between the cell array layers like interconnection/cell/interconnection/interlayer insulator/interconnection/cell/interconnection.

In the producing method, the memory cell, the word line, and the bit line are formed through the self-aligned process for the laminated body. For example, the word line and the bit line may be formed through a damascene process, and the memory cell may separately be formed on or beneath the word line and the bit line through a pillar forming process.

Figure 41:
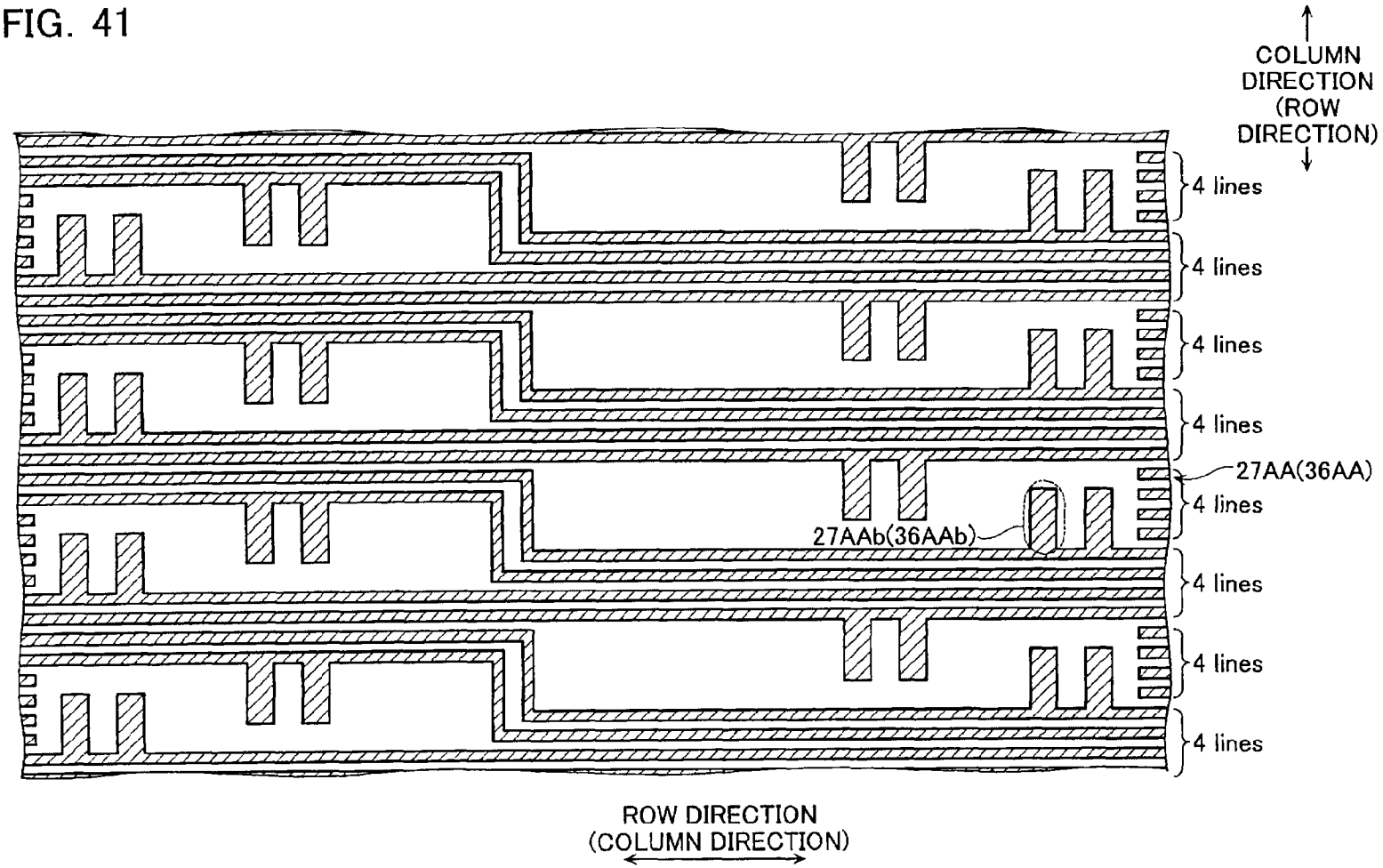
FIG. 41 is a view illustrating a first metal 27AA and a second metal 36AA of an other embodiment of the present invention.
Figure 42:
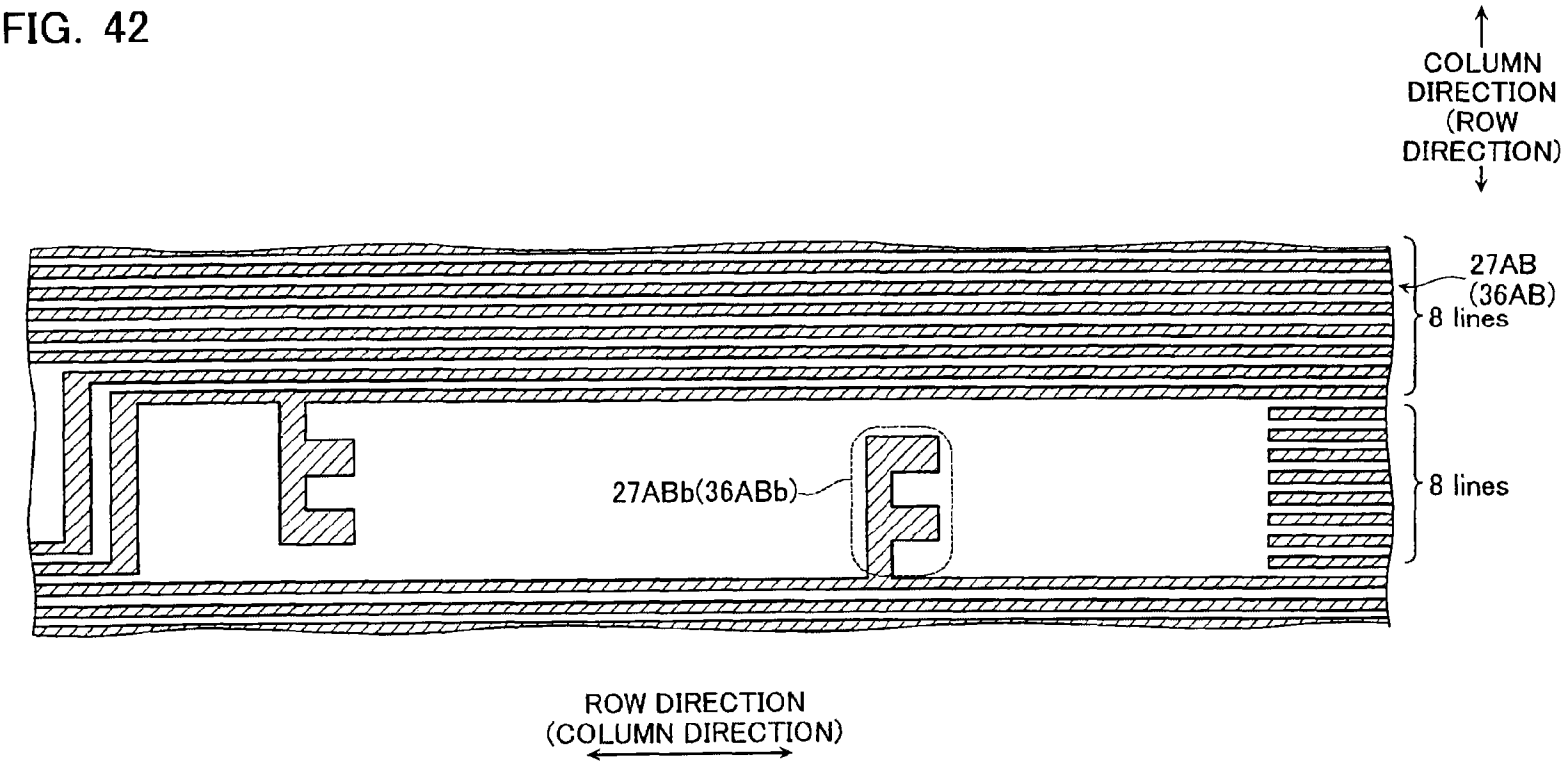
FIG. 42 is a view illustrating a first metal 27AB and a second metal 36AB of an other embodiment of the present invention.

In the above embodiments, each of two first metal 27 (second first metal 36) have alternatively contact connecting portions 27b (36b) at one end side and the other end side in the row direction (the column direction). However, as shown in FIG. 40, each of four first metal 27AA (second first metal 36AA) having alternatively contact connecting portions 27AAb (36AAb) at one end side and the other end side in the row direction (the column direction) may be applicable in this invention. Further, as shown in FIG. 41, each of eight first metal 27AB (second first metal 36AB) having alternatively contact connecting portions 27ABb (36ABb) at one end side and the other end side in the row direction (the column direction) may be applicable in this invention.

What is claimed is:

1. A nonvolatile semiconductor memory device comprising:

a semiconductor substrate; and a cell array formed [on] *above* the semiconductor substrate, including [a plurality of] first lines, [a plurality of] second lines intersecting the [plurality of] first lines, and [a plurality of] memory cells connected at intersections of the first and second lines between both lines, wherein the cell array includes:

a memory cell region where the memory cells are [formed] *disposed*; and a peripheral region that is provided around the memory cell region, in the memory cell region, the first lines are extended in parallel with a first direction, [and] the first lines are repeatedly formed at first intervals in a second direction orthogonal to the first direction, *and the second lines are extended in parallel with the second direction,* in the peripheral region, [each of] the first lines located at (4n−3)-th (n is a positive integer) and (4n−2)-th positions in the second direction from a predetermined position [has] *have* a contact connecting portion on one end side in the first direction of the first line, in the peripheral region, [each of] the first lines located at (4n−1)-th and 4n-th positions in the second direction from the predetermined position [has] *have* the contact connecting portion on the other end side in the first direction of the first line, and the contact connecting portion is formed so as to contact with a contact plug extended in a laminating direction *orthogonal to both of the first direction and the second direction*.

2. The nonvolatile semiconductor memory device according to claim 1, wherein the first interval is 40 nm or less.

3. The nonvolatile semiconductor memory device according to claim 1, wherein the cell array [comprises] *includes*:

a first cell array that is provided at a predetermined position in the laminating direction; and a second cell array that is provided on or beneath the first cell array, and

*wherein* the first line included in the first cell array has a shape identical to that of the first line included in the second cell array.

4. The nonvolatile semiconductor memory device according to claim 1, wherein the contact connecting portion is formed such that the contact plug contacts an upper surface or a lower surface of the contact connecting portion.

5. The nonvolatile semiconductor memory device according to claim 1, wherein the contact connecting portion is formed such that the contact plug contacts a side face of the contact connecting portion.

6. The nonvolatile semiconductor memory device according to claim 1, wherein the first line includes an island portion separated from the contact connecting portion, and the island portion is formed so as to contact the contact plug.

7. The nonvolatile semiconductor memory device according to claim 1, wherein the memory cell [comprises] *includes*:

a rectifying element; and a variable resistive element that is connected in series with the rectifying element.

8. The nonvolatile semiconductor memory device according to claim 1, wherein a first contact plug connected to the contact connecting portion of the first line provided on a predetermined layer and a second contact plug connected to the contact connecting portion of the first line provided on an upper layer of the predetermined layer have same upper end positions and lower end positions in the laminating direction, the first contact plug is extended through the layer, in which the contact connecting portion of the first line connected to the second contact plug is formed, to an upper layer with no contact to the contact connecting portion.

9. The nonvolatile semiconductor memory device according to claim 1, wherein a through-hole is made in the contact connecting portion, and the contact plug is formed in the through-hole.

10. A nonvolatile semiconductor memory device comprising:

a semiconductor substrate; and a cell array formed [on] *above* the semiconductor substrate, including [a plurality of] first lines, [a plurality of] second lines intersecting the [plurality of] first lines, and [a plurality of] memory cells connected at intersections of the first and second lines between both lines, wherein the cell array includes:

a memory cell region where the memory cells are formed; and a peripheral region that is provided around the memory cell region, in the memory cell region, the first lines are extended in parallel with a first direction, [and] the first lines are repeatedly formed at first intervals in a second direction orthogonal to the first direction, *and the second lines are extended in parallel with the second direction,* in the peripheral region, [each plurality of continuous first lines alternately have] contact connecting portions *are disposed on* one end side and the other end side in the first direction of the first line, and the contact connecting portion is formed so as to contact with a contact plug extended in a laminating direction *orthogonal to both of the first direction and the second direction*.

11. The nonvolatile semiconductor memory device according to claim 10, wherein the first interval is 40 nm or less.

12. The nonvolatile semiconductor memory device according to claim 10, wherein the cell array [comprises] *includes*:

a first cell array that is provided at a predetermined position in the laminating direction; and a second cell array that is provided above or beneath the first cell array, and

*wherein* the first line included in the first cell array has a shape identical to that of the first line included in the second cell array.

13. The nonvolatile semiconductor memory device according to claim 10, wherein the contact connecting portion is formed such that the contact plug contacts a side face of the contact connecting portion.

14. The nonvolatile semiconductor memory device according to claim 10, wherein the first line includes an island portion that is disposed while separated from the contact connecting portion, and the island portion is formed so as to contact the contact plug.

15. The nonvolatile semiconductor memory device according to claim 10, wherein the memory cell [comprises] *includes*:

a rectifying element that is connected to the first line; and a variable resistive element that is connected in series with the rectifying element.

16. The nonvolatile semiconductor memory device according to claim 10, wherein a first contact plug connected to the contact connecting portion of the first line provided on a predetermined layer and a second contact plug connected to the contact connecting portion of the first line provided on an upper layer of the predetermined layer have same upper end positions and lower end positions in the laminating direction, the first contact plug is extended through the layer, in which the contact connecting portion of the first line connected to the second contact plug is formed, to an upper layer with no contact to the contact connecting portion.

17. The nonvolatile semiconductor memory device according to claim 10, wherein a through-hole is made in the contact connecting portion, and the contact plug is formed in the through-hole.

*18. The nonvolatile semiconductor memory device according to claim 1, further comprising a transistor formed above the semiconductor substrate and under the cell array.*

*19. The nonvolatile semiconductor memory device according to claim 10, further comprising a transistor formed above the semiconductor substrate and under the cell array.*

*20. A nonvolatile semiconductor memory device comprising:*

*a semiconductor substrate; and*

*a cell array formed above the semiconductor substrate, including first lines, second lines intersecting the first lines, and memory cells connected at intersections of the first and second lines between both lines, wherein*

*the cell array includes:*

*a memory cell region where the memory cells are formed; and*

*a peripheral region that is provided around the memory cell region,*

*in the memory cell region, the first lines are extended in parallel with a first direction, the first lines are repeatedly formed at first intervals in a second direction orthogonal to the first direction, the first lines have a first width thinner than 40 nm in the second direction, and the second lines are extended in parallel with the second direction,*

*in the peripheral region, contact connecting portions are disposed on one end side and the other end side in the first direction of the first line,*

*the contact connecting portion is formed so as to contact with a contact plug extended in a laminating direction orthogonal to both of the first direction and the second direction,*

*the contact connecting portions have a second width in the second direction which is larger than the first width, and*

*the contact connecting portions have a first portion extended in the first direction which has a first width in the second direction.*

*21. The nonvolatile semiconductor memory device according to claim 20, wherein*

*in the peripheral region, the first lines located at (4m−3)-th (m is a positive odd number), (4m−2)-th, (4m+1)-th and (4m+2)-th positions in the second direction from a predetermined position have the contact connecting portions on one end side in the first direction of the first line,*

*in the peripheral region, the first lines located at (4m−1)-th, 4m-th, (4m+3)-th and (4m+4)-th positions in the second direction from the predetermined position have the contact connecting portions on the other end side in the first direction of the first line, and*

*the contact connecting portions at the (4m−1)-th and the 4m-th positions are formed in a range from the first line located at the (4m+2)-th position to the first line located at the (4m−3)-th position in the second direction.*

*22. The nonvolatile semiconductor memory device according to claim 20, wherein*

*the contact connecting portions include:*

*a first connecting portion connected to one of the first lines, and*

*a second connecting portion connected to other of the first lines adjacent to the one of the first lines, and wherein*

*the first portion of the first connecting portion and the first portion of the second connecting portion are disposed on straight line in the first direction.*

*23. The nonvolatile semiconductor memory device according to claim 20, the device further includes:*

*a transistor formed above the semiconductor substrate and under the cell array.*

* * * * *